United States Patent
Fujii et al.

(10) Patent No.: US 7,248,235 B2
(45) Date of Patent: Jul. 24, 2007

(54) DISPLAY, METHOD OF MANUFACTURING THE SAME, AND METHOD OF DRIVING THE SAME

(75) Inventors: Akiyoshi Fujii, Nara (JP); Akihito Jinda, Kitakatsuragi-gun (JP); Yozo Narutaki, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 548 days.

(21) Appl. No.: 10/234,200

(22) Filed: Sep. 5, 2002

(65) Prior Publication Data

US 2003/0052869 A1   Mar. 20, 2003

Related U.S. Application Data

(60) Provisional application No. 60/318,881, filed on Sep. 14, 2001.

(30) Foreign Application Priority Data

Jul. 3, 2002 (JP) .............................. 2002-194960
Jul. 4, 2002 (JP) .............................. 2002-196253

(51) Int. Cl.
*G09G 3/30* (2006.01)
(52) U.S. Cl. ..................... 345/76; 345/80; 345/82; 345/84; 345/87
(58) Field of Classification Search .......... 345/76–104, 345/204–212; 349/58–65, 110
See application file for complete search history.

(56) References Cited

U.S. PATENT DOCUMENTS 4,580,877 A * 4/1986 Washo .......................... 349/69
6,008,783 A * 12/1999 Kitagawa et al. .............. 345/39
6,025,894 A     2/2000 Shirasaki et al. .............. 349/69
6,137,602 A * 10/2000 Mukawa ........................ 359/14
6,456,342 B1 * 9/2002 Takenaka ....................... 349/58
6,844,684 B2 * 1/2005 Namiki et al. ............. 315/169.3
2002/0109658 A1 * 8/2002 Noguchi ........................ 345/92

(Continued)

FOREIGN PATENT DOCUMENTS

JP          7-9134         6/1995

(Continued)

OTHER PUBLICATIONS

Office Action in JP 2001-271058, Oct. 25, 2005.

(Continued)

*Primary Examiner*—Vijay Shankar
(74) *Attorney, Agent, or Firm*—Nixon & Vanderhye, PC

(57) ABSTRACT

A display includes in each of display areas: a reflective area containing a non-light-emitting display element for effecting a display by means of a liquid crystal display element reflecting external light; and a light-emitting area containing a light-emitting display element for effecting a display by means of an organic EL element directly modulating external light, the reflective area and the light-emitting area being ordered in some manner. The display further includes a first substrate and a second substrate positioned opposite to each other, and the light-modulating element and the light-emitting element are both provided between the first substrate and the second substrate. Thus, a display and a method of manufacturing thereof can be offered which allows for reduction in size and cost and delivers excellent visibility from outdoors to indoors.

53 Claims, 41 Drawing Sheets

U.S. PATENT DOCUMENTS

2003/0096197 A1    5/2003    Lee et al. .................... 430/318
2003/0184225 A1*   10/2003   Namiki et al. .............. 313/582

FOREIGN PATENT DOCUMENTS

| | | |
|---|---|---|
| JP | 08-211832 | 8/1996 |
| JP | 9-50031 A | 2/1997 |
| JP | 10-78582 A | 3/1998 |
| JP | 11-52366 A | 2/1999 |
| JP | 11-183892 A | 7/1999 |
| JP | 11-249130 A | 9/1999 |
| JP | 2000-75287 A | 3/2000 |
| JP | 2000-173770 A | 6/2000 |
| JP | 2000-347622 A | 12/2000 |
| JP | 2000-347633 | 12/2000 |
| JP | 2001-43980 A | 2/2001 |
| JP | 2001-66593 A | 3/2001 |
| JP | 2001-117509 | 4/2001 |
| JP | 2002-196702 | 7/2002 |
| JP | 2002-323867 | 11/2002 |
| JP | 2003-157026 | 5/2003 |
| JP | 2003-157029 | 5/2003 |
| KR | 1998-024347 | 7/1998 |
| KR | 2001-0003764 | 1/2001 |

OTHER PUBLICATIONS

Office Action dated Sep. 5, 2005 in Korean Patent Application No. 10-2002-0053463 and English translation thereof.

* cited by examiner

L1': BRIGHTNESS OF DISPLAY APPARATUS MADE UP ONLY OF A LIGHT-EMITTING DISPLAY ELEMENT
L2': BRIGHTNESS OF THE LIGHT-EMITTING DISPLAY ELEMENT IN DISPLAY APPARATUS OF THE PRESENT INVENTION

F I G. 1 3 (a)
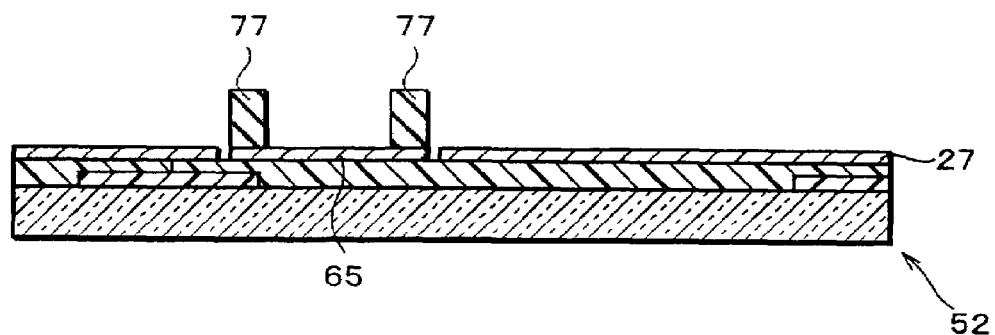
F I G. 1 3 (b)
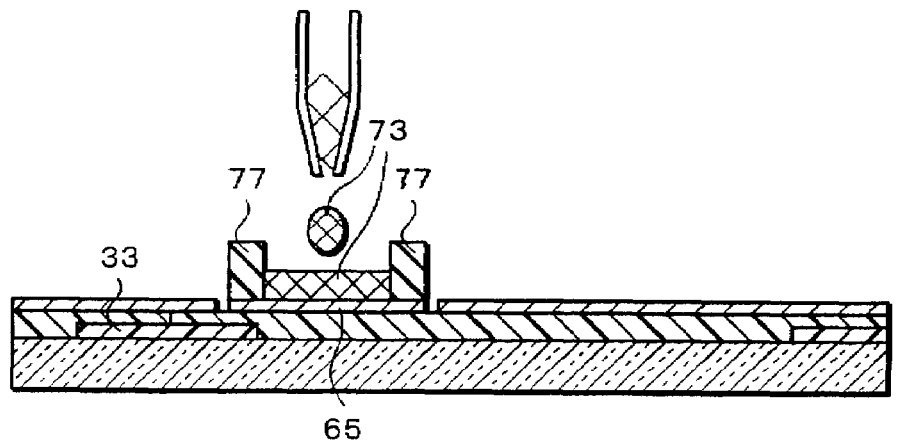
F I G. 1 3 (c)
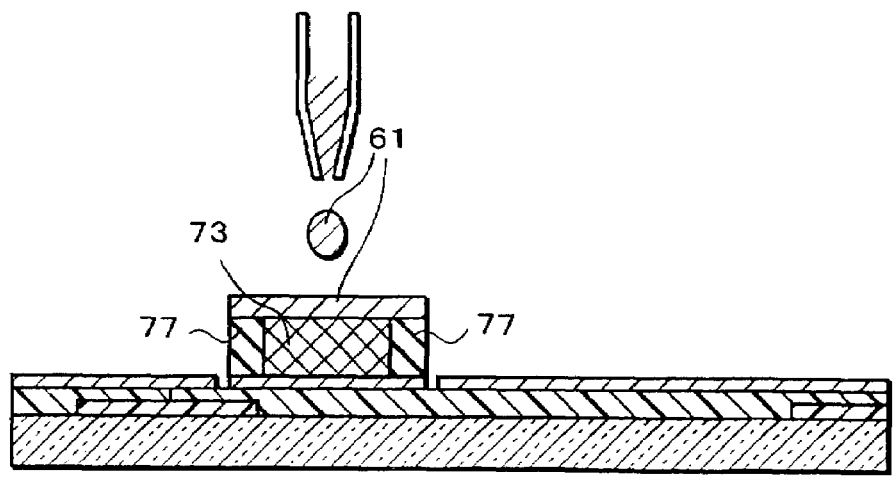

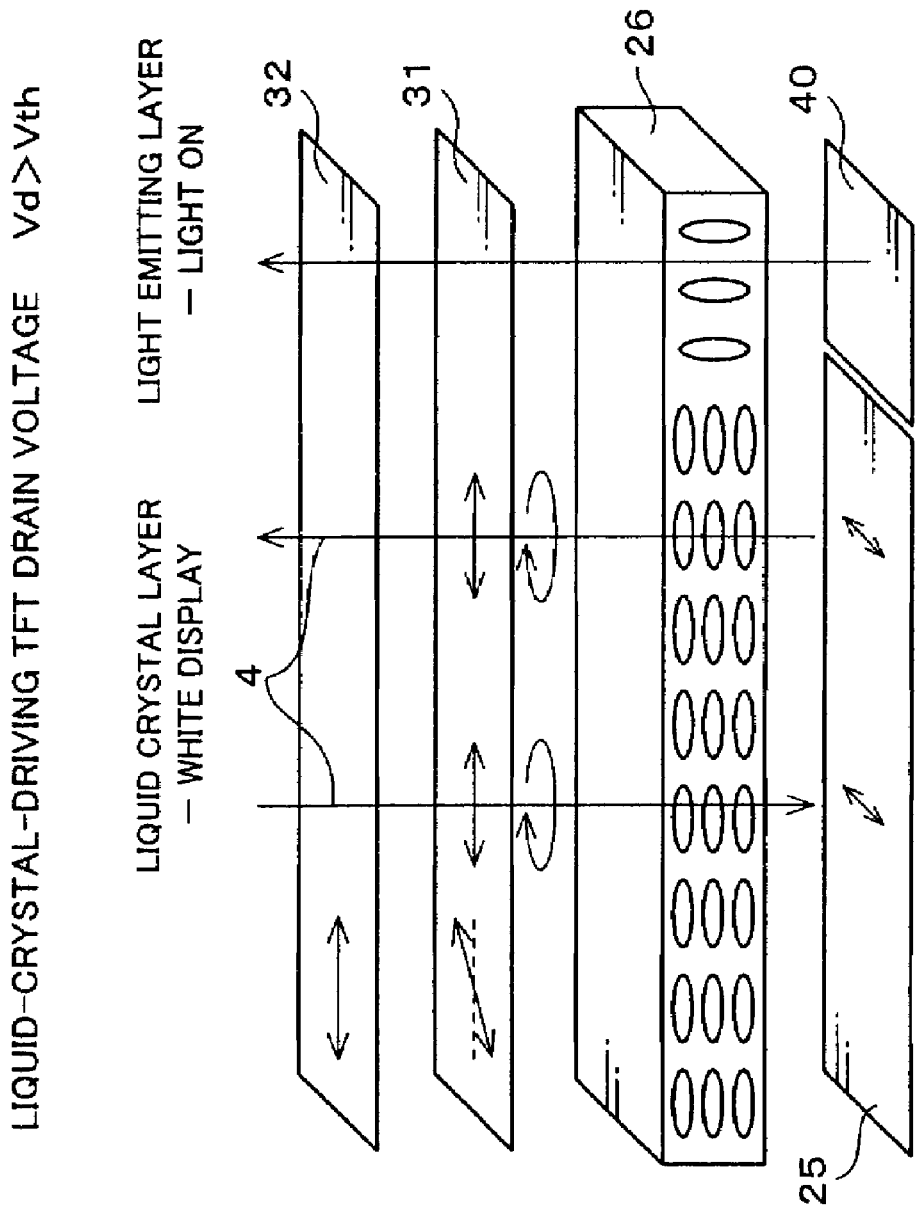

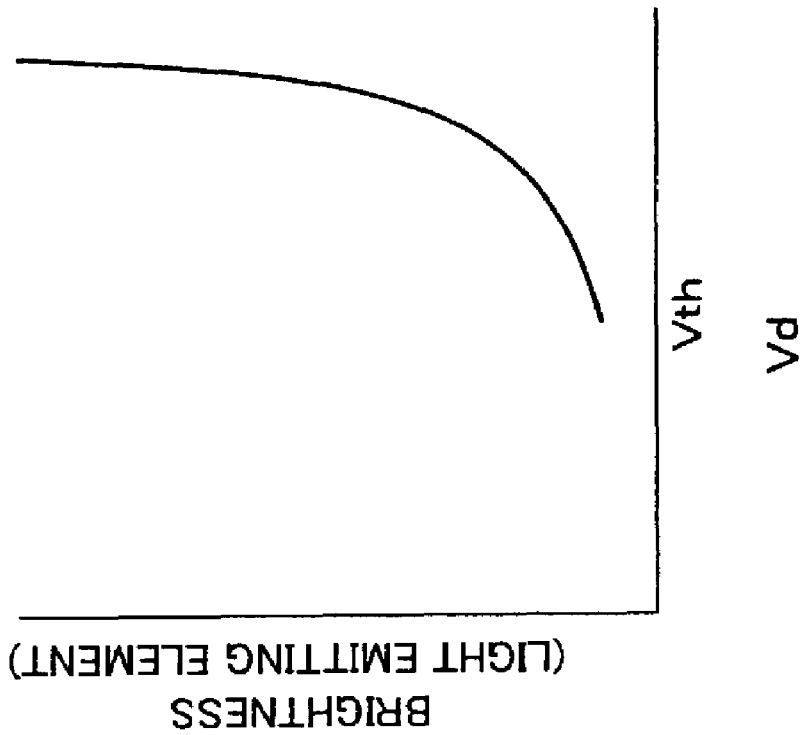
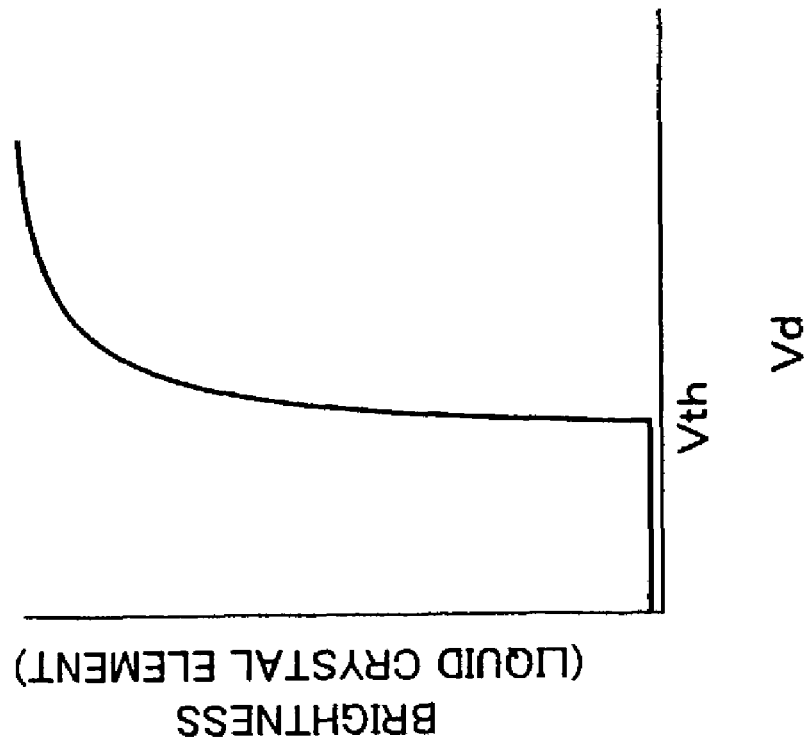
FIG. 29(a)
FIG. 29(b)

US 7,248,235 B2

DISPLAY, METHOD OF MANUFACTURING THE SAME, AND METHOD OF DRIVING THE SAME

This application claims the priority and benefit of U.S. provisional patent application No. 60/318,881, filed Sep. 14, 2001, which is incorporated herein by reference in its entirety.

FIELD OF THE INVENTION

The present invention relates to non-light-emitting displays, such as a liquid crystal display, and light-emitting displays based on an organic EL element, and a method of manufacturing thereof, and in particular to those displays and light-emitting displays in which both a non-light-emitting display area and a light-emitting display area are provided in a display area, a method of manufacturing thereof, and a driving circuit used therein.

BACKGROUND OF THE INVENTION

Recent years have witnessed widespread use of mobile phones and PDAs (Personal Digital Assistants). To respond to growing demand, a lot of efforts are put into the development of displays capable of on-screen information presentation mounted in these electronics.

Displays are classified into two major categories: non-light-emitting and light-emitting. The former incorporates a light-modulating element modulating light from an external light source, such as sunlight, indoor lighting, backlight, or frontlight, to produce a display. A typical, well-known example is the liquid crystal display element. The latter needs no external light source and the light-emitting element emits light on its own to produce a display. A typical example is EL (Electro Luminescence), which is attracting a lot of interest. The following will describe these types of displays in more detail.

First, the transmissive-type liquid crystal display which is a non-light-emitting display using an external light source uses a backlight as the light source and is therefore energy-consuming and bulky, which poses problems for mobile uses. To address one of the problems, in other words, to reduce large power consumption, the reflective-type liquid crystal display has been developed in which the lower electrodes of the liquid crystal layer is made of aluminum or another light-reflecting metal, so as to use external lighting, such as sunlight indoor lighting, as a light source. However, the reflective-type liquid crystal display has a shortcoming: since its operation relies on external lighting, it cannot be used under poor lighting.

To address these problems, the transflective-type display has been developed which includes lower electrodes of the liquid crystal layer fabricated from a half mirror. The display effects a reflective-type display without using a backlight under sufficient lighting and a transmissive-type display with the backlight turned on under poor lighting. The transflective-type display, however, has a low light using efficiency and makes a poor candidate to lower power consumption, because it relies on the conflicting characteristics of the light-reflecting part and the light-transmitting part for operation.

To address these problems, the inventors invented a liquid crystal display (see U.S. Pat. No. 6,195,140 B1; Date of Patent, Feb. 27, 2001) which acts as a reflective type without using a backlight under sufficient lighting and a transmissive type with the backlight turned on under poor lighting.

Unlike conventional liquid crystal displays incorporating a reflector which is so thin to acquire transflectivity, the liquid crystal display has each display pixel divided into two areas: a reflective area and a transmissive area. Specifically, in the liquid crystal display, a reflective electrode is provided in one of the areas of each display pixel, forming a reflective area. In the other area is provided a transmissive electrode, forming a transmissive area. Besides, the liquid crystal layer differs in thickness between the reflective area and the transmissive area. The configuration optimizes luminance both in the reflective area and in the transmissive area.

A drawback of the liquid crystal display of pixel-dividing type is low efficiency in backlight's light usage, because the backlight's light is projected from behind onto all the pixels, i.e. both of the two areas, but is used only in the transmissive area. The higher percentage the reflective electrode accounts for, the smaller the transmissive area and the lower the efficiency in using the backlight's light. This is inevitable.

Accordingly, the low light using efficiency problem in the pixel-dividing type liquid crystal display is addressed in, for example, Tokukai or Japanese Laid-open Patent Application 2001-66593 published on Mar. 16, 2001. The application discloses a pixel-dividing type liquid crystal display (labeled 300 in FIG. 41) has through holes 304 in part of reflective electrodes 303 of pixels 302 on a liquid crystal panel 301. The liquid crystal display 300 includes a light-emitting element, which is an organic EL (Electro Luminescence) element 310, constituting a backlight. These light-emitting portions 311 in the organic EL element 310 are not provided across the entire area of each pixel 302, but only in those parts where the through holes 304 are provided. Incorporating a patterned organic EL element as a backlight in this manner allows for improved light using efficiency and reduced power consumption.

A display incorporating an organic EL element, which is a typical light-emitting display, is advantageously thin and lightweight. The self-illumination enables the display to be, unlike liquid crystal displays, visible under poor lighting without a need for a backlight. Outgoing light is used almost solely for the purpose of display, achieving a high efficiency in light usage. The display incorporating an organic EL element however needs constant light emission and to improve on the display quality, requires increased light emission, which are obstacles in reducing power consumption.

Since in the pixel-dividing type liquid crystal display shown in FIG. 41, the organic EL element 310 as a light-emitting element is placed outside the liquid crystal panel 301, there are interposed a retardation plate 305, a polarizer 306, and two glass substrates 307, 312 between the organic EL element 310 and the through holes 304 in the reflective electrodes 303. The through hole 304 has a width ½ to ⅙ the pixel pitch, and given a currently typical pixel pitch of approximately 80 μm, the through hole 304 is about 15 μm to 40 μm in width. The polarizer 306 has a thickness of about 300 μm. The two glass plates, or the glass substrate 307 of the liquid crystal panel 301 and the glass substrate 312 of the organic EL element 310, has a combined thickness of 500 μm to 700 μm. All together, the organic EL element 310 is separated from the through holes 304 in the reflective electrodes 303 by a distance as large as 1300 μm to 1700 μm. It is therefore impossible to guide the whole of the outgoing light from the light-emitting portions 311 of the organic EL element 310 so as to enter the through holes 304, although the light-emitting portions 311 of the organic EL element 310 are placed at positions corresponding to those of the through holes 304. The problem of low efficiency in light projection by the organic EL element 310 still remains unsolved.

In any case, no change is made to the fact that the pixel-dividing type liquid crystal display in FIG. 41 includes two substrates which are stacked one on the other, and its thickness cannot be reduced further below the total thickness of the liquid crystal display and the organic EL element. Moreover, in the structure shown in FIG. 41, the through holes 304 of the liquid crystal display and the organic EL element 310 need be precisely positioned and combined in manufacture. The procedure requires a dedicated positioning device and combining mechanism, which increases component counts and manufacturing cost.

As mentioned in the foregoing, the reflective-type liquid crystal display has been developed for improved outdoor visibility, delivering superior visibility outdoors under strong external light, but the display is unusable indoors and at night. Proposed as a substitute for the external light is the reflective-type liquid crystal display which employs frontlight illuminating the device from its front. For example, Tokukai or Japanese Laid-open Patent Application 2000-75287 published on Mar. 14, 2000 discloses an organic EL element used as a frontlight. However, the same problem arises as in the foregoing case where a backlight is incorporated in the transmissive-type liquid crystal display: the total thickness is too large due to the contribution from both the display and the supplemental light source.

Forming a liquid crystal display element and an organic EL element on a single substrate as in the foregoing offers a viable solution to supplement each element's disadvantages and achieve an optimal display in various environments.

Nevertheless, simply forming a liquid crystal display element and an organic EL element on a single substrate in the foregoing display makes wiring and drive circuits in the substrate too complex, entailing problematic low yields and high costs in manufacture.

There are other problems in the manufacture of a light-emitting display element containing an organic EL element as a light-emitting element.

For example, Tokukai or Japanese Laid-open Patent Application 2000-173770 (published on Jun. 23, 2000) discloses a method of forming a TFT (Thin Film Transistor) circuit driving an organic EL element on one of two substrates and metallic electrodes which will become cathodes and a part of an organic layer constituting an organic EL layer on the circuit, forming anodes on the other substrate and a light-emitting layer on the electrodes, combining the two substrates under applied heat or pressure to heat an organic layer beyond the glass's transition temperature so that the two substrates are securely attached to each other.

Tokukai or Japanese Laid-open Patent Application 2001-43980 (published on Feb. 16, 2001) discloses a method of forming anodes on a substrate (TFT or else) and sequentially adding thereon a hole introducing layer which will be an organic EL layer, a hole transport layer, and a light-emitting layer, which is then followed by the formation of a thin film of metal having a low work function which will be a cathode and the formation of a transparent conductive layer.

In both disclosures, the outgoing light from the organic EL element may leave not the side facing the substrate on which a circuit is formed to drive the organic EL element, but the side facing an opposite substrate oppositely placed to that driver-carrying substrate or a protective layer. Thus, the outgoing light will less likely be blocked by circuit patterns than the outgoing light from the circuit-carrying side, which achieves an increased aperture ratio and is effective in improving on luminance, light-emitting efficiency, life, and reliability.

On the drive circuit-carrying side, the area conventionally reserved for hole formation is now used for circuit. Circuit designs can be more flexible, contributing to improvement of reliability and yield, and the method is effective in enabling circuit formation with improved function. Specifically, it is realized by separately forming the drive circuit side and the light-emitting layer side in Tokukai 2000-173770 and by forming extremely thin cathodes in Tokukai 2001-43980.

Under this circumstance, among other materials, no water is preferably allowed to enter the organic EL element for the sake of reliability of light-emitting function. The organic conductor, if oxidized, can degrade due to acceptor doping. The metal making up the cathodes is magnesium (Mg), lithium (Li), calcium (Ca), or other materials with a low work function and susceptible to oxidation and difficult to work on.

As detailed above, the organic EL element has following features: it has a simple structure, but is made of materials of which functions are readily affected by the surroundings. In the fabrication an organic EL element, it is preferred if the element is completely formed in an environment which is free from water and oxygen as much as possible and the layer providing protection to the light-emitting layer is formed at the same time.

Regarding this issue, Tokukai 2000-173770 securely attaches at a part of the organic layer constituting an organic EL element and likely allows contact with atmosphere containing water and oxygen in an attaching process; reliability is a problem. Each organic layer making up the organic EL element is so thin as about 1000 Å that the layers can lose uniformity in quality and function when combined, in a process to form a part of them on the respective substrates and heating to a temperature beyond glass's transition point.

Tokukai 2001-43980 places metallic cathodes on a light-emitting side and however thin the cathodes, suffers resultant transmission loss. The cathodes have setbacks due to its extra thickness: it may degrade because of bonding with a transparent conductive layer and an organic conductive layer formed on it; temperatures in the formation of the transparent conductive layer may negatively affect the light-emitting layer.

Tokukai 2000-173770 employs a transparent conductive film on the anode side and therefore exhibits a greater resistance than an ordinary conductor. When incorporated in a panel, the transparent conductive film develops electric energy loss and develops spots to appear on screen where luminance alters.

SUMMARY OF THE INVENTION

The present invention has an objective to offer a compact, low-cost display with excellent visibility, both outdoors and indoors, as well as methods of manufacturing and driving the display.

A display in accordance with the present invention, in order to achieve the objective, includes in each display area:

a first display area containing a non-light-emitting display element for effecting a display by means of a light-modulating element reflecting external light; and a second display area containing a light-emitting display element for effecting a display by means of a light-emitting element directly modulating light, wherein the first display area and the second display area are ordered in some manner.

The light-emitting element emits light to a display-surface side and directly effects a display and differs from conventional technologies where the light-emitting element is used as a backlight, a frontlight, or the like. The configuration allows for more efficient use of outgoing light from the light-emitting element and reduction in display thickness. In other words, the backlight has a typical thickness of about 3 mm to 6 mm, and the elimination of the need for a backlight and resultant reduction in thickness is of great advantage. Further, the elimination of the need for a backlight means that the polarizer, the retardation plate, and the glass substrate, which were conventionally provided on a liquid crystal panel between a back panel and a backlight, are also no longer necessary. The elimination of the polarizer, the retardation plate, and the glass substrate further reduces the display thickness.

Further, since no patterned light-emitting element backlight needs to be positioned and fixed, any dedicated device and fix mechanism for these purposes can be omitted, allowing for components counts reduction, process downsizing, and hence cost reduction.

The elimination of the need for the backlight and the polarizer and the retardation plate on the back side has more advantages than the reduction in the overall display thickness. Specifically, less components result in reduction in various costs including materials procurement, assembly, and inspection. The overall manufacturing cost of the display is reduced as a result.

Further, in displays of a display area dividing scheme, for example, the pixel dividing scheme in accordance with the present invention, the ratio of the first display area and the second display area can be set to an arbitrary value to some extent. The first display area, which is a reflective area, is designed to occupy a large area when, for example, the display is supposed to be used in mobile telephones, personal digital assistants (PDAs), and other mobile devices. If, for example, 80% of the pixel area of the display pixel is assigned to the reflective area, the remaining 20% goes to the second display area which is a light-emitting area, and the light-emitting area of the light-emitting element takes up a maximum of ⅕ the pixel area, which means that the configuration allows for reduction in power consumption.

The present invention hence offers a compact, low-cost display with excellent visibility, both outdoors and indoors.

Further, another display in accordance with the present invention further includes a first substrate and a second substrate positioned opposite to each other, wherein the light-modulating element and the light-emitting element are both placed between the first substrate and the second substrate. Since the light-modulating element and the light-emitting element are both placed between the first substrate and the second substrate, the display can be surely thinned down.

The display of the present invention is, in the foregoing display, the light-modulating element has a light-modulating layer, and the light-emitting element has a light-emitting layer, both layers being provided in the same layer. Note that the "same layer" does not necessarily mean that both components are literally at the same level: the light-emitting layer in the light-emitting element may be inside the light-modulating layer of the light-modulating element.

According to the invention, the light-emitting element is placed in the same layer as the light-modulating layer of the light-modulating element; thus, the light-emitting element can be contained within the thickness of a non-light-emitting display element constituted by a conventional light-modulating element. The display is therefore surely thinned down.

The display of the present invention include in each display area:

a first display area containing a non-light-emitting display element for effecting a display by means of a light-modulating element reflecting external light;

a second display area containing a light-emitting display element for effecting a display by means of a light-emitting element directly modulating external light, the first display area and the second display area being ordered in some manner;

a first substrate and a second substrate positioned opposite to each other, wherein:

the light-modulating element and the light-emitting element are both placed between the first substrate and the second substrate; and in the second display area, the light-emitting element and a light-modulating layer of the light-modulating element are stacked in this order on the first substrate.

According to the invention, in the second display area, the light-emitting element and the light-modulating layer of the light-modulating element are stacked in this order on the first substrate. The configuration enables both the light-modulating element and the light-emitting element to be accommodated between the first substrate and the second substrate; the display is therefore surely thinned down. Even the light-modulating layer is provided on the front side of the light-emitting element, since the light-emitting element is placed between the first and second substrates, the outgoing light from the light-emitting element reaches the second display area, so light usage is very high.

Thus, a display can be delivered which ensures high illuminating efficiency and allows for improvement in brightness, as well as reduction in thickness and cost.

Another display in accordance with the present invention is such that the light-modulating element and the light-emitting element share a common data signal line and a common scanning signal line, both lines being used in driving in each of the display areas arranged in a matrix form.

This, when the two display elements are formed in a display area, offers a display which prevents a circuit configuration from being complex and allows reduction in yields and costs in manufacture.

A method of manufacturing a display in accordance with the present invention includes in the manufacture of the display the steps of: (a) fabricating a drive circuit on the first substrate; (b) fabricating the light-emitting element on the second substrate; and (c) combining a first substrate side carrying the fabricated drive circuit and a second substrate side carrying the fabricated light-emitting element to form a single body.

Therefore, in the manufacture of the display, the light-emitting element and the drive element for driving the light-emitting element and the light-modulating element can be separately fabricated. This frees the formation the light-emitting element from negative effects of process temperatures, chemical agents, gases, etc. in the drive element formation, Another display in accordance with the present invention, in order to solve the objectives, includes:

a first substrate side having a drive circuit on a first substrate; and a second substrate side having a light-emitting element complete with two electrodes comprising light-emitting-element on a second substrate, the first and second substrate sides being combined to each other.

Another display in accordance with the present invention, in the foregoing display, is such that the light-emitting-element is constituted by an organic electroluminescence element, the second substrate side carrying thereon the electroluminescence element is combined with the first substrate side after the electroluminescence element is provided with a cathode.

According to the invention, in what is constituted by a light-emitting display element alone, the second substrate side constituting the organic electroluminescence element ("organic EL element") which is a light-emitting element is combined with the first substrate side after the fabrication has progressed up to the cathode which is a light-emitting element electrode in the organic EL element.

Hence, the outgoing light from the organic EL element can be emitted not through the substrate side carrying the drive circuit for driving the organic EL element, but through the opposite substrate which is specified to oppose that substrate side or a protection layer side. Thus, with the same light emission direction as in the prior art, the display enjoys the following basic advantages when compared to the structure by which light is emitted on the drive-circuit-forming side.

First of all, the first substrate side bearing the drive circuit can be separately formed from the organic EL element. Independent manufacturing processes can therefore be arranged, eliminating negative effects of temperature, gases, chemical agents, etc. and improving reliability.

Further, the configuration enables light emission onto the second substrate side bearing the organic EL element. Thus, the light-emitting area can be expanded without negatively affected by drive circuit side aperture ratio, contributing higher luminance. The greater light-emitting area requires smaller current per unit area to deliver the same luminance, adding to life and improving light-emitting efficiency for power consumption reduction.

No light is emitted onto the first substrate side bearing the drive circuit; the entire surface of the first substrate side can be used to accommodate the drive circuit. The structure therefore allows for more freedom in determining the size of TFTs (Thin Film Transistors) in the driver circuit and more margin in the TFT formation area, making it possible to form a circuit for more detailed control. Margins are allowed for in wire width, which improves reliability and yields of the drive circuit.

A method of driving a display in accordance with the present invention is characterized in that a display in which a non-light-emitting display element is ordered in some manner with a light-emitting display element is used and that a field which is a unit time for a video signal in each display area is divided and the light-modulating element or the light-emitting element is turned on/off every divided period.

According to the invention, when the display in which a non-light-emitting display element is ordered in some manner with a light-emitting display element is to be driven, a field is divided and the light-modulating element or the light-emitting element is turned on/off every divided period, so as to enable control of the total ON time of the light-modulating element or the light-emitting element in one field, addition to lighting patterns, and driving of those increased patterns efficiently.

Further, by controlling the ON time of the light-modulating element or the light-emitting element in terms of time in this manner, tones of a video signal can be displayed.

This, when the two display elements are formed in a display area, offers a method of driving a display which prevents a circuit configuration from being complex, allows reduction in yields and costs in manufacture, and efficiently effects a tone display.

For a fuller understanding of the nature and advantages of the invention, reference should be made to the ensuing detailed description taken in conjunction with the accompanying drawings.

BRIEF DESCRIPTION OF THE DRAWINGS

FIGS. 13(a) to 13(c) are explanatory drawings illustrating a method of manufacturing an opposite substrate of the display.

FIG. 28 is an explanatory drawing illustrating screen states of a liquid crystal display element and an organic EL element of the display operating in normally black mode, with the drain voltage Vd greater than the common threshold voltage Vth.

FIG. 29(a) is an explanatory drawing illustrating a luminance state of a liquid crystal display element of the display operating in normally black mode and FIG. 29(b) is an explanatory drawing illustrating a luminance state of an organic EL element of the display operating in normally black mode.

DESCRIPTION OF THE EMBODIMENTS

Figure 1:
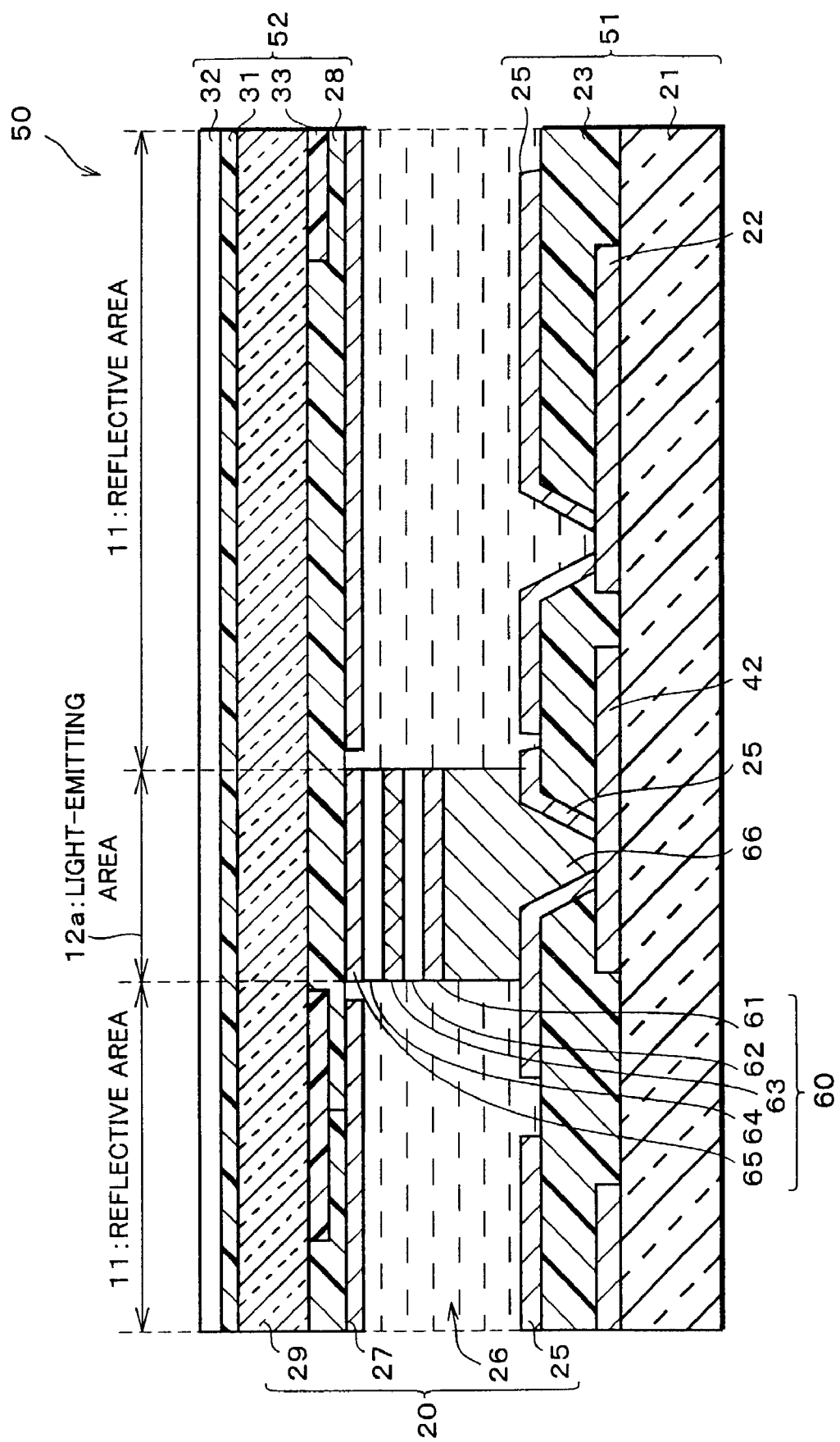
FIG. 1, showing an embodiment of a display in accordance with the present invention, is a cross-sectional view illustrating a part of the display corresponding to a pixel.

First, the outline of the present invention will be described.

A display in accordance with the present invention is configured incorporating both a non-light-emitting display element which effects a display by reflecting external light and a light-emitting display element which emits light by itself. The configuration eliminates the need for a separate light source like a backlight, thereby achieving reduced power consumption and size. The provision of the non-light-emitting display element and the light-emitting display element in a single display allows for components, such as electrodes, wiring, drive elements, and insulators, to be manufactured in common steps, thereby enabling much less costly, much less time-consuming manufacture and assembly of a light source such as a backlight than before.

Now, the present invention will be described in detail in terms of its functions and effects.

As mentioned in the foregoing, typical displays belong either of the major categories: non-light-emitting displays and light-emitting displays. The non-light-emitting display modulates light by guiding sunlight, indoor light, backlight, frontlight, or other light from an external light source to pass through a non-light-emitting display element which has a light-modulating element. A non-light-emitting display element is either of a reflective type containing reflective means reflecting light from an external light source or of a transmissive-type containing no reflective means. The light-emitting display contains a light-emitting element and emits light on its own from what is called a light-emitting element or layer in most cases. Here, the control of transmissive light using a light-modulating element is termed light modulation, whereas light emission from a light-emitting element is termed direct modulation.

Transmissive-type, non-light-emitting displays, of which the transmissive-type liquid crystal display is a typical one, normally relies on backlighting whose luminance is invariable and which must be turned on throughout operation, regardless of expected on-screen brightness. That translates into the transmissive-type, non-light-emitting display continuously wasting power by its external light source. Besides, in the transmissive-type, non-light-emitting display, the light-modulating element and the backlight require separate power supply sources and their control, which in turn means that the device requires a lot of components, allows only for limited reduction in size, and presents obstacles in cost saving.

Light-emitting displays, of which the EL display is a typical one, modulates light emission luminance to achieve various on-screen brightness; power consumption is low for a dark screen and high for a bright screen.

Now, a comparison is made between the present invention and a device incorporating both the transmissive-type, non-light-emitting with a light source and the reflective-type, non-light-emitting display element in a panel with both types of elements being used to effect a display. In other words, a comparison is made between a display in accordance with the present invention and a conventional display incorporating the transmissive-type, non-light-emitting display element and the reflective-type, non-light-emitting display element; an example of the latter is the pixel-dividing type liquid crystal display introduced as prior art in the foregoing.

Figure 2:
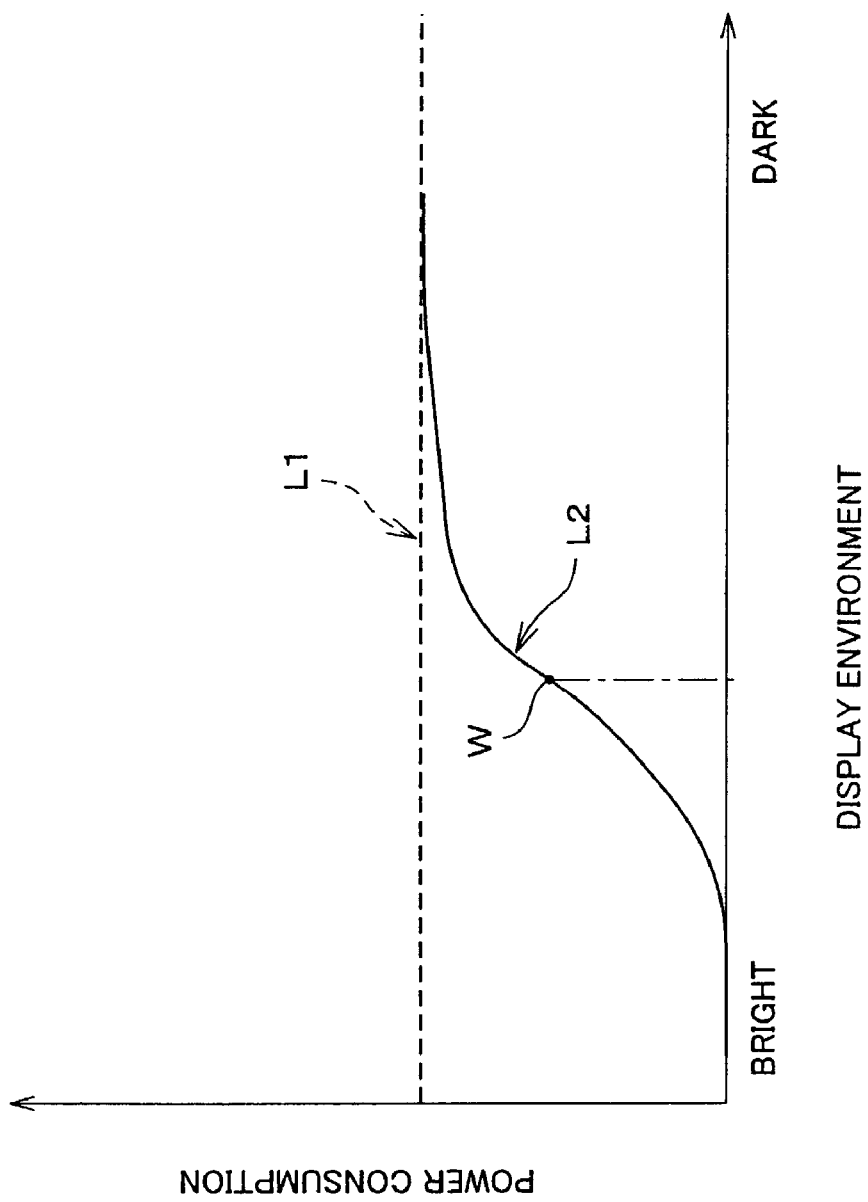
FIG. 2, showing the concept of the present invention, is a graph depicting the relationship between a display environment and a power consumption.

The conventional liquid crystal display, indicated by broken line L1 in FIG. 2, requires power supply which is in effect invariable because of the need to keep its backlight, which is the light source, turned on under any ambient brightness. By contrast, a display in accordance with the present invention incorporating both the light-emitting display element and the reflective-type, non-light-emitting display element in a panel is capable of adjusting the luminance of the light-emitting display element depending on environmental conditions, and increases the light emission luminance of the light-emitting display element under poor lighting and decreases the light emission luminance under sufficient lighting while making the most of the reflective-type, non-light-emitting display element as indicated by solid line L2 in FIG. 2. Under sufficient lighting, the display in accordance with the present invention consumes a limited amount of power when compared to that required by the conventional, transmissive-type, non-light-emitting display for its backlighting.

Under sufficient lighting, the display in accordance with the present invention therefore allows for reduction in power consumption and luminance for extended life and improved reliability, when compared to the display incorporating the transmissive-type, non-light-emitting display element and the reflective-type, non-light-emitting display element. Besides, the display in accordance with the present invention needs no separate backlight, allowing for reduction in size, particularly in thickness, and no power supply means and control, allowing for reduction in cost, when compared to the conventional liquid crystal display.

Figure 3:
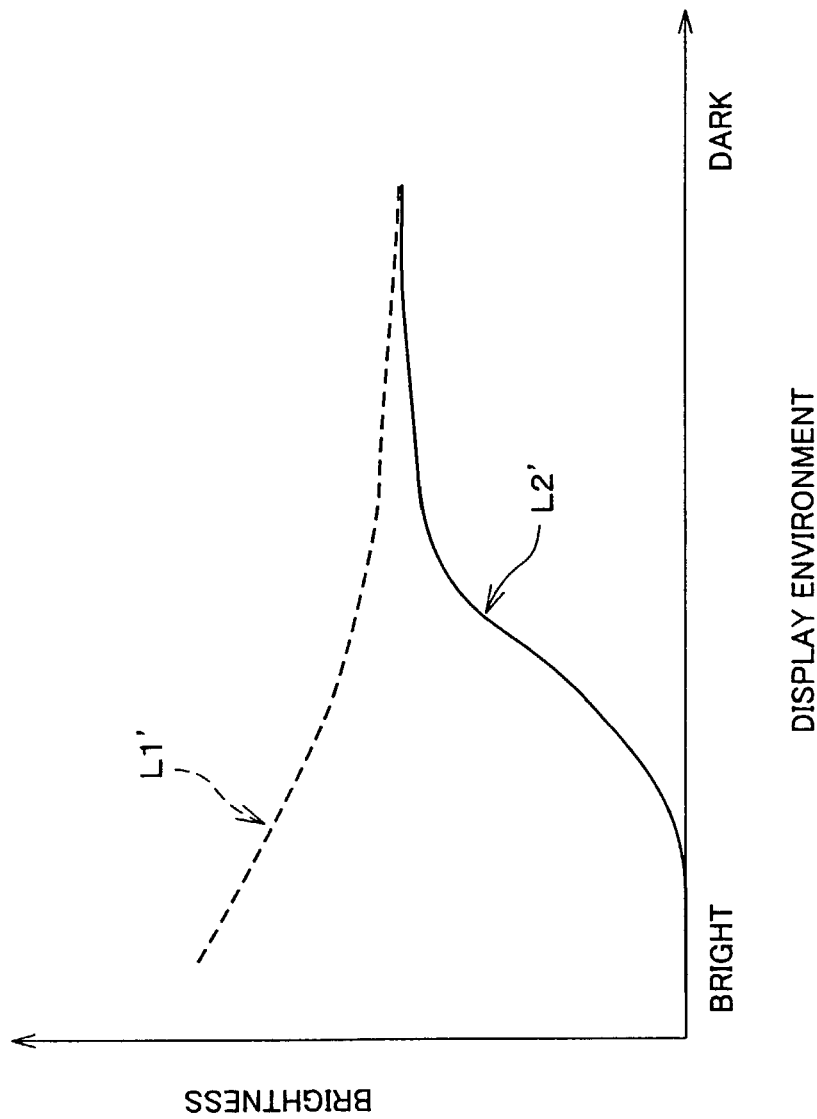
FIG. 3, showing the concept of the present invention, is a graph depicting the relationship between a display environment and luminance.
Figure 4:
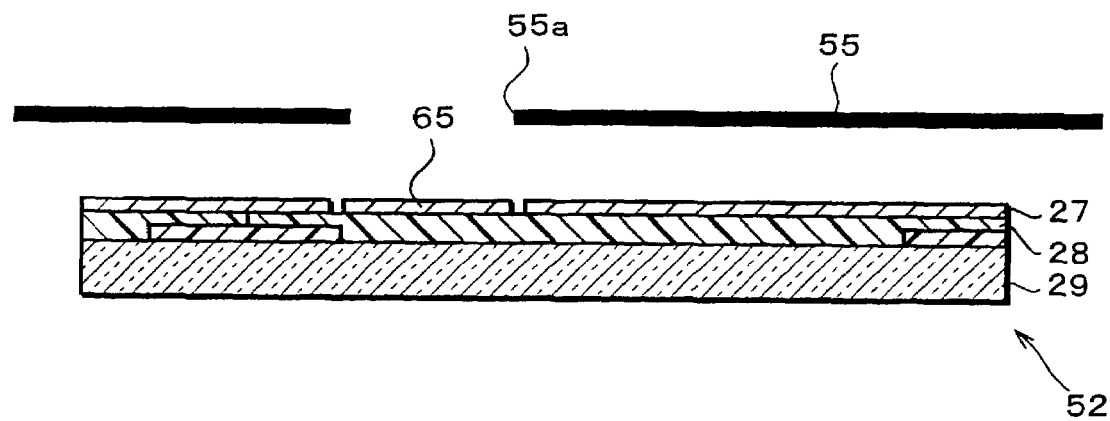
FIGS. 4(a) to 4(c) are explanatory drawings illustrating a method of manufacturing an opposite substrate of the display.
Figure 4:
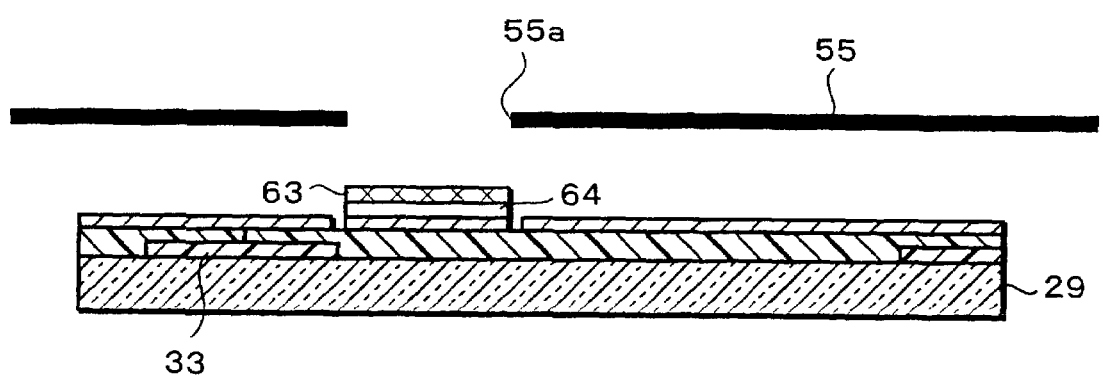
Figure 4:
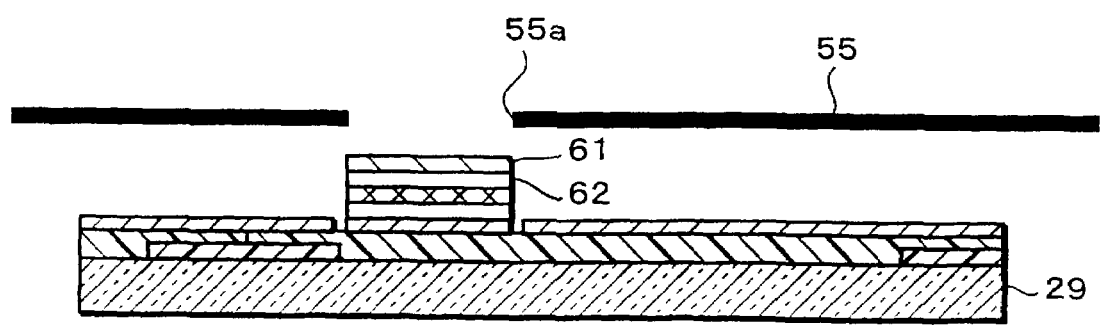

FIG. 3 demonstrates comparison between the display in accordance with the present invention and the display incorporating only the light-emitting display element. The latter device must increase light emission luminance with increasing ambient brightness to maintain good visibility, as indicated by broken line L1' in FIG. 3.

Meanwhile, in the former, because the non-light-emitting display element has improved display characteristics under sufficient lighting, the light-emitting display element can decrease luminance as indicated by solid line L2' in the figure; this luminance control method and accompanying effects are achieved uniquely by a configuration in accordance with the present invention without sacrificing resulting overall brightness and were conventionally inconceivable in cases where a light-emitting display element was used alone.

When compared to a light-emitting display element being used alone, the display in accordance with the present invention achieves a low setting for a maximum luminance value, extended life, and improved reliability.

Embodiment 1

The following will describe an embodiment of the present invention in reference to FIGS. 1-4 and 11.

Referring to FIG. 1, a display 50 of the present embodiment is made of a liquid crystal layer 26 as a light-modulating layer and an organic EL (electroluminescence) element 60 a light-emitting element, flanked by a TFT substrate 51 at the bottom and an opposite substrate 52 at the top. The bottom is the TFT (Thin Film Transistor) substrate 51 made of an insulating substrate 21 as a first substrate typically made of glass and components formed on the insulating substrate 21 so that each display pixel has TFT elements 22 for liquid crystal driving a reflective-type, liquid crystal display element 20 as a light-modulating element and a TFT element 42 for an EL element driving a light-emitting-type organic EL element 60 as a light-emitting element. The TFT elements 22 for liquid crystal and the TFT element 42 for an EL element can be driven separately or via a common signal line.

The top is the opposite substrate 52 made of: an insulating substrate 29 as a second, transparent substrate similarly made of glass, color filter layers 28 formed on the insulating substrate 29, a black matrix 33, opposite electrodes 27 as display-surface-side electrodes of the light-modulating element, organic EL element 60, a polarizer 32, and a retardation plate 31. Each organic EL element 60 has anodes 65 as light-emitting element electrodes and display-surface-side electrodes of the light-emitting element, a hole transport layer 64, a light-emitting layer 63, an electron transport layer 62, and cathodes 61 as electrodes for the light-emitting element.

In the present embodiment, the organic EL element 60 is placed in the same layer as the liquid crystal layer 26 which is the light-modulating layer in the liquid crystal display element 20 so that no part of the liquid crystal layer 26 exists on the light-emitting side of the organic EL element 60.

In other words, in the display 50 of the present embodiment, in the liquid crystal display element 20, each display pixel as a display area has a reflective area 11 as a first display area where a display is produced by reflecting external light which is incident to a display surface side of the pixel electrode 25 on the liquid crystal display element 20 and modulated by the liquid crystal layer 26 and a light-emitting area 12a as a second display area where the organic EL element 60 emits light by itself toward the display surface side. The first display area and the second display area are ordered in some manner.

The display 50 of the present embodiment is structured so that the outgoing light from the organic EL element 60 hardly passes through the liquid crystal layer 26. The outgoing light from the organic EL element 60 is therefore never scattered or absorbed by the liquid crystal, and luminance hardly drops.

In the present embodiment, the organic EL element 60 is formed on the anodes 65 on the opposite substrate 52, which indicates that the organic EL element 60 of the present embodiment can be manufactured in separate processes from the TFT circuit.

Accordingly, the organic EL element 60 is formed on the opposite substrate 52 so that resultant organic EL element 60 emits light toward the opposite substrate 52. This enables, in the process of forming the opposite substrate 52, the sequential formation of the transparent anodes 65 made of, for example, ITO (Indium Tin Oxide), the hole transport layer 64, the light-emitting layer 63, the electron transport layer 62, and the cathodes 61. The sequential formation can be carried out by a conventional method. The organic EL element 60 exhibits an almost 100% aperture ratio at the second display area because of the absence of a drive circuit on the opposite substrate 52; the presence of a drive circuit might put a restriction on the aperture ratio of the organic EL element 60.

The opposite substrate 52 is manufactured independently from the TFTs and therefore not affected by the heat generated in the manufacture of TFTs, especially by photolithography and etching using water and liquid agents which degrade characteristics of the light-emitting layer 63 which is made of organic material.

The capability of separately forming the organic EL element 60 from the TFT substrate 51 is an advantage in keeping high performance of the organic EL element 60.

Under this circumstance, the light-emitting layer used in the present embodiment may be made of a low-molecular-type EL material or a polymer type EL material. The organic EL element 60 in the figure is an example where the light-emitting layer 63 is made of a low-molecular-type EL material and provided with the electron transport layer 62 at the bottom and the hole transport layer 64 at the top. The provision of the electron transport layer 62 and the hole transport layer 64 is not essential, but preferable in view of light-emitting efficiency of the light-emitting layer 63 made of a low-molecular-type EL material.

In the display 50 of the present embodiment, between the pixel electrodes 25 on the TFT substrate 51 and the organic EL element 60 is interposed a conductive contact layer 66 as a protrusion which electrically connects the organic EL element 60 to the pixel electrodes 25 and the TFT element 42 for an EL element. The conductive contact layer 66 is provided solely for height adjustment.

The following will describe a method of manufacturing the display 50 incorporating the organic EL element 60 containing the light-emitting layer 63 made of a low-molecular-type EL material. First, the case where the opposite substrate 52 is formed will be described.

With a light-emitting layer 63 of a low-molecular-type EL material, the organic EL element 60 is generally formed using masked vapor deposition. Accordingly, to form the opposite substrate 52, as shown in FIG. 4(a), first of all, a mask 55 is placed at a predetermined position on a side of the opposite substrate 52 where the opposite electrodes 27 and the anodes 65 are located. As will be detailed later, the present embodiment is employing a method of driving the liquid crystal display element 20 and the organic EL element 60 using a common signal line. The opposite electrodes 27 and the anodes 65 are structurally separated from each other by a gap to prevent current from flowing between them. The opposite electrodes 27 and the anodes 65 may conduct if the liquid crystal display element 20 and the organic EL element 60 are independently driven.

Then, as shown in FIG. 4(b) and FIG. 4(c), the hole transport layer 64, the light-emitting layer 63, the electron transport layer 62, and the cathodes 61 are sequentially formed through an opening 55a in the mask 55.

Figure 5:
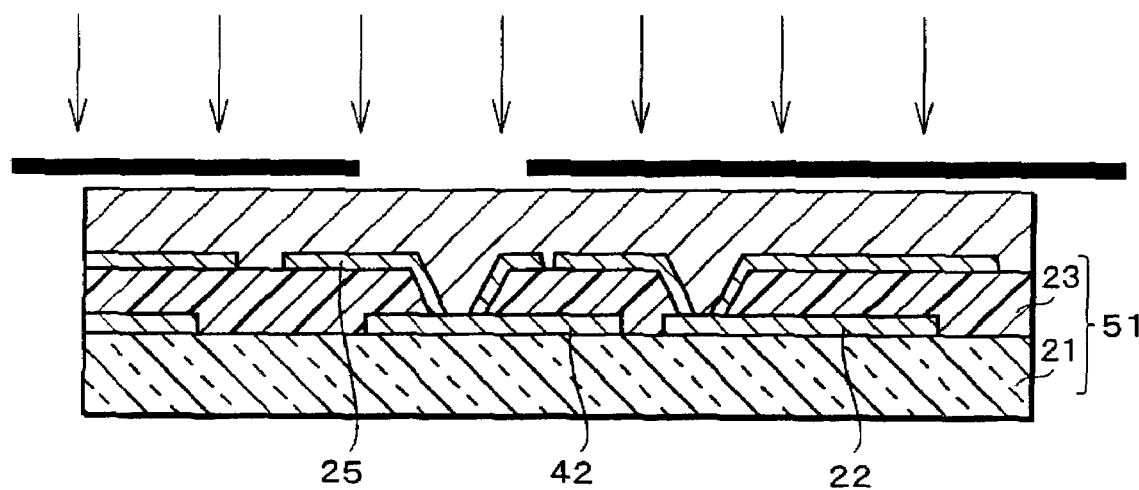
FIGS. 5(a) and 5(b) are explanatory drawings illustrating a method of manufacturing a TFT substrate of the display.
Figure 5:
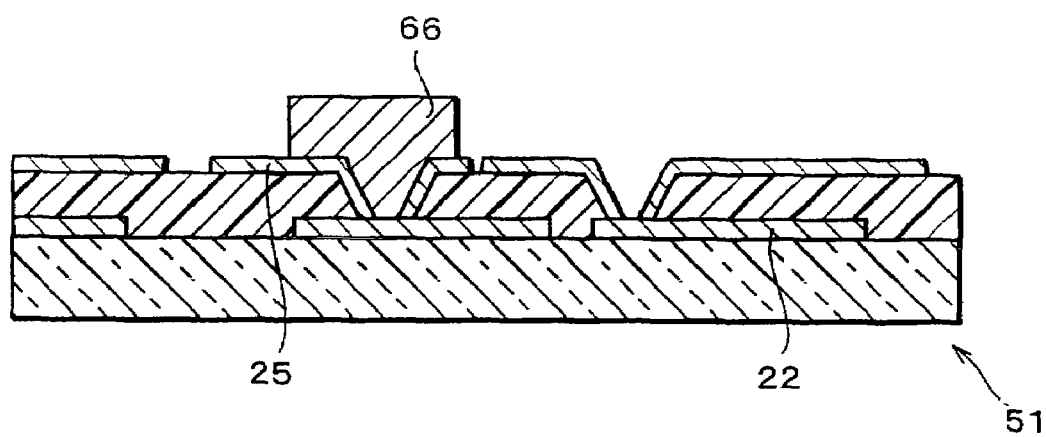

To form the TFT substrate 51, as shown in FIG. 5(a) and FIG. 5(b), the TFT substrate 51 on which the TFT elements 22 for liquid crystal, the TFT elements 42 for an EL element, and the pixel electrodes 25 are already formed is coated with a photosensitive conductive resin and subjected to exposure using a mask, leaving only the part of the conductive resin which will constitute the conductive contact layer 66. Under this circumstance, in the present embodiment, there are also some pixel electrodes 25 in the areas where the organic EL element 60 is provided. Each pixel electrode 25 is made of a reflective, conductive film of aluminum (Al) or another substance. The presence of the pixel electrodes 25 however do not interrupt light transmission, because the organic EL element 60 emits light only through the display-surface-side opposite the pixel electrodes 25. The reflector on the back of the organic EL element 60 does not have to be formed separately, which allows for a reduction in the number of steps.

The cathode 61 is generally made of metal, Alternatively, it can be made of, for example, conductive resin. After the formation of the cathodes 61 from a metal or conductive resin material, conductive resin may be further provided. The conductive resin may be applied by ink jet printing.

Figure 6:
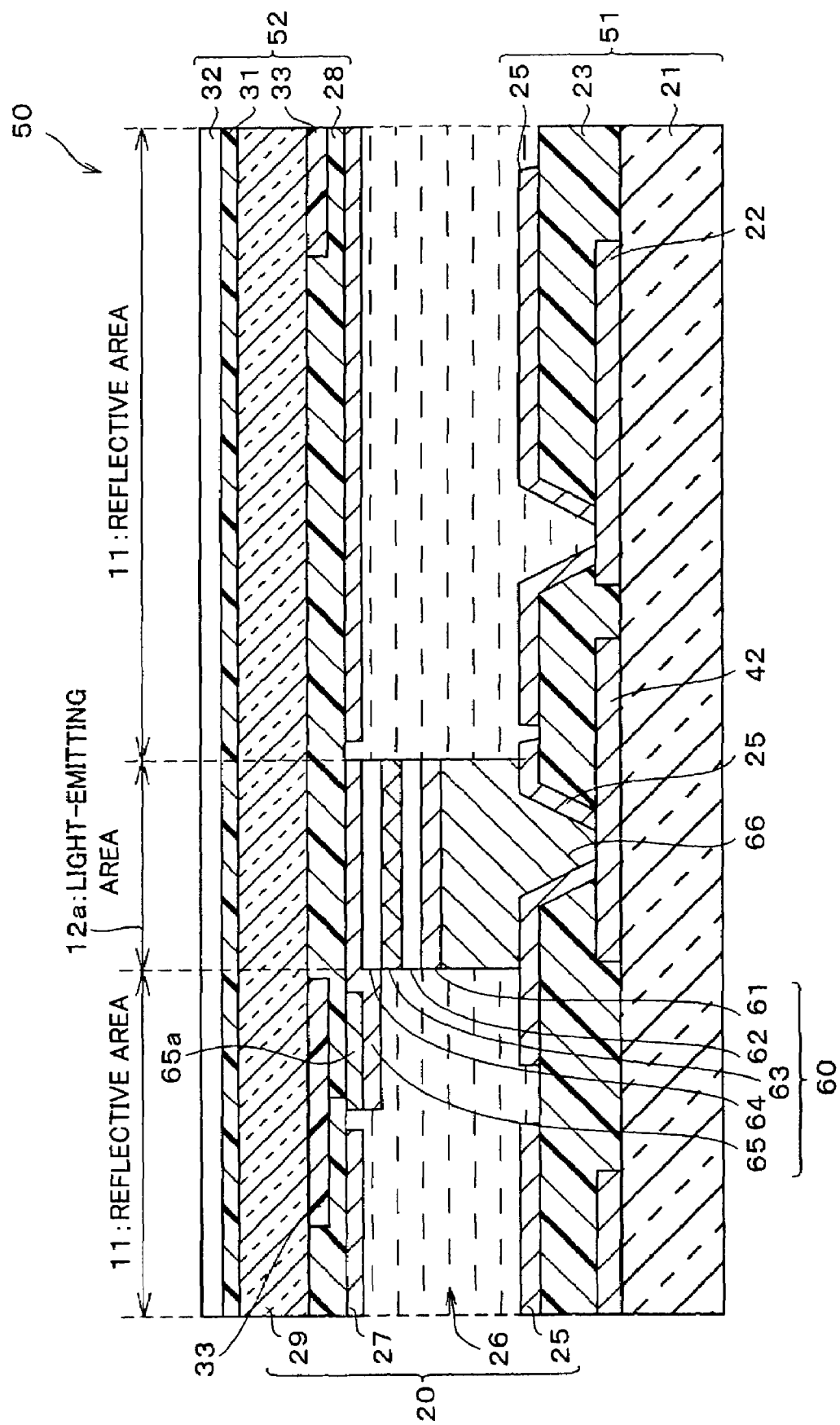
FIG. 6 is a cross-sectional view illustrating a display in which metallic electrodes are formed under a black matrix along anodes of an organic EL element.
Figure 7:
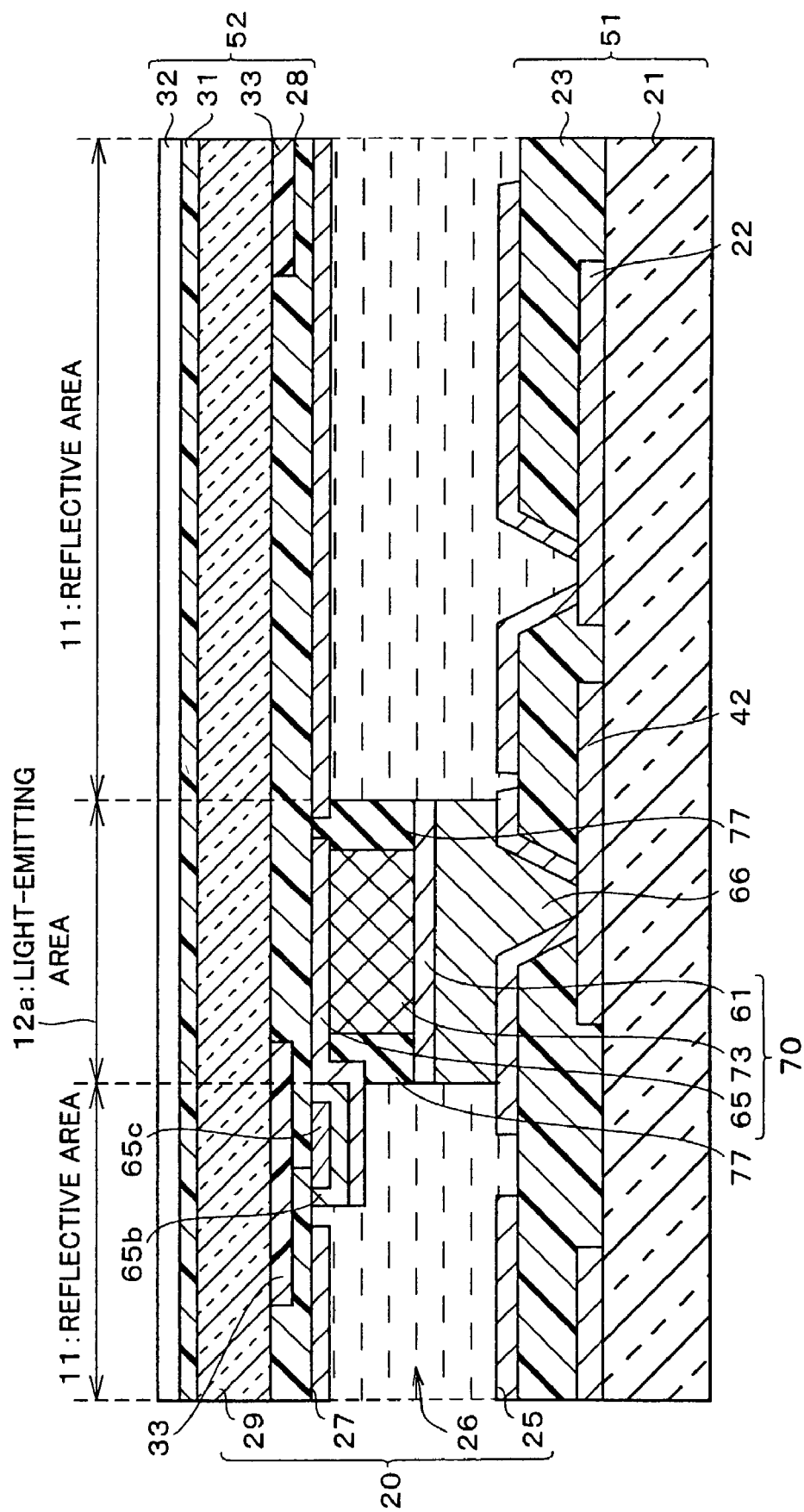
FIG. 7 is a cross-sectional view illustrating a display in which metallic electrodes are formed under a black matrix in a layer structure of an organic EL element.

The present embodiment requires a current flow from the opposite substrate 52 side to the TFT substrate 51 side, because the organic EL element 60 emits light toward the opposite substrate 52. To this end, where the transparent anodes 65 formed on the opposite substrate 52 has a high resistance, reducing the light-emitting efficiency is a possibility. To address this problem, for example, as shown in FIG. 6, the resistance can be reduced by forming metallic electrodes 65a along the transparent anodes 65 of the organic EL element 60. The metallic electrodes 65a are preferably made of a material with low reflectance, such as titanium (Ti) or tantalum (Ta). To reduce the resistance further, for example, as shown in FIG. 7, metallic electrodes 65b made of a low resistance metal, such as aluminum (Al) and metallic electrodes 65c made of a low reflectance material such as, titanium (Ti) or tantalum (Ta) may be formed in layers along the black matrix 33. Using a low reflectance metal has purposes to reflect external light at the metallic electrodes 65a, 65b and avoid contrast degradation. Alternatively, metallic electrodes may be formed along the black matrix 33 with the same purposes; in which event, light is blocked by the black matrix 33 and incapable of directly leaving through the display surface side, and low reflectance material does not have to be used.

Incidentally, in the present embodiment, nothing special is provided at the interface between the organic EL element 60 and the liquid crystal layer 26; alternatives are however possible. For example, a light-blocking layer similar to an organic EL element 70 described in embodiment 2 may be provided. To provide a light-blocking layer to the organic EL element 60 of the present embodiment, light-blocking material is applied to walls of the organic EL element 60 formed in a layer shape.

Figure 8:
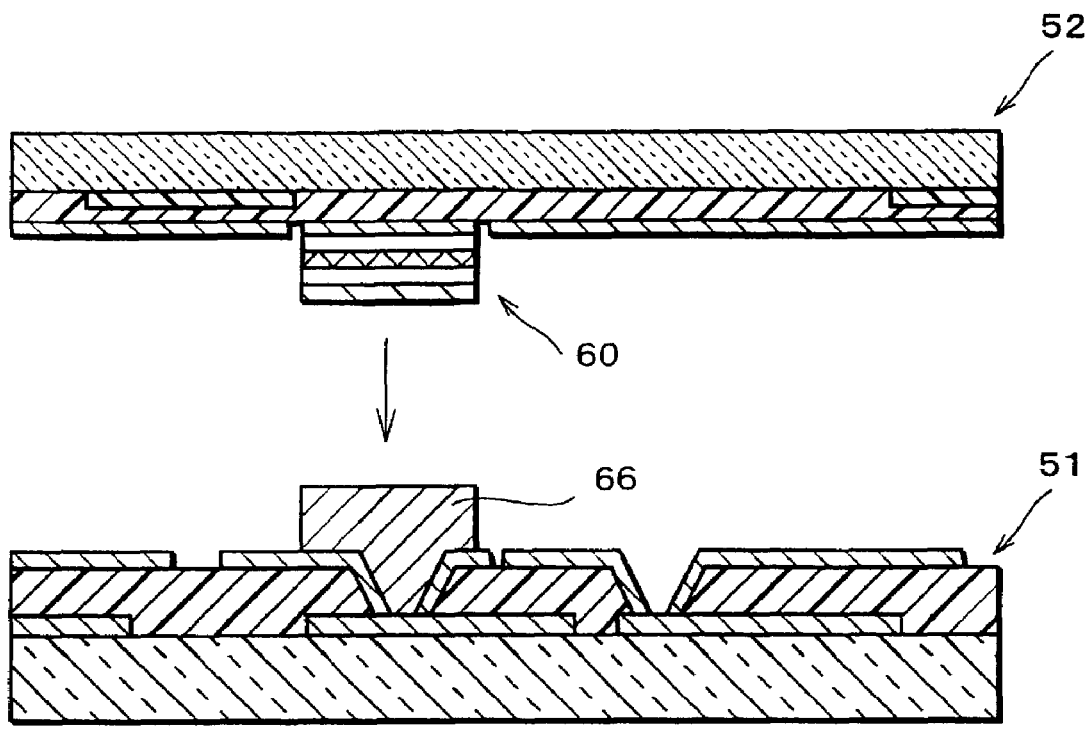
FIGS. 8(a) and 8(b) are explanatory drawings illustrating how an opposite substrate is combined with a TFT substrate in the display.
Figure 8:
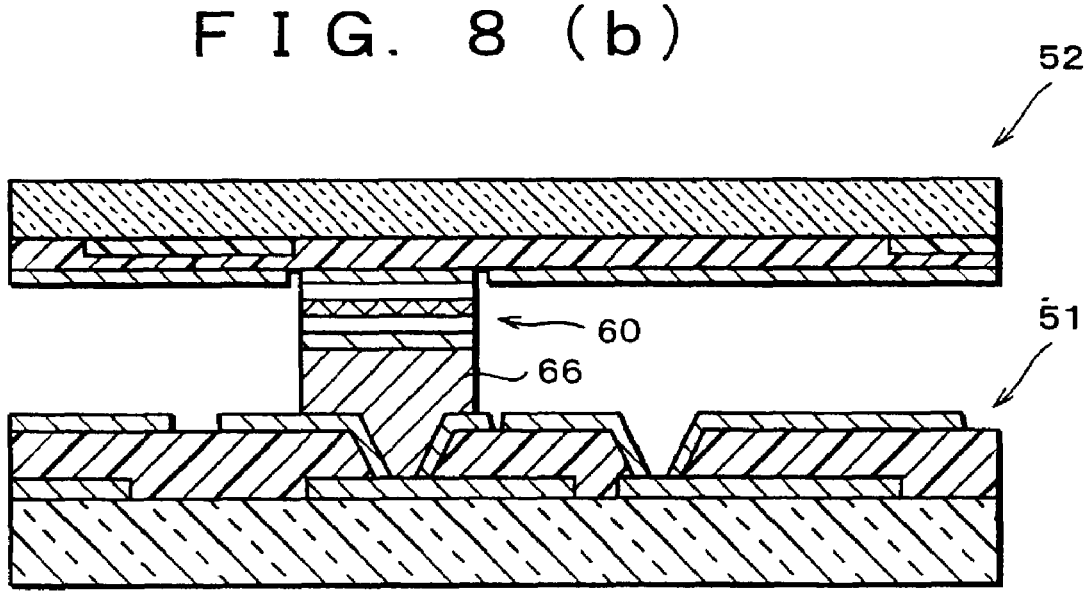

Next, as shown in FIG. 8(a) and FIG. 8(b), the opposite substrate 52 on which the organic EL element 60 is now formed is aligned with and attached to the TFT substrate 51 before fixing. Under this circumstance, the organic EL element 60 is electrically connected to the TFT substrate 51 via the conductive contact layer 66. Preferably, each of the TFT substrate 51 and the opposite substrate 52 is provided with conductive resin in advance so that the two substrates are electrically connected through conductive resin. This is because the provision would prevent poor contact caused by oxide film or the like on the surface of the metal and facilitate firm contact making use of the resin's elasticity.

Subsequently, liquid crystal is injected. The injection is carried out using a vacuum method after combining the TFT substrate 51 and the opposite substrate 52.

Next, the various components of the organic EL element 60 will be described in terms of material, etc.

First of all, the organic EL element 60 may use a light-emitting layer 63 emitting white light and the color filter layers 28 per se which are used for display in the liquid crystal display element 20. Alternatively, organic EL layers 63 may be used which emit red (R), green (G), blue (B) light respectively; in this case, the color filter layer 28 may be partly transparent.

The luminance delivered by the light-emitting layer 63 degrades over time and differently depending on color: red (R), green (G), and blue (B). Using the light-emitting layer 63 as a display element over an extended period of time therefore results in color imbalance. The use of a white light-emitting light-emitting layer 63 addresses this problem of color imbalance development over time. In contrast, the use of a white light-emitting layer 63 together with the color filter layers 28 of the associated colors reduces transmittance to ⅓ due to the presence of the color filter layers 28, resulting in poor light using efficiency.

Any of the configurations has its advantages and disadvantages. The use of organic EL layers 63 emitting red (R), green (G), blue (B) light respectively is preferred where the display is supposedly used for a relatively short period of time or required to produce high brightness rather than accurate color balance; the use of a white light-emitting layer 63 is preferred where the display constitutes a TV set or other equipment which is required to produce good color balance over an extend period of time.

Examples of materials available for the colored light-emitting layer 63 made of a low-molecular-type, light-emitting material include naphthalene, anthracene, phenanthrene, pyrene, tetracene, fluorescein, perylene, phthaloperylene, naphthaloperylene, perynone, phthaloperynone, naphthaloperynone, diphenylbutadiene, tetraphenylbutadiene, coumarin, quinoline metal complex, imine, diphenylanthracene, diaminocarbazole, quinacridone, and rubrane.

Examples of materials available for the white light-emitting layer 63 include a material made from a blue metal complex (Znbox2: Zinc-benzoxyazol2) and a yellow metal complex (Znsq2: Zinc-styrylquinoline2), that material doped with fluorescent dye perylene, DCM 1 (4-(Dicyanomethylene)-2-methyl-6-(4-dimethylaminos tyryl)-4H-pyran), layered polymer materials, and single-layered materials in which PBD(2-(4-Biphenylyl)-5-(4-tert-butylphenyl)-1,3,4-oxadiazol e) is dispersed in polyvinylcarbazole.

Examples of materials for the hole transport layer 64 include phthalocyanine compounds, naphthalocyanine compounds, porphyrins, oxadiazole, triazole, imidazole, tetrahydroimidazole, oxazole, and stilbene.

Examples of materials for the electron transport layer 62 include fluorenone, anthraquinodimethane, diphenyquinone, thiopyrandioxide, oxadiazole, thiadiazole, tetrazole, and perylene tetracarboxylic acids.

Examples of materials for the cathode 61 include metals such as aluminum (Al), magnesium (Mg), and silver (Ag). On these metals, nickel (Ni), titanium (Ti), tantalum (Ta), gold (Au), or another metal may be stacked to improve connectivity.

Examples of the conductive connecting resin for the conductive contact layer 66 connecting the TFT substrate 51 and the opposite substrate 52 include a photosensitive resin in which there are dispersed conductive particles disclosed in Tokukaihei 11-249299 (Japanese Laid-open Patent Application 11-249299/1999) (available from Fuji Film Co., Ltd.) and photosensitive conductive polymers based on polypyrrole described in Chemistry Letters, pp. 469-472, 1986, the Chemical Society of Japan. More specifically, Tokukaihei 11-249299 (Japanese Laid-open Patent Application 11-249299/1999) is related to a photosensitive dispersion product and a photosensitive sheet in which carbon black or another kind of conductive particles are dispersed and discloses pattern formation by exposure and development. Chemistry Letters, pp. 469-472, 1986 discloses photochemical polymerization of a pyrrole monomer to form polypyrrole with high conductivity and its use as a patterned electrode material.

The following will describe properties of the retardation plate 31 and the polarizer 32 formed on the opposite substrate 52. The retardation plate 31 and the polarizer 32 are necessary for the liquid crystal display element 20 except for a particular liquid crystal mode, so as to configure a reflective-type liquid crystal display except for a particular liquid crystal mode, in which case the retardation plate 31 typically introduces a delay of one quarter of the wavelength. Under this circumstance, in the present embodiment, the cathodes 61 of the organic EL element 60 are made of aluminum (Al), or another material, which gives extra reflectance; the reflection from the cathodes 61 lowers the contrast of the organic EL element 60 when not emitting light. Therefore, normally, the polarizer 32 and the quarter-wave plate 31 are necessary on the display-surface side of the organic EL element 60 to prevent reflection. The present embodiment is advantageous in this regard: the reflective-type, liquid crystal display element 20 is already provided with the polarizer 32 and the retardation plate 31 configured identically, ready for shared use, and has no need to newly provide them.

Figure 9:
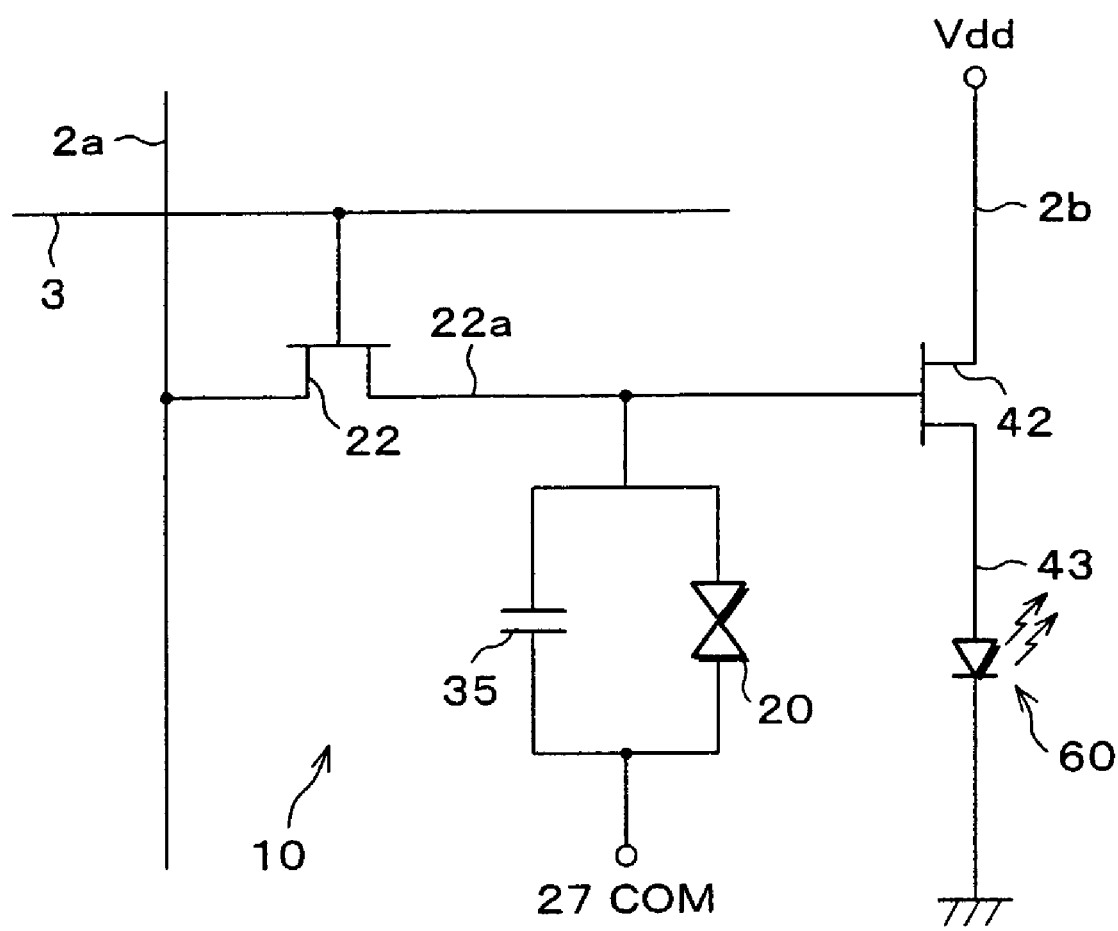
FIG. 9 is a circuit diagram illustrating how a pixel is driven when pixels share a signal line in the display.

Referring to FIG. 9, the following will describe a drive circuit for the display 50 configuration as above. In the drive circuit, to actively drive display pixels 10 as display areas arranged to form a matrix, resource bus lines 2a as signal lines and data signal lines and gate bus lines 3 as signal lines and scanning signal lines are shared in driving the liquid crystal display element 20 and the organic EL element 60. However, alternatives are possible according to the present invention: the configuration is applicable to a simple matrix. The drive circuit will be described in more detail in embodiment 7.

Figure 10:
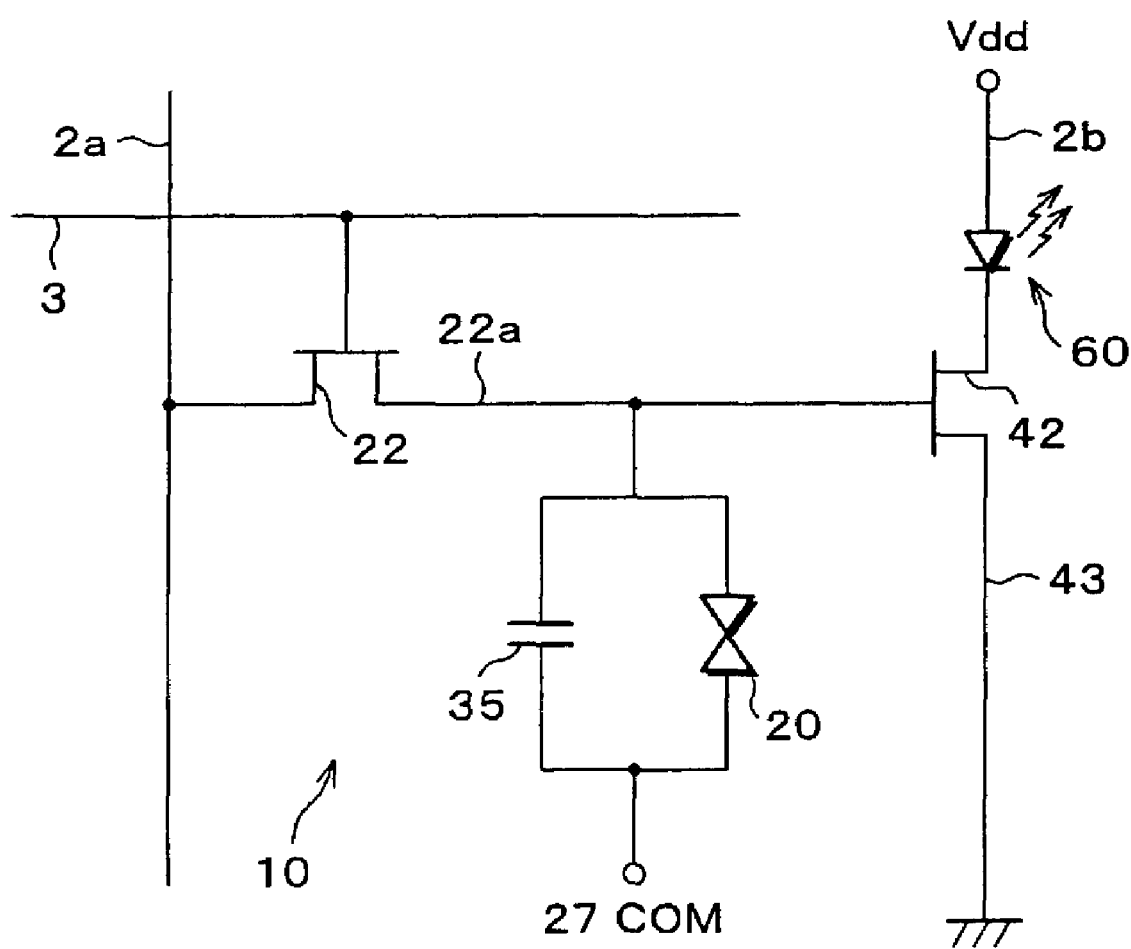
FIG. 10 is a circuit diagram illustrating how a pixel is driven when pixels share a signal line in the display in a different manner from FIG. 9.

Referring to the figure, circuitry in the display 50 corresponding to a pixel is configured as follows: the gate electrode of the TFT element 22 for liquid crystal is connected to a gate bus line 3, and a resource bus line 2a is connected to the source electrode of the TFT element 22 for liquid crystal; the drain electrode 22a of the TFT element 22 for liquid crystal is connected to the liquid crystal display element 20, a liquid crystal auxiliary capacitance 35, and the gate electrode of the TFT element 42 for an EL element; the source electrode of the TFT element 42 for an EL element is connected to a current supply line 2b, and the drain electrode of the TFT element 42 for an EL element is connected to the cathode 61 of the organic EL element 60. In the configuration, the organic EL element 60 is connected to the drain of the TFT element 42 for an EL element; however, alternatives are possible in one of which the organic EL element 60 may be connected to the source of the TFT element 42 for an EL element as shown in FIG. 10.

In the drive circuit for the display 50 configured this way, the TFT element 22 for liquid crystal is switched on/off by a scanning line signal Vg fed through the gate bus line 3, and a data line signal Vs on the resource bus line 2a is fed to the liquid crystal display element 20. The ON-state of the liquid crystal display element 20 is maintained by the liquid crystal auxiliary capacitance 35. In the present embodiment, the EL threshold voltage Vth(OLED) of the TFT element 42 for an EL element is specified to a value higher than the operational voltage range of the liquid crystal display element 20; if the value of the data line signal Vs of the resource bus lines 2a exceeds the operational voltage range of the liquid crystal display element 20, the liquid crystal display element 20 saturates, and the TFT element 42 for an EL element is switched on, causing the organic EL element 60 to emit light.

Meanwhile, the liquid crystal display element 20 is specified to normally white and appears black when saturated. In such a voltage range where the organic EL element 60 emits light, the liquid crystal display element 20 therefore serves as a black matrix for the organic EL element 60 and causes no contrast reduction.

In such a voltage range where only the liquid crystal display element 20 operates, the light-emitting area 12a does not emit light and appears black due to the polarizer 32 and the retardation plate 31 provided on the panel's display surface. The organic EL element 60 does not cause the liquid crystal display element 20 to reduce its contrast.

Figure 11:
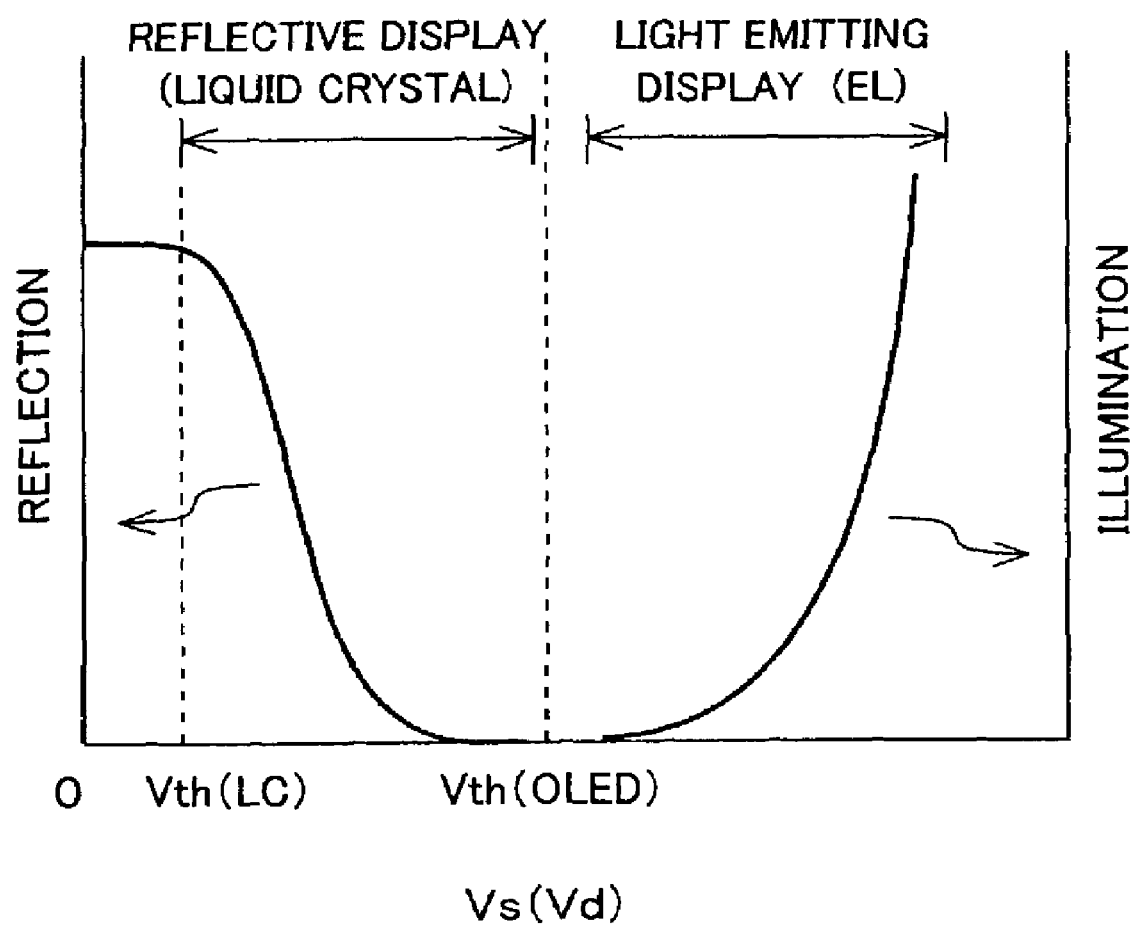
FIG. 11 is a characteristic diagram illustrating screen states of the display.

Specifically, as shown in FIG. 11, if the data line signal Vs is smaller than the EL threshold voltage Vth(OLED) of the TFT element 42 for an EL element, the organic EL element 40 emits no light, and the liquid crystal display element 20 responses, producing a bright display to a dark display, i.e. a black display; if the data line signal Vs is larger than the EL threshold voltage Vth(OLED) of the TFT element 42 for an EL element, the liquid crystal display element 20 produces a dark display and effects a light-emitting-type display as a result of the data line signal Vs changing the drain current of the TFT element 42 for an EL element and adjusting light emission from the organic EL element 60. Light emission from the organic EL element 60 may be adjusted in terms of amount also by adjusting a supply voltage Vdd. This is not the only the method of driving the display 50 of the present embodiment; alternatives methods are possible. The most suitable method is the one shown in FIG. 11, because it involves a common drive circuit.

Another alternative to the above method of driving is to drive the abovementioned organic EL element 60 and liquid crystal display element 20 independently from each other where the elements do not need to produce combined display effects, in which case the liquid crystal display element 20 is preferably specified to normally black and appears black when the liquid crystal display element 20 is in OFF state. This is to increase display contrast without the liquid crystal display element 20 wasting power when the liquid crystal display element 20 is not operating.

Conventional liquid crystal displays including a combination of a transmissive-type liquid crystal display element and a reflective-type liquid crystal display element need light and power sources to effect a transmissive-type display. The display 50 of the present embodiment incorporating the organic EL element 60 and the reflective-type liquid crystal display element 20 in a single panel can also modulate luminance if, for example, the driver is equipped with a power source.

Therefore, the display 50 of the present embodiment needs no power supply for a light source, allowing reduction in cost, component count, and overall size. It is equivalent to self-light emission luminance dropping to 0 at point W as shown in FIG. 2 mentioned above, when signal wiring is shared and switching is made between the light-emitting display element and the non-light-emitting display element producing a display using external light by means of the voltage on the signal wiring.

In this manner, in the display 50 of the present embodiment, each display pixel 10 has both the reflective area 11 constituted by a non-light-emitting display element where the liquid crystal display element 20 reflects external light to effect a display and the light-emitting area 12a constituted by a light-emitting display element where the organic EL element 60 performs direct modulation to effect a display.

Therefore, the liquid crystal display element 20 and the organic EL element 60 are interposed together between a pair of the insulating substrate 21 and the insulating substrate 29, thinning down the display.

Since the organic EL element 60 directly produces a display by self-emitting light toward the display-surface side, the organic EL element 60 is not used as a backlight or a frontlight like in conventional cases. This is another factor contributing to the improvement of light using efficiency of the organic EL element 60 and thinning down the display. A typical backlight or frontlight is about 3 mm to 6 mm thick; the thinning down due to the elimination of the need for a backlight has great advantages. The elimination of the need for a backlight leads to the elimination of the need for a polarizer, a retardation plate, and a glass substrate conventionally provided on the back of the liquid crystal panel between the back panel and the backlight. The elimination of the need for the polarizer, the retardation plate, and the glass substrate provided on the back side further cuts down on the thickness of the display.

The thinning down of the entire display is not the only advantage in eliminating the need for a backlight and a polarizer and a retardation plate on the back side: reducing component counts not only cuts the materials costs, but also the number of assembly steps and parts inspection and other costs. The overall manufacturing cost of the display is reduced as a result.

Further, the display 50 of the present embodiment includes the oppositely positioned insulating substrates 21 and 29, with the liquid crystal display element 20 and the organic EL element 60 both interposed between the insulating substrates 21 and 29. Since both the liquid crystal display element 20 and the organic EL element 60 are thus accommodated between the insulating substrates 21 and 29, the display 50 is surely thinned down.

Further, the display 50 of the present embodiment includes no liquid crystal layer 26 in the liquid crystal display element 20 in the light-emitting area 12a. In other words, no liquid crystal layer 26 in the liquid crystal display element 20 is present on the display-surface side of the EL light-emitting layer 63 in the organic EL element 60. This means that outgoing light from the organic EL element 60 toward the display surface goes out of the display 50 without passing through the liquid crystal layer 26. The present embodiment is a mere example where no liquid crystal layer 26 is present on the display-surface side of the EL light-emitting layer 63. Another example will be described in embodiment 3, where the end face of the liquid crystal layer 26 on the display-surface side is positioned closer to the display-surface side than the end face of the EL light-emitting layer 63 on the display-surface side with the presence of the insulating protrusion 81 and other insulating layers gets rid of the display-surface side of the EL light-emitting layer 63, i.e., the liquid crystal layer 26 of the light-emitting area 12a. In another structure, the EL light-emitting layer 63 may be positioned on the display-surface side in the liquid crystal display element 20.

As a result, the outgoing light from the organic EL element 60 is neither scattered nor absorbed by the liquid crystal layer 26 in the liquid crystal display element 20, luminance hardly drops. Thus, the organic EL element 60 has improved display quality. Further, in the display 50 of the present embodiment, the liquid crystal layer 26 in the liquid crystal display element 20 and the EL light-emitting layer 63 in the organic EL element 60 are provided in the same layer. Note that the "same layer" does not necessarily mean that both components are literally at the same level: the EL light-emitting layer 63 in the organic EL element 60 may be inside the liquid crystal layer 26 in the liquid crystal display element 20.

Thus, the organic EL element 60 can be contained within the thickness of a non-light-emitting display element constituted by a conventional liquid crystal display element 20. The display 50 is therefore surely thinned down.

Further, in the display 50 of the present embodiment, the drive elements, such as the TFT elements 22 for liquid crystal and the TFT elements 42 for an EL element, for driving the organic EL elements 60 and the liquid crystal display elements 20 are formed on the TFT substrate 51 side, and the organic EL elements 60 are formed on the opposite substrate 52 side opposing the TFT substrate 51.

Therefore, when the display 50 is to be manufactured, the organic EL elements 60 can be separately formed from the drive elements such as the TFT elements 22 for liquid crystal and the TFT elements 42 for an EL element. This frees the formation of drive elements such as the TFT elements 22 for liquid crystal and the TFT elements 42 for an EL element from negative effects of process temperatures, chemical agents, gases, etc in the formation of the organic EL elements 60.

Further, because the outgoing light from the organic EL elements 60 travels toward the opposite substrate 52 side, the light is not blocked by the TFT elements 42 for an EL element driving the organic EL elements 60 and used efficiently. Further because the EL light-emitting layer 63 can be fabricated from a transparent conductive layer which serves as the anode 65, the EL light-emitting layer 63 can be formed to have the same configuration as in conventional cases.

Incidentally, when the organic EL elements 60 are provided in the same layer as the liquid crystal layer 26 of the liquid crystal display elements 20, the organic EL elements 60 may not be as high as the liquid crystal layer 26 of the liquid crystal display elements 20 is thick.

As to this point, in the present embodiment, the TFT substrate 51 has a conductive contact layer 66 for height adjustment, and the organic EL elements 60 are formed on the conductive contact layer 66.

The configuration ensures that the organic EL elements 60 are in the same layer as the liquid crystal layer 26 of the liquid crystal display elements 20.

Further, in the display 50 of the present embodiment, the conductive contact layer 66 is made of a conductive resin. Therefore, the formation of the conductive contact layer 66 made of a conductive resin from the TFT substrate 51 facilitates the height adjustment from the TFT substrate 51 side.

Further, in the display 50 of the present embodiment, there is provided conductive contact material, such as paste or resin, at the interfaces of the cathodes 61 of the organic EL elements 60 and the TFT substrate 51 side.

That is, typical conductive paste and resin are soft and elastic even after it is cured, which ensures electrical attachment of the cathodes 61 of the organic EL elements 60 to the TFT substrate 51 side.

Further, in the display 50 of the present embodiment, the organic EL elements 60 and the liquid crystal display elements 20 share the resource bus lines 2a and the gate bus lines 3 in driving.

This prevents the drive circuit's configuration for the organic EL elements 60 and the liquid crystal display elements 20 from being complex, and surely delivers a display 50 which allows for reduction in thickness and component costs.

Further, in the display 50 of the present embodiment, the organic EL elements 60 and the liquid crystal display elements 20 may be adapted so as to be driven independently from each other. This would make it possible to drive the organic EL elements 60 and the liquid crystal display elements 20 separately. The configuration to drive the organic EL elements 60 and the liquid crystal display elements 20 independently from each other differs depending on whether, for example, the organic EL elements 60 and the liquid crystal display elements 20 have individual resource bus lines 2a and gate bus lines 3 or have individual resource bus lines 2a and share common gate bus lines 3.

Further, in the display 50 of the present embodiment, the TFT elements 42 for an EL element and the TFT elements 22 for liquid crystal driving the organic EL elements 60 and the liquid crystal display elements 20 are formed on the TFT substrate 51 which is one of the two substrates. Therefore, forming the TFT elements 42 for an EL element and the TFT elements 22 for liquid crystal on the TFT substrate 51 facilitates the manufacture of the display 50 and eases complexity of the configuration.

Further, in the display 50 of the present embodiment, the light-modulating elements are the reflective-type, liquid crystal display elements 20, and the light-emitting elements are the organic EL elements 60.

Therefore, by using the reflective-type. liquid crystal display elements 20 as the light-modulating elements, the liquid crystal display elements 20 and the organic EL elements 60 can be easily placed next to each other in the display pixels 10.

Thus, a display 50 can be offered which allows for reduction in size and cost and delivers excellent visibility from outdoors to indoors.

Further, in the display 50 of the present embodiment, the opposite electrodes 27 of the liquid crystal display elements 20 and the anodes 65 of the organic EL elements 60 are formed of the same material in the same layer.

This makes it possible to apply the same fabrication method and facilitate the manufacture process.

Further, in the method of manufacturing the display 50 of the present embodiment, after forming the TFT elements 22 for liquid crystal and the TFT elements 42 for an EL element on the TFT substrate 51 which is one of the two substrates and the organic EL elements 60 on the other substrate, i.e., the opposite substrate 52, the TFT substrate 51 and the opposite substrate 52 are combined for integration.

To this end, when the display 50 is to be manufactured, the organic EL elements 60 can be formed separately from the TFT elements 22 for liquid crystal and the TFT elements 42 for an EL element. This frees the formation of the TFT elements 22 for liquid crystal and the TFT elements 42 for an EL element from negative effects of process temperatures, chemical agents, gases, etc. in the formation of the organic EL elements 60.

Thus, a display 50 can be offered which allows for reduction in size and cost and delivers excellent visibility from outdoors to indoors.

Further, in the method of manufacturing the display 50 of the present embodiment, either the organic EL elements 60 or the cores 77 may be formed first. The configuration could make it possible to prioritize one of the steps to form the organic EL elements 60 and the cores 77 whichever is easier.

Further, in the display 50 of the present embodiment, the TFT substrate 51 and the opposite substrate 52 are combined after a conductive contact material, such as paste or resin, is provided at the interface between the cathodes 61 of the organic EL elements 60 and the TFT substrate 51 side.

By forming the interface between the cathodes 61 of the organic EL elements 60 and the TFT substrate 51 side from resin only or resin and paste, the elasticity of the resin or the paste allows for improvement in contact performance.

Embodiment 2

Referring to FIGS. 12-15, the following will describe another embodiment in accordance with the present invention. Here, for convenience, members of the present embodiment that have the same arrangement and function as members of embodiment 1 above, and that are mentioned in that embodiment are indicated by the same reference numerals and description thereof is omitted.

The present embodiment will discuss an organic EL element made of a polymer type EL material.

Figure 12:
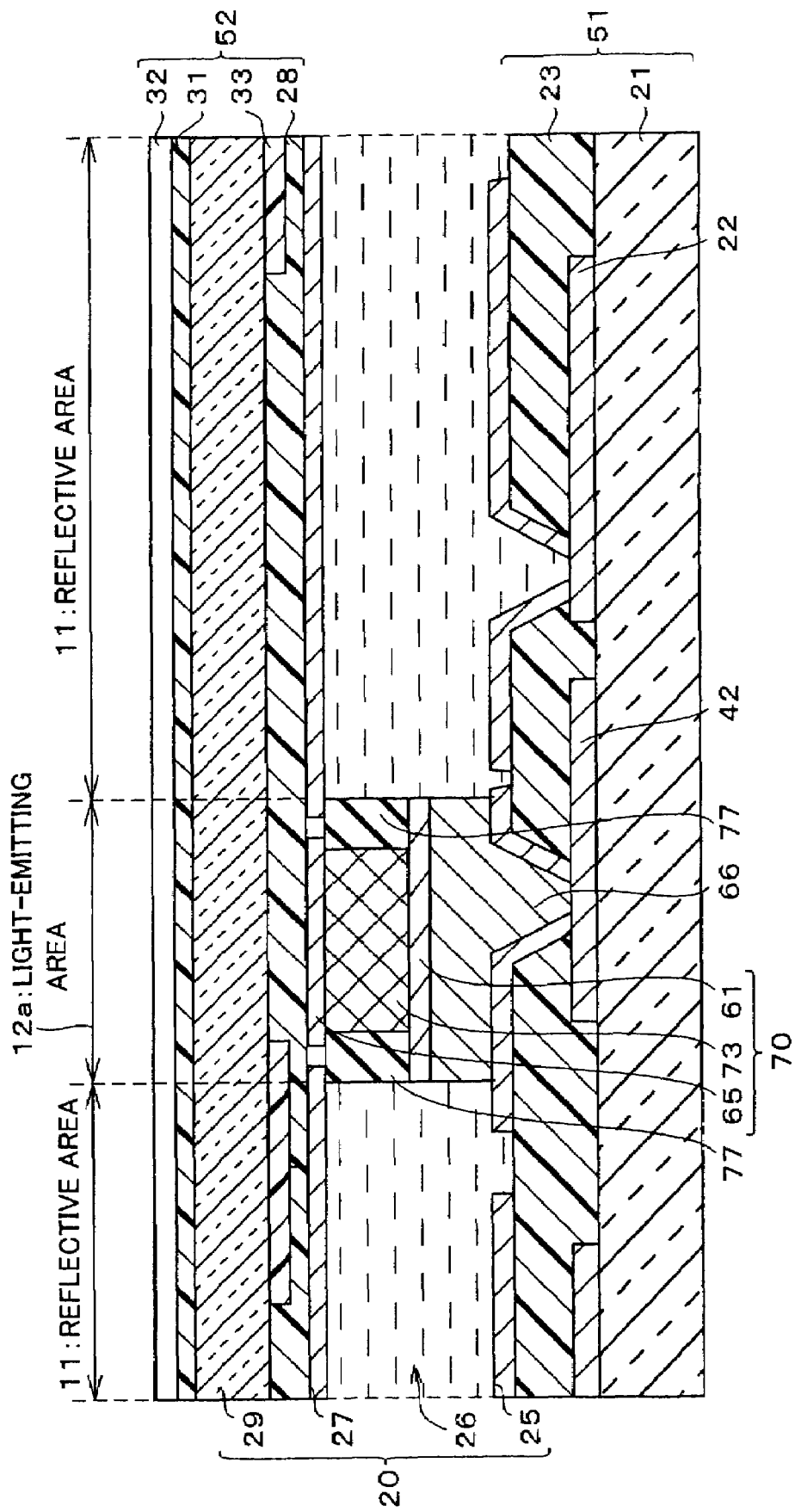
FIG. 12, showing another embodiment of a display in accordance with the present invention, is a cross-sectional view illustrating a part of the display corresponding to a pixel.

An organic EL element 70 of the present embodiment, as shown in FIG. 12, includes light-emitting layers 73 as light-emitting layers made of a polymer type EL material and cathodes 61 and anodes 65 attached directly to the bottoms and tops of the light-emitting layers 73. In other words, in the organic EL element 70 of the present embodiment, the hole transport layer 64 and the electron transport layer 62 in the organic EL element 60 of embodiment 1 are omitted, although they may be provided in the present embodiment too.

Further, in the present embodiment, on each side face of the light-emitting layer 73 is there formed a core 77 as a protective layer insulating the layer 73 from the liquid crystal layer 26. In forming the light-emitting layer 73, the cores 77 may be formed first with an EL material subsequently printed by ink jet technology between the cores 77.

The cores 77 can be made of a material, such as resist or polyimide. The material for the cores 77 preferably has a light-blocking capability; otherwise, the outgoing light from the light-emitting layer 73 and leaking horizontally might enter the liquid crystal layer 26, and the stray light could reduce contrast.

A method of manufacturing the organic EL element 70 is now described.

First of all, as shown in FIG. 13(*a*), the cores 77 are formed on the surface of the opposite substrate 52 on which the opposite electrode 27 and the anode 65 are provided, by photolithography or ink jet printing using resist or polyimide.

Next, as shown in FIG. 13(*b*), the light-emitting layer 73 is formed there of a polymer type EL material by, for example, ink jet printing. Examples of the polymer type EL material include polyphenylene vinylene, polyfluorene, polythiophene, and polyvinylcarbazole.

Finally, as shown in FIG. 13(*c*), the cathode 61 may be formed by coating the top with, for example, a conductive polymer material. Alternatively, the cathode 61 may be formed by forming a metal material or paste, such as aluminum (Al), magnesium (Mg), or an aluminum (Al)-magnesium (Mg) alloy, (not shown) and subsequently applying a conductive polymer material.

Figure 14:
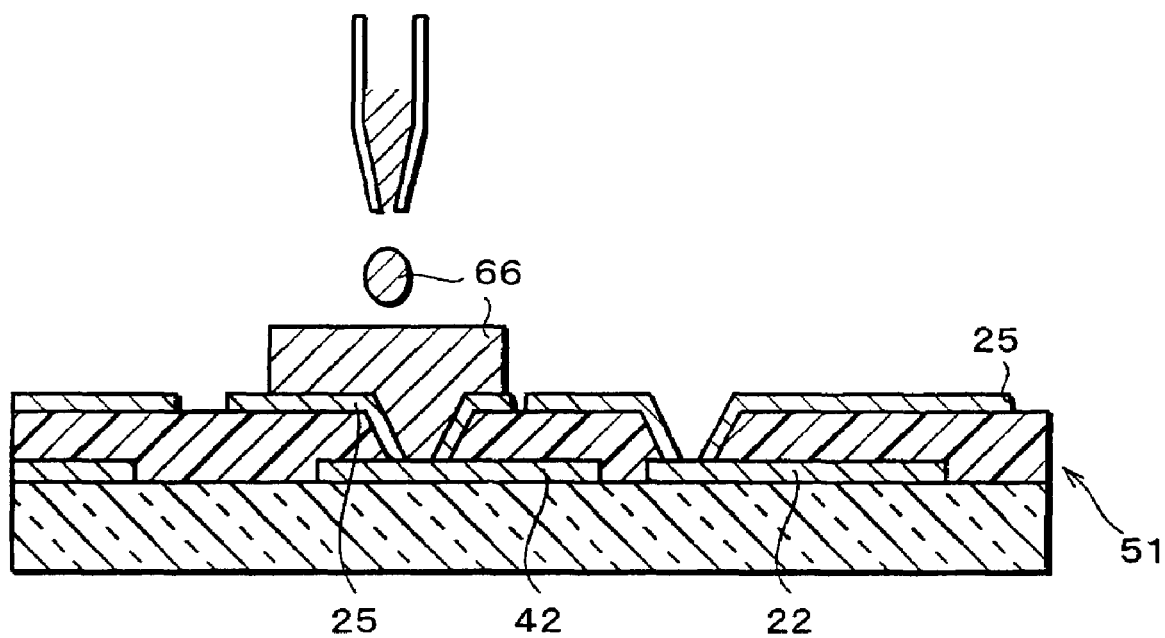
FIG. 14 is an explanatory drawing illustrating a method of manufacturing a TFT substrate of the display.

Meanwhile, as to the TFT substrate 51, as shown in FIG. 14, the conductive contact layer 66 is formed by ink jet printing a photosensitive conductive resin on the TFT substrate 51 on which the TFT element 22 for liquid crystal, the TFT element 42 for an EL element, and the pixel electrode 25 are already formed.

Figure 15A:
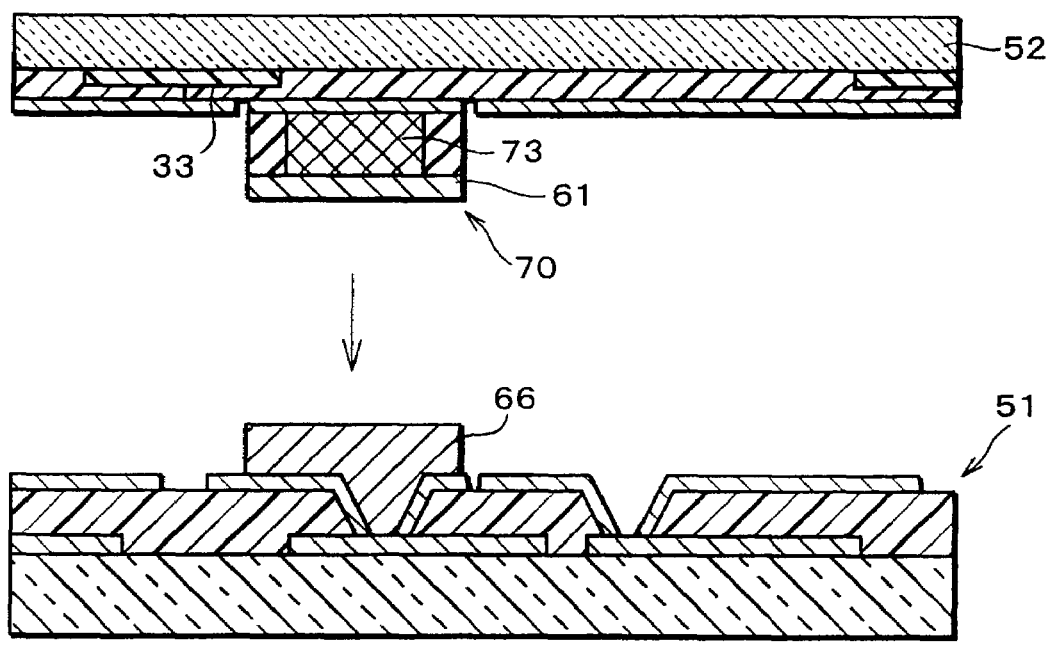
FIGS. 15(a) and 15(b) are explanatory drawings illustrating how an opposite substrate is combined with a TFT substrate in the display.
Figure 15B:
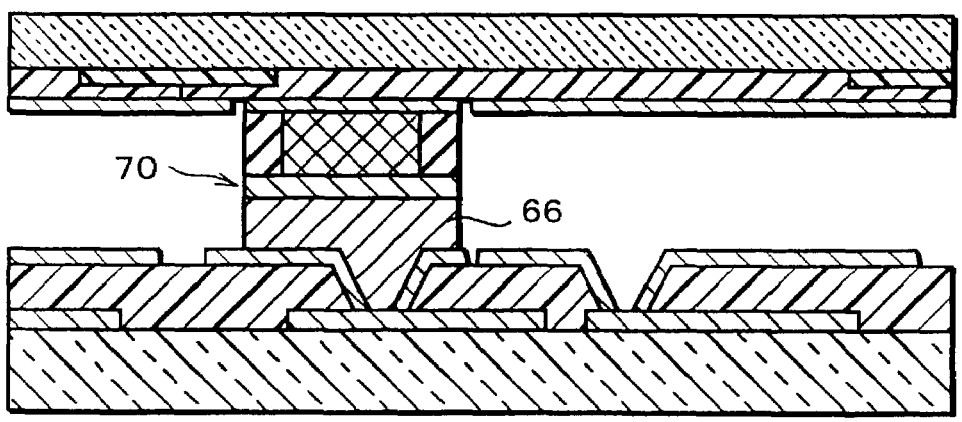

Next, as shown in FIG. 15(*a*) and FIG. 15(*b*), the opposite substrate 52 carrying the organic EL element 70 is aligned with the TFT substrate 51 and attached before fixing as in embodiment 1.

Thereafter, the liquid crystal is injected and sealed. The liquid crystal can be injected in vacuum along scanning lines from a display panel end face, if the cores 77 are formed to extend parallel to the scanning lines across the display panel.

Descriptions are omitted regarding alternative configurations, drive operations of the organic EL element 70, display methods, etc., because they are the same as in embodiment 1.

As detailed in the foregoing, the organic EL element 70 of the present embodiment includes at least the light-emitting layer 63 and the cathode 61 and the anode 65 formed flanking the light-emitting layer 63.

Therefore, for example, in cases where the light-emitting layer 73 of a polymer type EL material is formed, the organic EL element 70 can be formed from as few components as possible.

Incidentally, in the display 50, the organic EL element 70 and the liquid crystal layer 26 in the liquid crystal display element 20 are placed in the same layer and may negatively affect each other: for example, some organic EL elements 70 may come in contact with the liquid crystal layer 26 of liquid crystal, etc. in the liquid crystal display element 20, which could degrade performance of the two parts and wear the material. Further, the organic EL element 70 may degrade in contact with air and water.

However, in the present embodiment, the light-emitting layer 73 in the organic EL element 70 and the liquid crystal layer 26 in the liquid crystal display element 20 are adjacent each other, but separated by the cores 77.

Therefore, the light-emitting layer 73 in the organic EL element 70 and the liquid crystal layer 26 in the liquid crystal display element 20 can be prevented from affecting each other. In other words, after the organic EL element 70 is provided in the same layer as the liquid crystal layer 26 in the liquid crystal display element 20, performance degradation of the two parts and material wearing can be prevented. Further, in the manufacture of the display 50, for example, when the organic EL element 70 is formed on the opposite substrate 52, the light-emitting layer 73 can be prevented from degrading in contact with air and water by protecting the light-emitting layer 73 with the cores 77 and the cathode 61.

Incidentally, the outgoing light from the organic EL element 70 many leak into the liquid crystal display element 20.

This problem is addressed by the display 50 of the present embodiment in which the cores 77 have a light-blocking capability. Outgoing light from the organic EL element 70 is prevented from leaking into the liquid crystal layer 26 in the liquid crystal display element 20.

Embodiment 3

Referring to FIGS. 16-19, the following will describe another embodiment in accordance with the present invention. Here, for convenience, members of the present embodiment that have the same arrangement and function as members of embodiment 1 or 2 above, and that are mentioned in that embodiment are indicated by the same reference numerals and description thereof is omitted.

Figure 16:
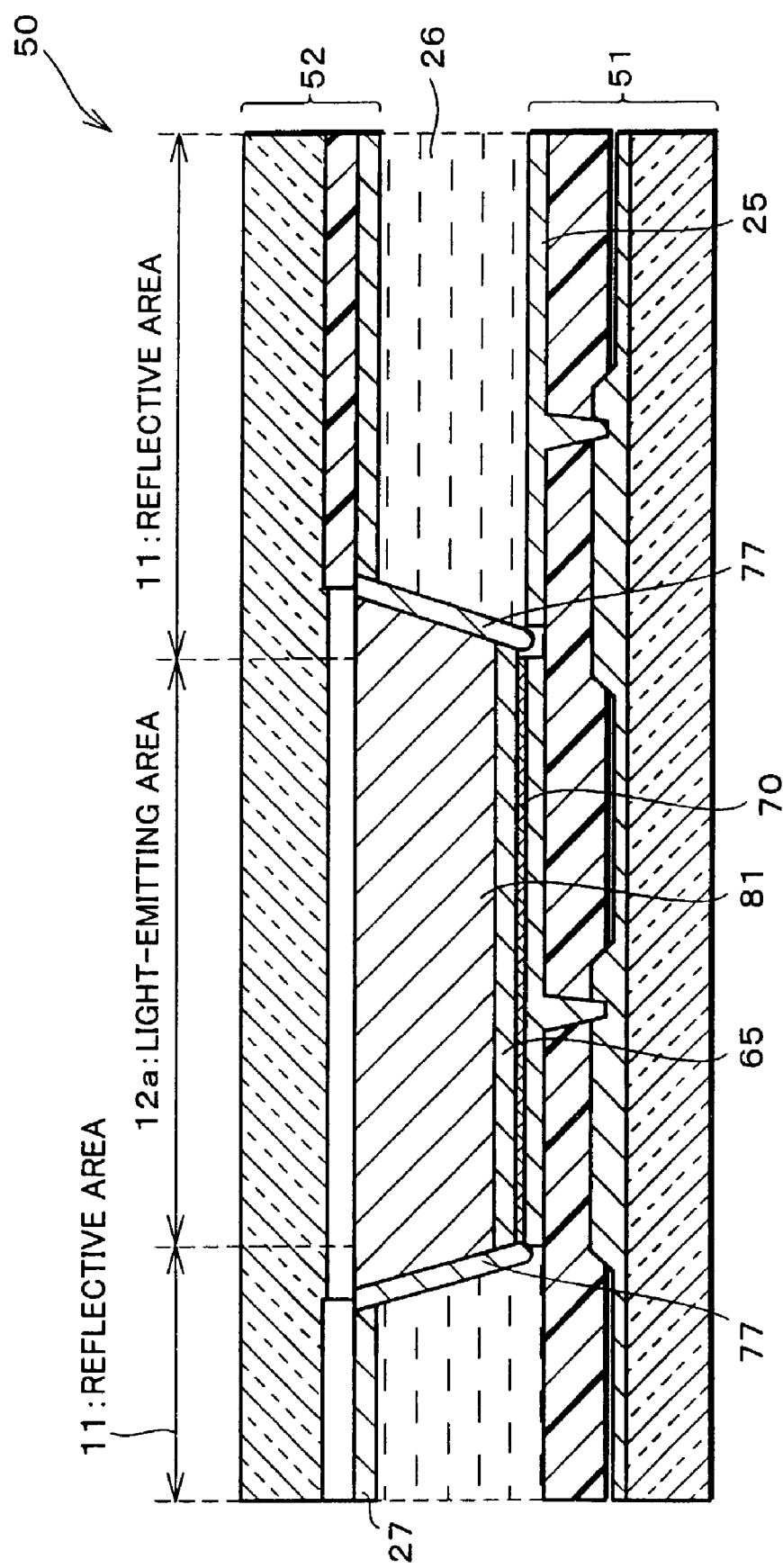
FIG. 16, showing a further embodiment of a display in accordance with the present invention, is a cross-sectional view illustrating a part of the display corresponding to a pixel.

The display 50 of the present embodiment includes an insulating protrusion 81 as a hard, transparent protrusion as a protrusion on an opposite substrate 52 and an organic EL element 70 on a TFT substrate 51 as shown in FIG. 16. The insulating protrusion 81 is the same as the one used as a pillar controlling the thickness of the liquid crystal layer 26.

Accordingly, the liquid crystal layer 26 is in most cases specified to have a 3- to 5-μm thickness. The organic EL element 70 is about 0.1 μm to 0.5 μm. With the organic EL element 60 and the organic EL element 70 described in embodiments 1 and 2 in reference to FIG. 1 and FIG. 12, the thickness difference was adjusted using the conductive contact layer 66 which is connecting resin.

By contrast, in the present embodiment, the insulating protrusion 81 has a height with thicknesses of the liquid crystal layer 26 and the organic EL element 70 taken into consideration. There is provided a connecting section although it is not explicitly depicted in FIG. 16.

The insulating protrusion 81 needs to be made of a high transmittance resin material: for example, photosensitive spacer material products of JSR Co., Ltd. which are commercially available as "Optoma-NN series."The high transmittance resin material has greater hardness after formation than the connecting resin used for the conductive contact layer 66 and the connecting section. Because of this property, the specification of the height will likely be effective in maintaining the distance between the opposite substrate 52 and the TFT substrate 51 at a fixed value.

Conventionally, the thickness of the liquid crystal layer 26 is controlled spacer beads distributed in the liquid crystal layer 26; however, the beads sit on the pixel display surface of the liquid crystal layer 26, causing poor contrast, scattering, and hence image quality degradation. Further, the spacer beads could not deliver sufficient control of thickness.

The control of the thickness of the liquid crystal layer 26 by means of the insulating protrusion 81 as in the present embodiment improves the precision in controlling the thickness of the liquid crystal layer 26 and expectedly strengthens the panel.

Figure 17:
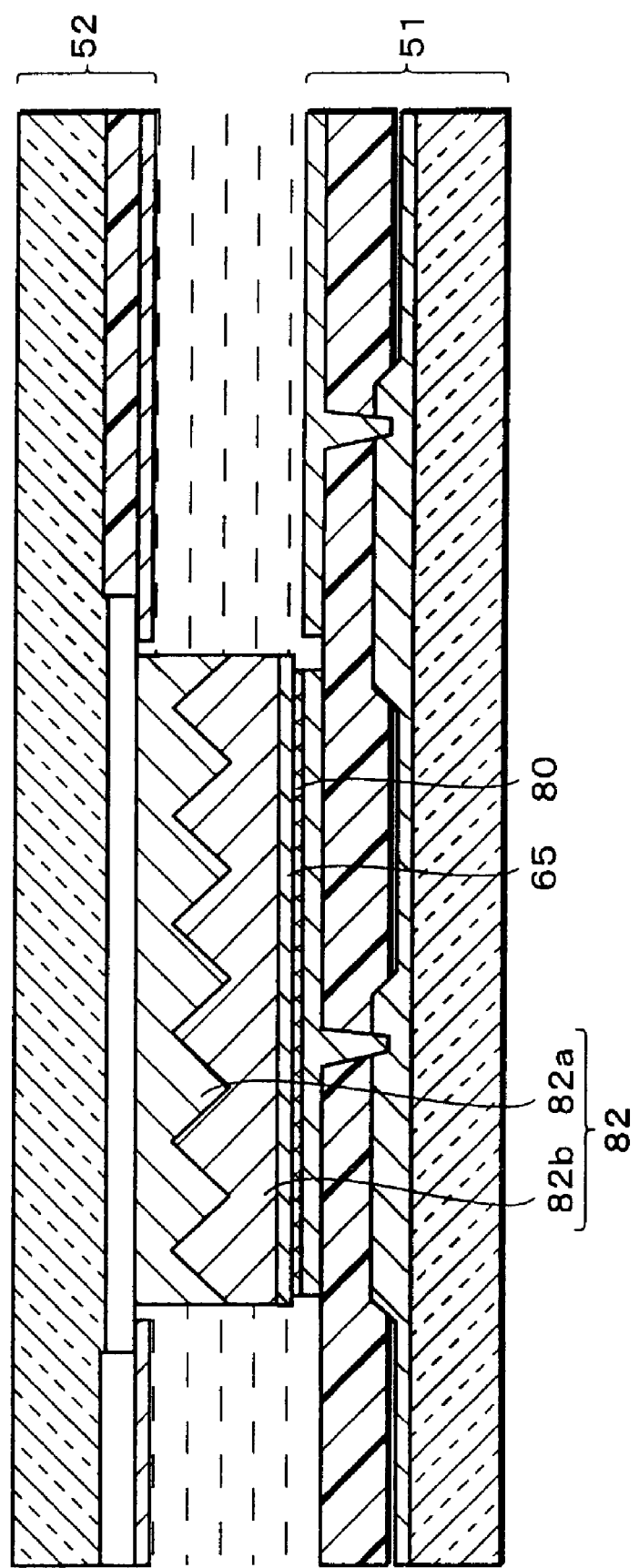
FIG. 17 is a cross-sectional view illustrating a protrusion formed in layers in the display.

The insulating protrusion 81 is used for the sole purpose of controlling thickness in the present embodiment, but may be used also as a control member for light from the organic EL element 70, that is, an optical element controlling light from the organic EL element 70. To this end, for example, as shown in FIG. 17, a insulating protrusion 82 constituted by sawtooth-shaped protrusions 82a, 82b may be used as a protrusion in which transparent resins with different refractive indices are provided forming two layers. The structure imparts directivity to outgoing light from the organic EL element 70. Since directivity changes by altering the shape of the sawtooth, it becomes possible to achieve the same viewing angle properties as the liquid crystal display.

Figure 18:
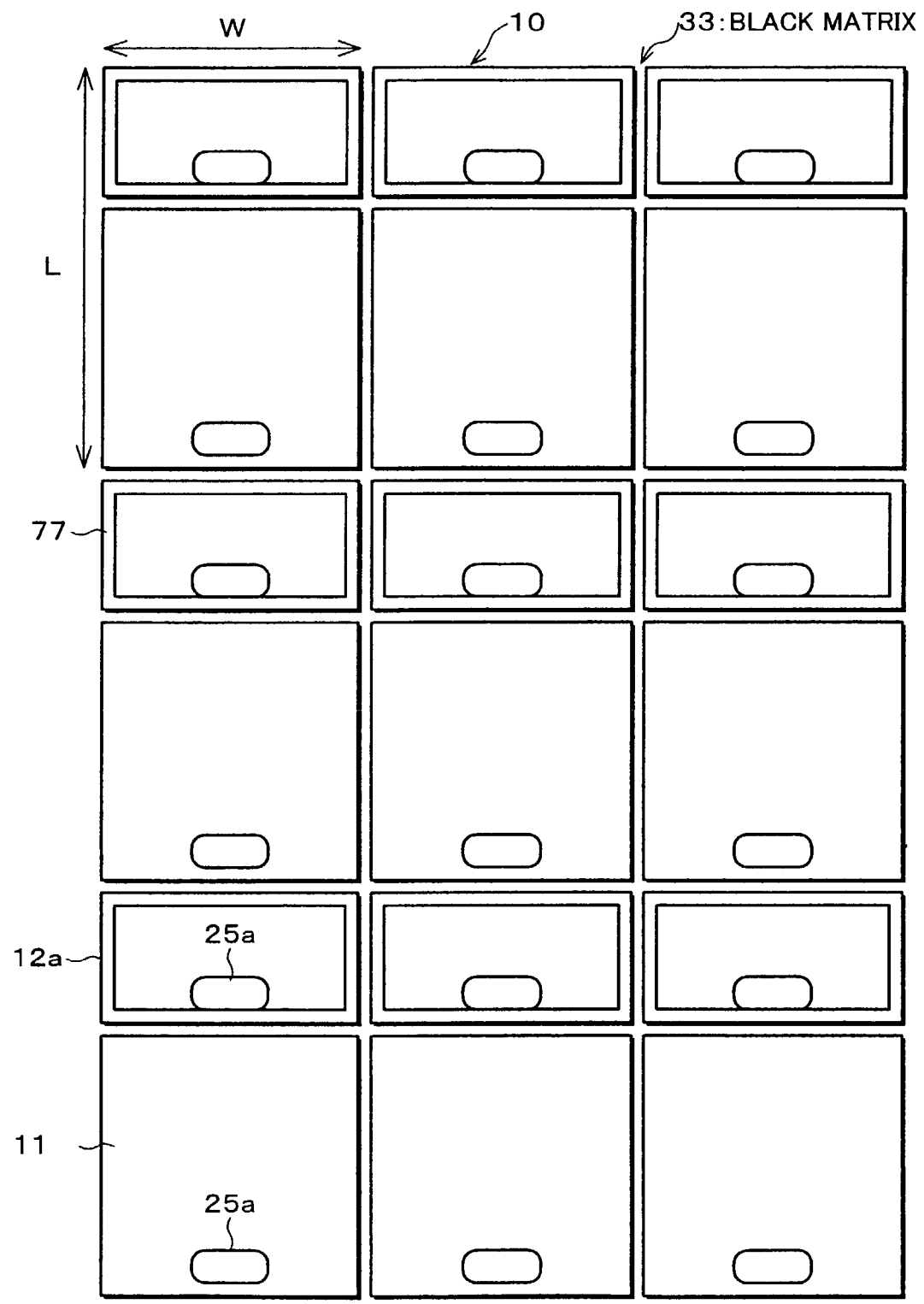
FIG. 18 is a plan view of a display screen on the display.
Figure 19:
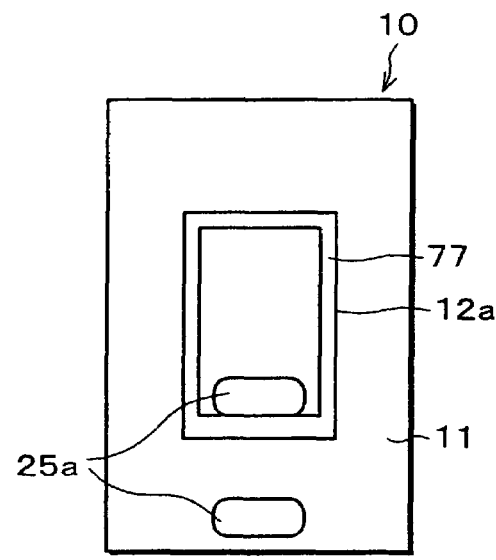
FIG. 19(a) is a plan view illustrating division of a part of the display corresponding to a pixel into a reflective area and a light-emitting area, with the light-emitting area located inside the reflective area.
FIG. 19(b) is a plan view illustrating division of a part of the display corresponding to a pixel into a reflective area and a light-emitting area, with the light-emitting area located in a corner of the reflective area.
Figure 19:
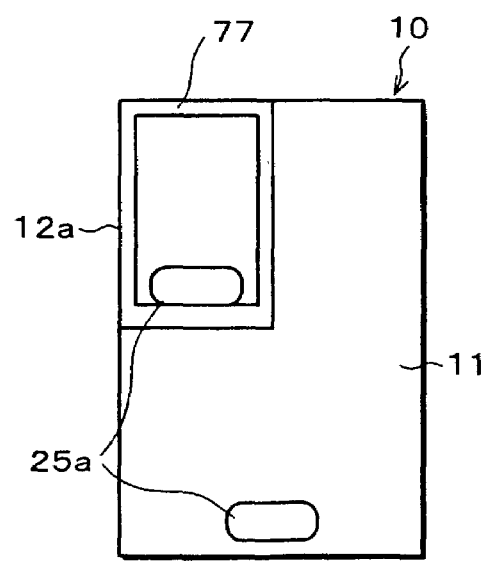

Under this circumstance, the organic EL element 70 of the present embodiment appears as in FIG. 18 when looked down from the display surface: each portion defined by W and L corresponds to a display pixel 10 and is divided into a reflective area 11 and a light-emitting area 12a. Further, still referring to the same figure, both the reflective area 11 and the light-emitting area 12a has a through hole 25a in which the pixel electrode 25 is connected to the TFT element 22 for liquid crystal or the TFT element 42 for an EL element.

The division of the display pixel 10, i.e., the arrangement of the reflective area 11 and the light-emitting area 12a, is not limited to the foregoing. An alternative is a reflective area 11 enclosed by the light-emitting area 12a or vice versa: an example is shown in FIG. 19(a) where the light-emitting area 12a of the organic EL element 70 is enclosed by the reflective area 11 of the liquid crystal display element 20. In the arrangement of the light-emitting area 12a of the organic EL element 70 enclosed by the reflective area 11 of the liquid crystal display element 20 as shown in the figure, by adapting the reflective areas 11 of surrounding liquid crystal display elements 20 so that when an organic EL element 70 is emitting light, those which surround the element 70 turn black, the adjacent display elements serves as black matrices; the adaptation is effective for higher contrast when compared to the division shown in FIG. 18. Further, the same effects are expected with the division as in FIG. 19(b), because when display pixels 10 are provided in proximity to one another, the light-emitting area 12a of each organic EL element 80 is surrounded by the reflective areas 11 of liquid crystal display elements 20

Further, the area ratios accounted for by the light-emitting areas 12a and the reflective areas 11 may be determined depending on the usage of the display The description of the present embodiment has so far been based on the assumption that the light-emitting layer 73 in the organic EL element 70 is made of a polymer type EL material; alternatives are possible, and the present embodiment is applicable to organic EL elements 60 containing EL light-emitting layers 63 made of low-molecular-type EL materials.

Descriptions are omitted regarding alternative configurations because they are the same as in embodiments 1 and 2.

As detailed in the foregoing, in the display 50 of the present embodiment, the insulating protrusion 81 or insulating protrusion 82 is formed on the opposite substrate 52 to adjust formation height, and the organic EL elements 70 are formed on the insulating protrusion 81 or insulating protrusion 82.

Therefore, in cases where the organic EL elements 70 are provided in the same layer as the liquid crystal layer 26 of the liquid crystal display elements 20, even if the height of the organic EL elements 70 does not match the thickness of the liquid crystal layer 26 of the liquid crystal display elements 20, the organic EL elements 70 can be surely provided in the same layer as the liquid crystal layer 26 of the liquid crystal display elements 20.

Further, in the display 50 of the present embodiment, the insulating protrusion 81 or insulating protrusion 82 is constituted by a hard insulating layer. Therefore, forming the insulating protrusion 81 or insulating protrusion 82 constituted by a hard insulating layer from the opposite substrate 52 side makes it possible to easily adjust height from the opposite substrate 52 side. Further, forming the insulating protrusion 81 or insulating protrusion 82 from a hard insulating layer makes it possible to cause the insulating protrusion 81 or insulating protrusion 82 to operate as a spacer keeping the liquid crystal display elements 20 and the liquid crystal layer 26 at a fixed distance.

In the present embodiment, the insulating protrusion 82 constituted by a hard insulating layer may be provided in two layers, and its interface is shaped like saw teeth to form sawtooth-shaped protrusions 82a, 82b. The configuration could impart directivity to outgoing light from the organic EL elements 60. In this manner, it is possible to cause the insulating protrusion 82 to operate as a light control member for the organic EL elements 60.

Further, in the display 50 of the pixel dividing scheme of the present embodiment, the ratio of the reflective area 11 and the light-emitting area 12a can be set to an arbitrary value to some extent. The reflective area 11, which is a reflective area, is designed to occupy a large area when, for example, the display 50 is supposed to be used in mobile telephones, personal digital assistants (PDAs), and other mobile devices. If, for example, 80% of the pixel area of the display pixels 10 is assigned to the reflective area, the remaining 20% goes to the light-emitting area 12a, and the light-emitting area of the organic EL element 60 takes up a maximum of ⅕ the pixel area.

Thus, a display can be offered which allows for reduction in size and cost and delivers excellent visibility from outdoors to indoors.

The display 50 of the present embodiment is adapted so that when the liquid crystal display element 20 is in a bright screen state, the organic EL element 70 can switch to a non-light-emitting state. This makes it possible to effect a display under sufficient lighting using only the liquid crystal display element 20 with the organic EL element 70 set to a non-light-emitting state, which in turn prevents degradation of the organic EL element 70, allows for longer life and reduction in power consumption.

Further, in the display 50 of the present embodiment, the liquid crystal display element 20 and the organic EL element 70 placed adjacent to each other, and when either one of the liquid crystal display element 20 and organic EL element 70 is in a bright screen state, the other is in a dark screen state.

This designates either one to serve as the black matrix 33 and does not reduce display contrast.

Embodiment 4

Figure 20:
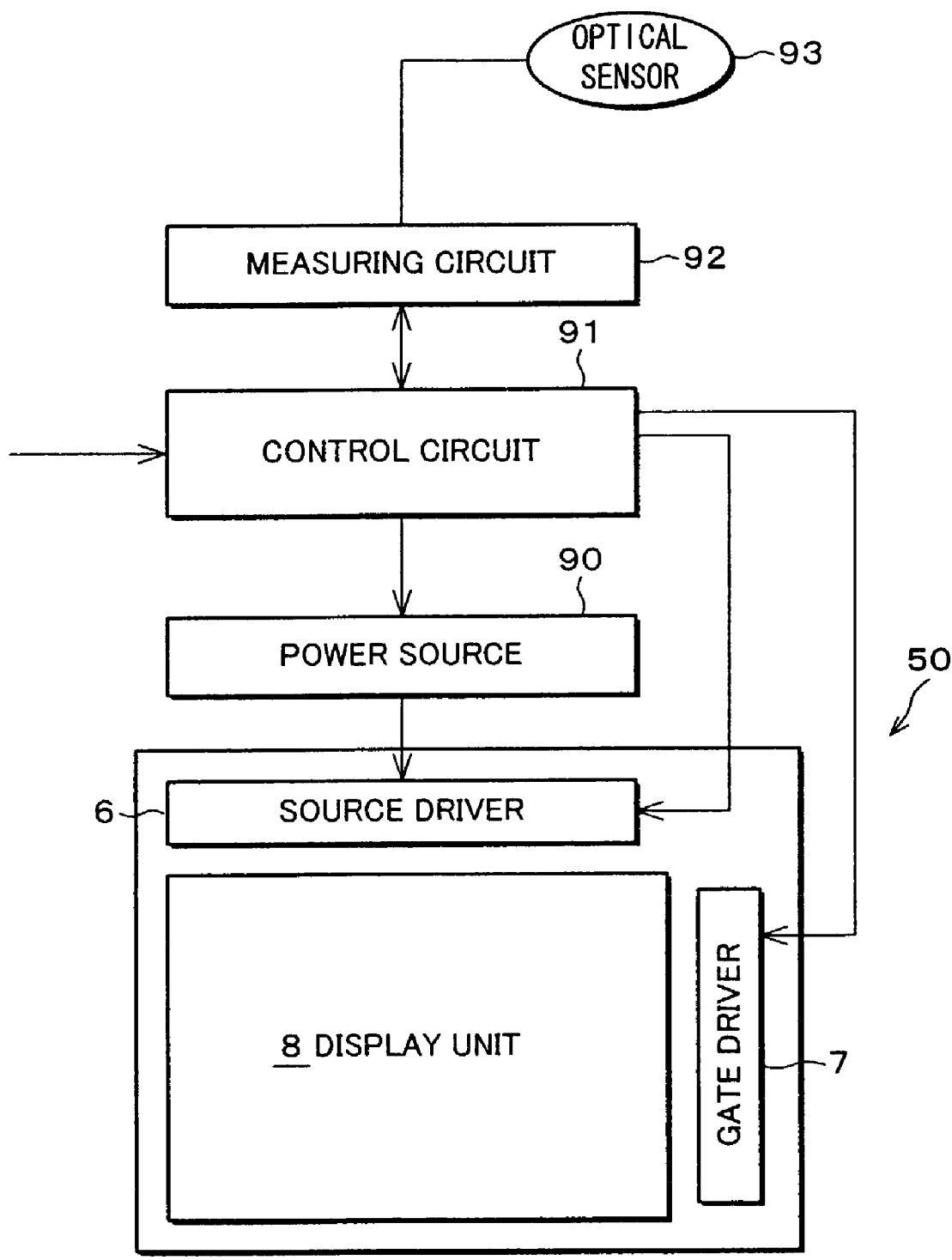
FIG. 20, showing still another embodiment of a display in accordance with the present invention, is a block diagram illustrating use of a light sensor.

Referring to FIG. 20, the following will describe another embodiment in accordance with the present invention. Here, for convenience, members of the present embodiment that have the same arrangement and function as members of embodiment 1, 2, or 3 above, and that are mentioned in that embodiment are indicated by the same reference numerals and description thereof is omitted. The description of various features of embodiments 1, 2, and 3 applies also to the present embodiment.

In the present embodiment, external light is detect by a light sensor, and the results are used to adjust the luminance of an organic EL element 60 and an organic EL element 70.

Specifically, as shown in FIG. 20, the display 50 includes a control circuit 91 and a power supply circuit 92 as display control means. Upon receiving an image display signal, the control circuit 91 causes a source driver 6 and a gate driver 7 to generate respective signals via the power supply section 90. In the present embodiment, the control circuit 91 is connected to the light sensor 93 as external light detecting means via a measuring circuit 23.

The control circuit 91 controls the light sensor 93 and external light measurement. The light sensor 93 is constituted by, for example, phototransistor and other parts.

Further, in the present embodiment, because the organic EL element 60 or the organic EL element 70 is employed as a light-emitting element, and the liquid crystal display elements 20 are employed as light-modulating elements, the power supply section 90 plays the role of a steady-state current or voltage power supply driving the organic EL element 60 or the organic EL element 70 which requires higher driving capability than liquid crystal. Therefore, the power supply section 90 is not used only for liquid crystal display.

Now, control by means of the light sensor 93 and that of external light measurement will be described. First of all, in a dark environment, the control circuit 91 recognizes it by means of a signal from the light sensor 93 and generates a data line signal and a gate line signal to drive the organic EL element 60 or the organic EL element 70. Under this circumstance, to produce tone representation of the organic EL element 60 or the organic EL element 70 by the power supply section 90 side, the control circuit 91 supplies a signal to the power supply section 90.

Meanwhile, in a bright environment, the control circuit 91 generates a data line signal and a gate line signal to drive the reflective-type, liquid crystal display elements 20 based on a signal from the light sensor 93. Here, the power supply section 90 is unrelated as mentioned earlier, the signal supplied by the control circuit 91 to directly control power supply is not necessary.

To cause both the organic EL element 60 or the organic EL element 70 and the liquid crystal display elements 20 to produce a display, the control circuit 91 supplies a source signal for each display. This enables luminance adjustment for each display and selection of an optimal screen state in accordance with environment conditions.

The measurement of external light by the light sensor 93 in this manner enables not only automatic switching between the light emission by the organic EL element 60 or the organic EL element 70 and the reflection display production by the liquid crystal display elements 20, but also selection of an optimal screen state in accordance with environmental conditions.

As described in the foregoing, in the display 50 of the present embodiment, the control circuit 91 selects either one or both of the organic EL element 60 or the organic EL element 70 and the liquid crystal display element 20 for display, based on the detection of external light by the light sensor 93.

Therefore, either or both of the organic EL element 60, 70 and the liquid crystal display element 20 is/are automatically selected for display, depending on ambient brightness, achieving an optimal screen state.

Embodiment 5

Referring to FIGS. 21-26, the following will describe another embodiment in accordance with the present invention. Here, for convenience, members of the present embodiment that have the same arrangement and function as members of embodiment 1, 2, 3 or 4 above, and that are mentioned in that embodiment are indicated by the same reference numerals and description thereof is omitted. The description of various features of embodiments 1-4 applies also to the present embodiment.

Figure 21:
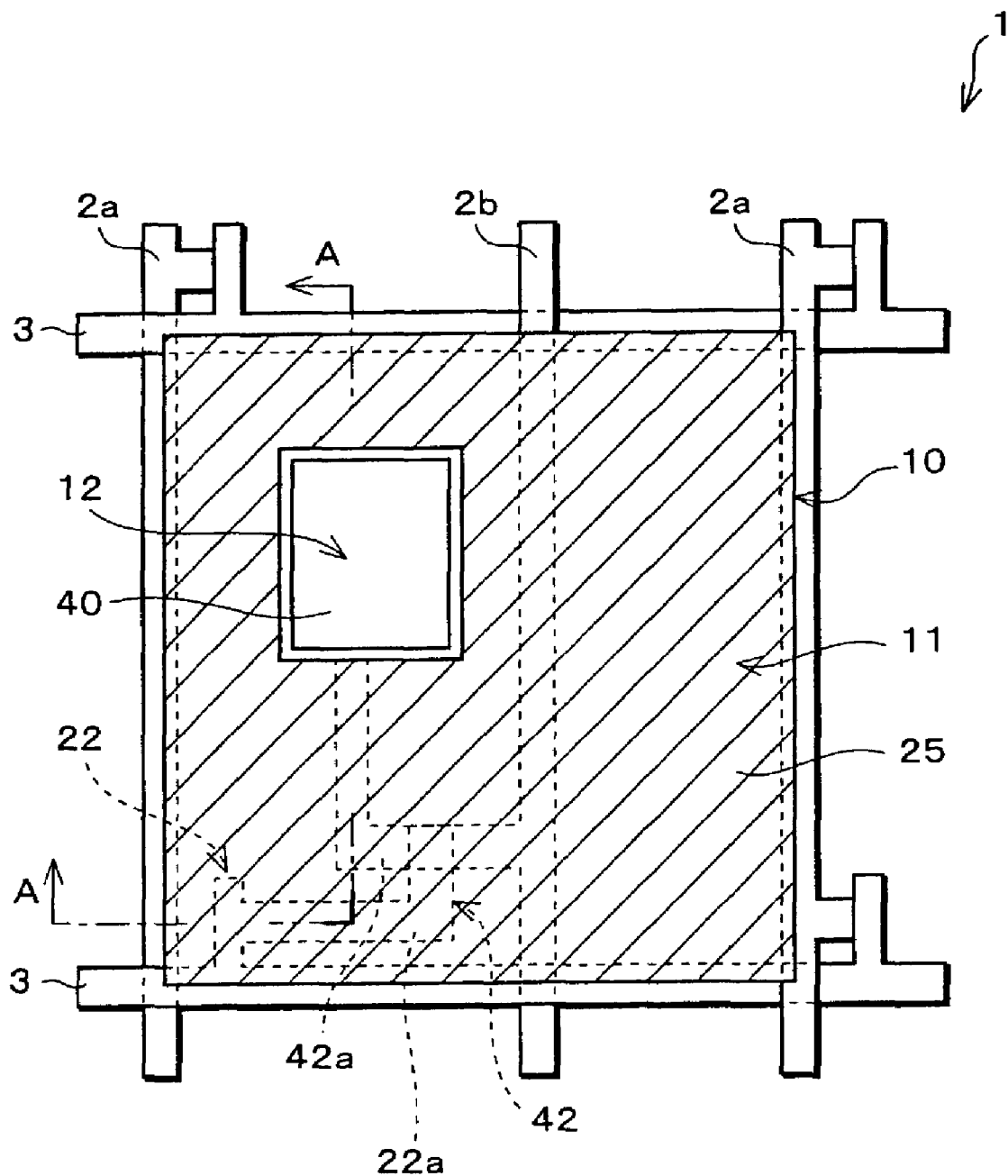
FIG. 21, showing yet another embodiment of a display in accordance with the present invention, is a plan view illustrating a part of a display corresponding to a pixel.

Referring to FIG. 21, a display 1 of the present embodiment includes display pixels 10 arranged in a matrix as display areas from vertically-extending resource bus lines 2a as data signal lines and horizontal-extending gate bus lines 3 as scanning signal lines.

Figure 22:
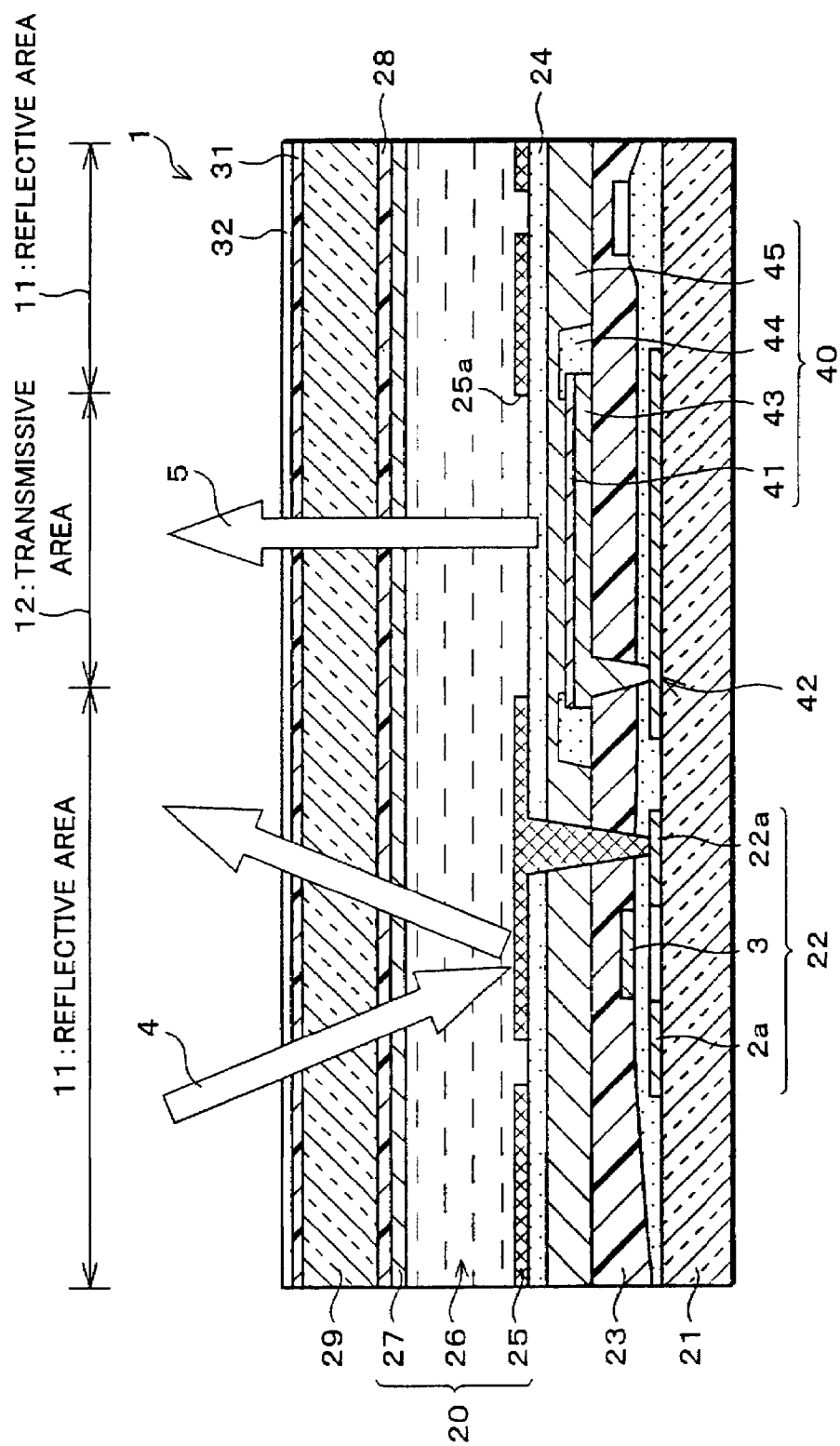
FIG. 22 is a cross-sectional view along line A-A in FIG. 21, illustrating a part of the display corresponding to a pixel.

In the present embodiment, each display pixel 10 is divided into a reflective area 11 as a first display area which is reflective and a transmissive area 12 as a second display area which is transmissive. Specifically, as shown in FIG. 22, in each reflective area 11 there is formed a pixel electrode 25 from a metal, such as aluminum (Al), composing a reflective-type, liquid crystal display element 20 as a light-modulating element. This enables the pixel electrode 25 to reflect external light 4.

Meanwhile, as shown in the same figure, each pixel electrode 25 has a rectangular hole 25a formed at its center. The hole 25a is the transmissive area 12. An organic EL element 40 as a light-emitting element is provided below the hole 25a in each pixel electrode 25, i.e. behind each pixel electrode 25, with a transparent insulating layer 24 intervening between them. The organic EL element 40 directly produces a display by means of a display light 5 which emits light on its own. In other words, in the present embodiment, because the organic EL element 40 directly produces a display unlike a conventional organic EL element used as a backlight or a frontlight, it can be safely said that the display 1 of the present embodiment is a reflective-type liquid crystal display constituted by liquid crystal display elements 20 and an organic EL display constituted by organic EL elements 40 combined in a single entity.

Under this circumstance, the organic EL element 40 may have a substantially equal to, or smaller area than, the transmissive area 12. This is because the organic EL element 40 does not have to be formed covering the entire transmissive area 12, but only has to be formed to have a necessary area in accordance with required screen luminance. The organic EL element 40 therefore consumes less power if the organic EL element 40 is smaller in area than the transmissive area 12. "The organic EL element 40 has a substantially equal area to the transmissive area 12" does not rule out situations where the organic EL element 40 has a slightly larger area than the transmissive area 12. This is because the organic EL element 40, if slightly larger in area than the transmissive area 12, will not harm light projection efficiency of the organic EL element 40. Further, the organic EL element 40, if slightly larger in area than the transmissive area 12, does not pose any problem because the pixel electrode 25 serves as a black matrix.

Still referring to the same figure, the display 1 includes TFT elements 22 for liquid crystal on an insulating substrate 21 as a first substrate made of, for example, glass. Now referring to FIG. 21, each TFT element 22 for liquid crystal is connected to a gate bus line 3 and a resource bus line 2a and functions as a switching element in applying a voltage to the pixel electrode 25 via a drain electrode 22a.

Referring to the same figure, the drain electrode 22a of the liquid crystal display element 20 is connected to the gate electrode 42a of a TFT element 42 for an EL element for driving the organic EL element 40. Further, to the source of the TFT element 42 for an EL element is connected a current supply line 2b, so that when the TFT element 42 for an EL element is turned on, the presence of supply voltage Vdd (will be detailed later) induces a drive current flowing to the organic EL layer 41 in the organic EL element 40 through the current supply line 2b and the drain electrode 42a of the TFT element 42 for an EL element, causing the organic EL layer 41 to emit light. Note that the organic EL layer 41 is constituted by the electron transport layer 62, the light-emitting layer 63, and the hole transport layer 64 in the organic EL element 60 having the light-emitting layer 63 made of the aforementioned low-molecular-type EL material and only by the light-emitting layer 73 in the organic EL element 70 having the light-emitting layer 73 made of the aforementioned polymer EL material.

Now referring to FIG. 21 and FIG. 22, the following will describe a configuration of the display 1 in greater detail, as well as a method of manufacturing.

First of all, referring to FIG. 21, the TFT elements 22 for liquid crystal were formed on the insulating substrate 21 made of glass or other material. The TFT elements 42 for an EL element were formed concurrently. Next, a planarizing film 23 of a photosensitive acrylic resin was formed with a thickness of, for example, 2 µm, and reflective anodes 43 constituting the organic EL element 40 were formed thereafter with a thickness of 2000 Å from chromium (Cr) by sputtering. An insulating layer 44 was then formed by sputtering silicon dioxide ($SiO_2$) to a thickness of 2000 Å and etching it in a predefined pattern.

Subsequently, the organic EL layer 41 which was a light-emitting layer was formed by vapor depositing red, green, and blue light-emitting materials selectively at positions corresponding to the display pixels 10 using a mask. Next, to efficiently inject electrons into the organic EL layer 41, a magnesium-silver alloy (not shown) was vapor deposited to a thickness of 100 Å and an indium zinc oxide (IZO) was sputtered to a thickness of 2000 Å to form transparent cathodes 45. Next, tantalum pentoxide ($Ta_2O_5$) was sputtered to a thickness of 7000 Å to form the transparent insulating layer 24. The reflective pixel electrodes 25 were then formed of aluminum (Al) to drive the liquid crystal layer 26 constituting the liquid crystal display element 20.

Meanwhile, on the other insulating substrate 29 as the second, transparent substrate made of, for example, glass were there formed a color filter layer 28 and opposite electrodes 27 in this order. The latter were made of indium tin oxide (ITO).

Next, an alignment film (not shown; commercially available as "JALS204" from Japan Synthetic Rubber Co., Ltd.) was spin coated and baked which would align liquid crystal molecules vertical to the insulating substrate 29.

Next, ultraviolet light was projected onto a forming substrate on the insulating substrate 21 side through a mask (not shown) having such holes as to selectively expose those areas where no organic EL element 40 was formed. Ultraviolet light was also projected onto a forming substrate on the insulating substrate 29 side, selectively to those areas which would oppose the organic EL elements 40 when the insulating substrate 29 was combined with the insulating substrate 21. These two forming substrates were rubbed to subject the alignment films (not shown) to uniaxial aligning and combined with sealing resin interposed in between, and a liquid crystal material with a positive dielectric anisotropy and Δn=0.06 (available from Merck & Co., Inc.) was injected to form the liquid crystal display elements 20. A retardation plate 31 and a polarizer 32 were attached onto the surface of the insulating substrate 29 in the order, which completed the manufacture of the display 1. The retardation plate 31 used here caused a ¼-wavelength phase shift for the wavelength of 550 nm.

An observation of the display 1 thus fabricated under external light 4 in the absence of voltage found that those parts located above the organic EL elements 40 appeared black, whereas the other parts, with no underlying organic EL element 40, appeared white. The phenomenon was due to liquid crystal molecules aligning parallel to the insulating substrate 21 and the insulating substrate 29 where ultraviolet light projection had cut the functional groups in the alignment film which otherwise would have imparted a vertical aligning property to the film.

Consequently, the liquid crystal layer 26 operated in normally white mode, appearing white in the total absence of applied voltage and gradually turned black when a voltage was applied and increased and reflectance decreased as a result.

Now, the following will describe an example of a drive circuit for driving the display 1 configured as in the foregoing.

Figure 23:
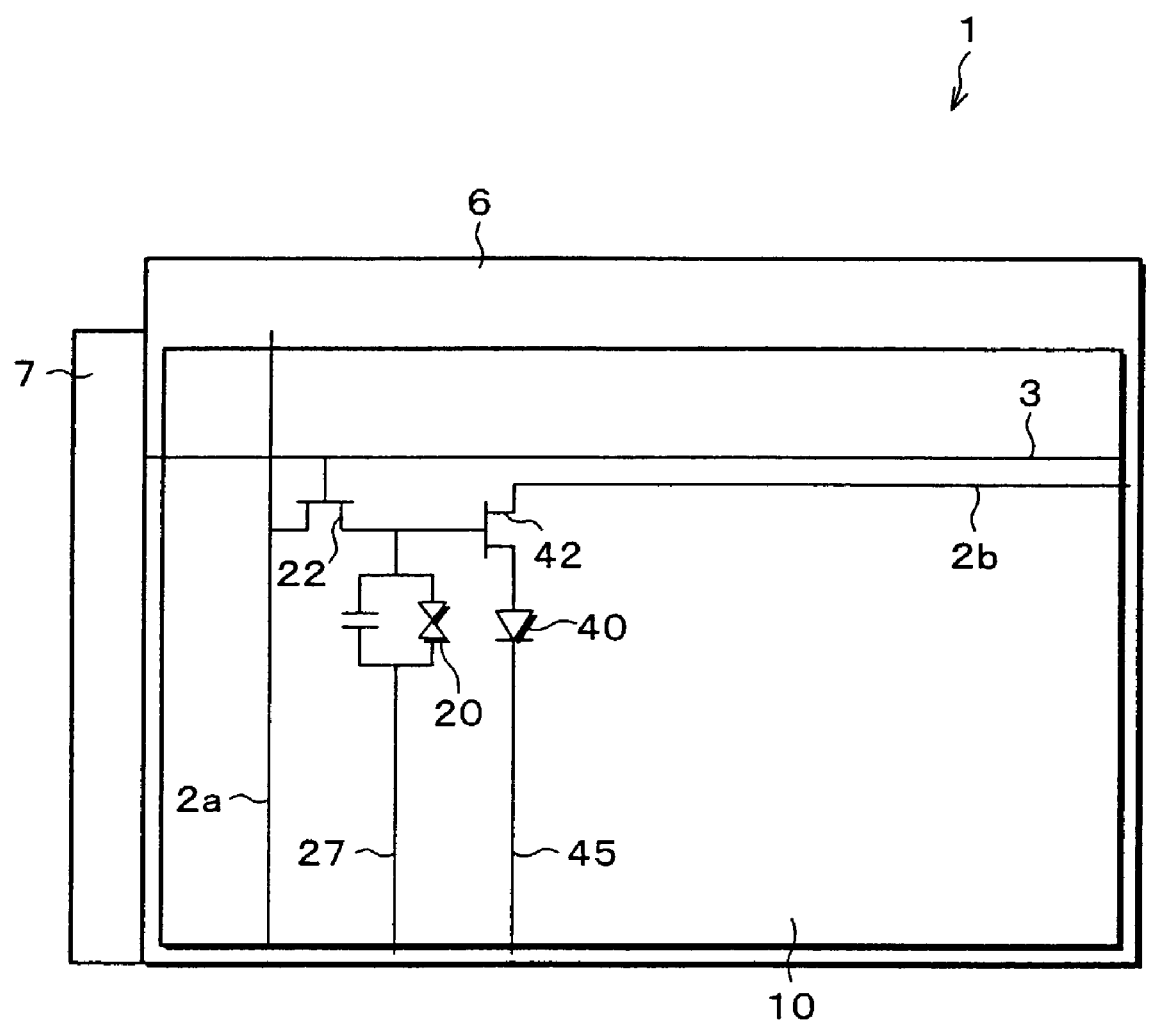
FIG. 23 is a configuration diagram showing the entire display.

Referring to FIG. 23, in the display 1, a source driver 6 for sequentially feeding a data line signal is connected to resource bus lines 2a, and the gate driver 7 for selecting display pixels 10 is connected to the gate bus lines 3.

Further, in each display pixel 10, display circuitry include a liquid crystal display element 20 which is a light-modulating element and an organic EL element 40 which is a light-emitting element.

The liquid crystal display elements 20 and the organic EL elements 40 are positioned in the display areas of the display 1 to form a matrix. The opposite electrode 27 of the liquid crystal display element 20, the current supply line 2b of the TFT element 42 for an EL element, and the cathode 45 of the organic EL element 40 are commonly connected for each liquid crystal display element 20 and organic EL element 40. In other words, in this drive circuit, to actively drive the display pixels 10 as display areas arranged in a matrix, the gate bus lines 3 which are signal lines and scanning signal lines and the resource bus lines 2a which are signal lines and data signal lines are commonly shared regarding the driving of the liquid crystal display elements 20 and the organic EL elements 40. The present invention is however not limited to this and may be applied to a simple matrix.

As a result of this, the method of driving described in embodiment 1 in reference to FIG. 9, FIG. 10, and FIG. 11 is employed to drive the display 1. The method of driving is as described and detailed description thereof is omitted.

Figure 24:
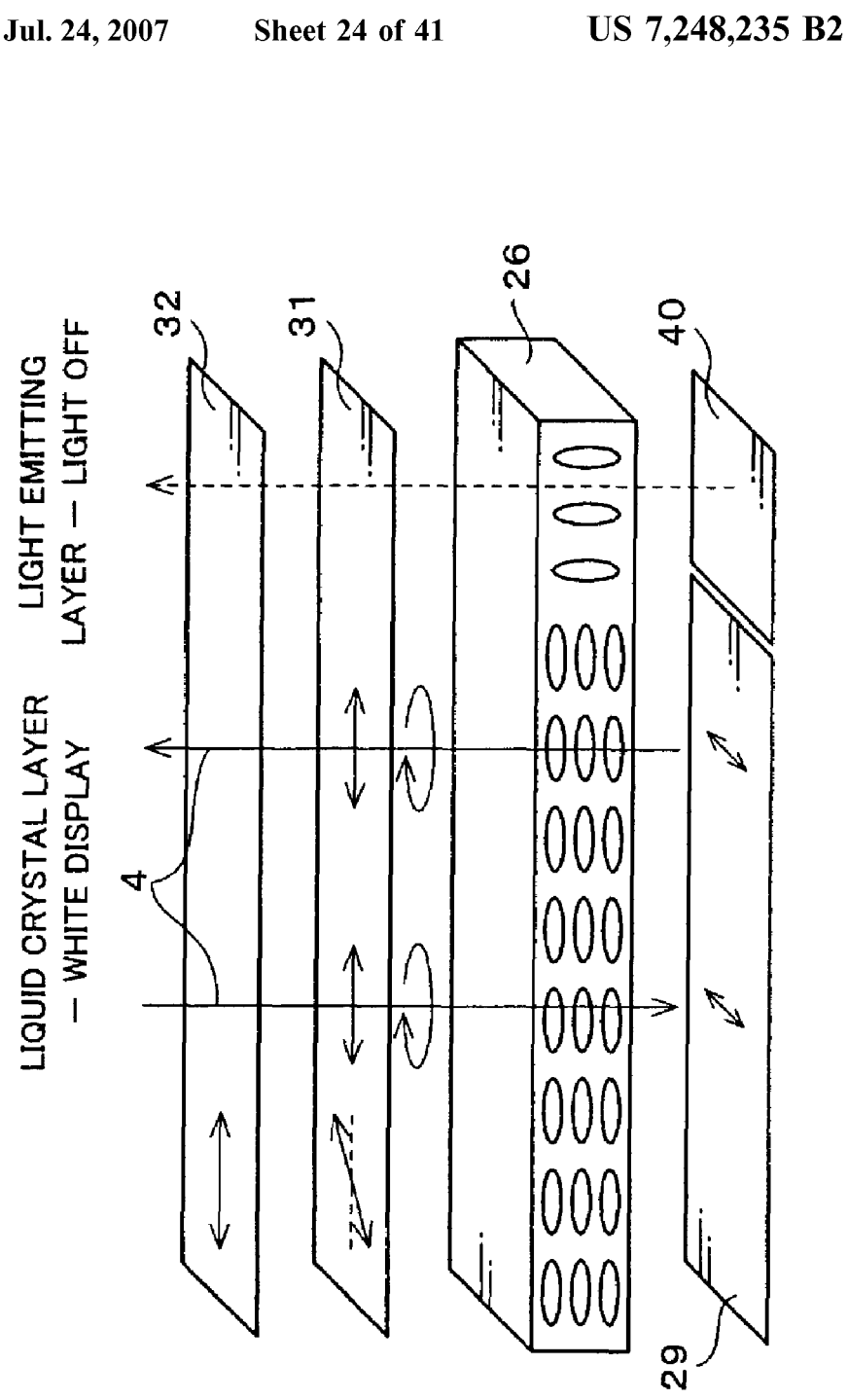
FIG. 24 is an explanatory drawing illustrating screen states of a liquid crystal display element and an organic EL element of the display operating in normally white mode, with a drain voltage Vd less than a liquid crystal's threshold voltage Vth(LC).
Figure 25:
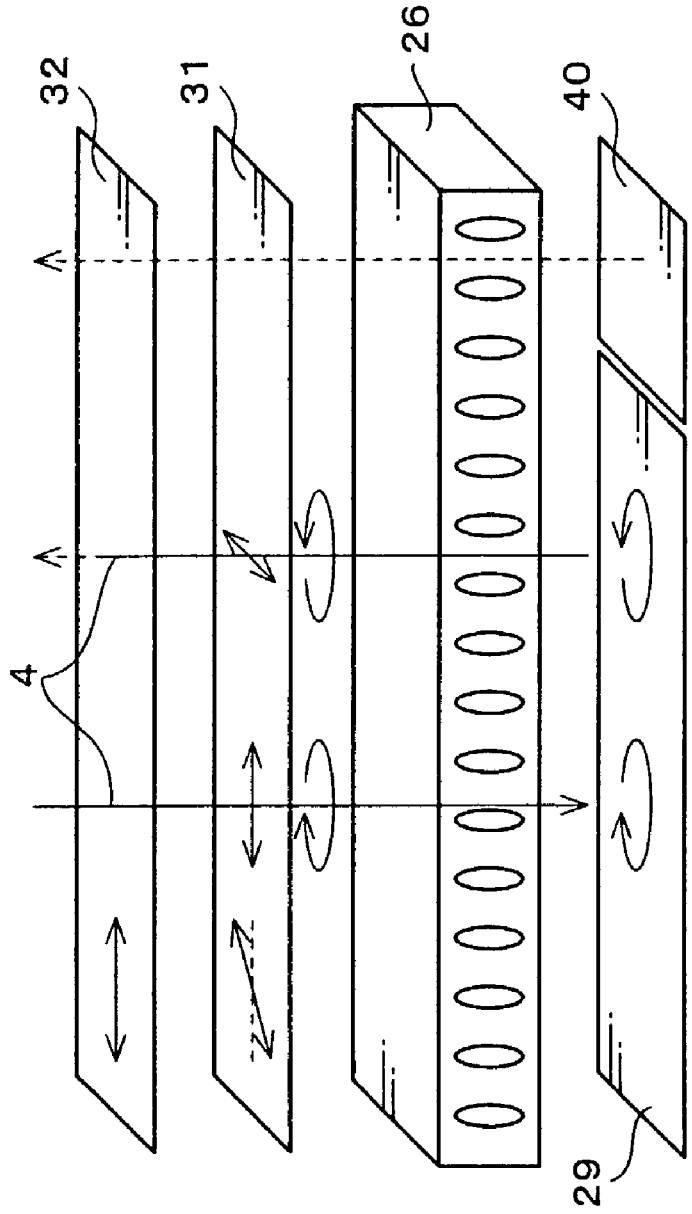
FIG. 25 is an explanatory drawing illustrating screen states of a liquid crystal display element and an organic EL element of the display operating in normally white mode, with the drain voltage Vd greater than a liquid crystal's threshold voltage Vth(LC), but less than an EL threshold voltage Vth(OLED).
Figure 26:
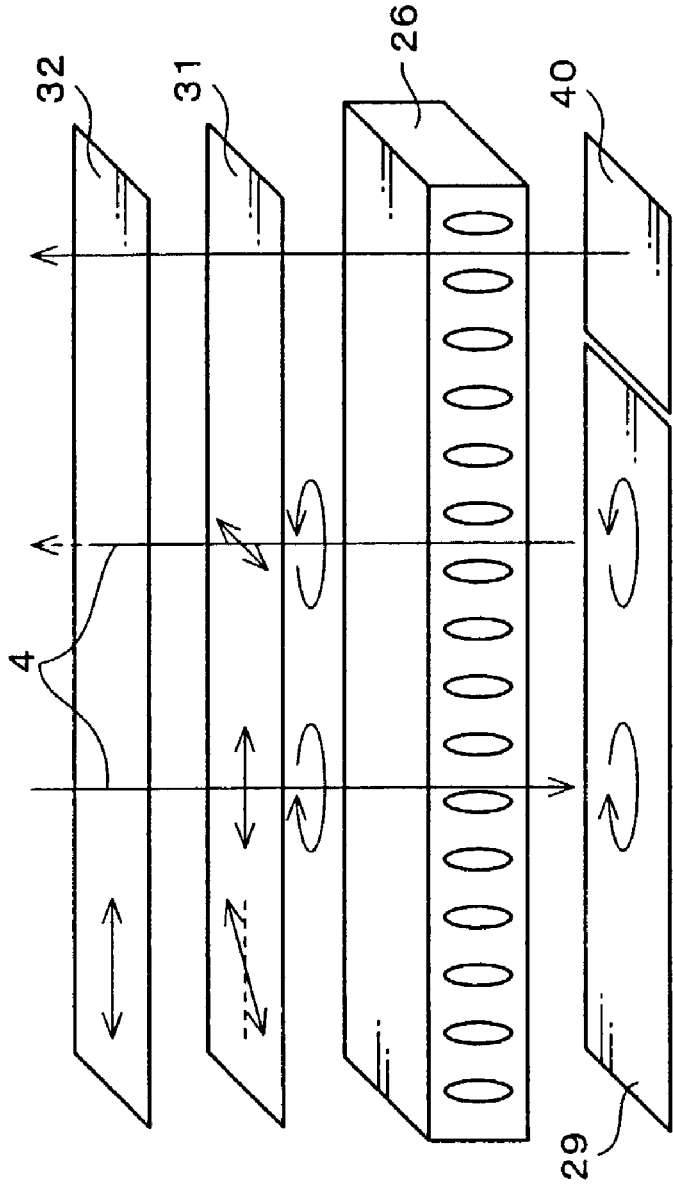
FIG. 26 is an explanatory drawing illustrating screen states of a liquid crystal display element and an organic EL element of the display operating in normally white mode, with the drain voltage Vd greater than a liquid crystal's threshold voltage Vth(LC) and also than an EL threshold voltage Vth(OLED).

The aforementioned display operations will be described in detail in reference to FIG. 24 to FIG. 26 depicting states of light in such conditions that the liquid crystal layer 26 exhibits a maximum reflectance, that is, the liquid crystal layer 26 is in the absence of voltage and has a birefringence of $\lambda/4$.

First of all, let us suppose that the display 1 is being used under the external light 4 and that either no voltage is applied through the data line signal Vs or the drain voltage Vd of the TFT element 22 for liquid crystal is less than the liquid crystal's threshold voltage Vth(LC). The external light 4 becomes circularly polarized as it passes through the polarizer 32 and the retardation plate 31 and then enters the liquid crystal layer 26 as shown in FIG. 24. Since the liquid crystal layer 26 introduces a $\lambda/4$ phase shift, the light contains a $\lambda/2$ phase difference when it reaches the reflective pixel electrode 25 and is reflected as linear polarized light. After the reflection, the external light 4 takes the same path, but in the opposite direction, thereby becoming linear polarized and passing through the polarizer 32. The display 1 hence appears white. Since the drain voltage Vd of the TFT element 22 for liquid crystal is below the EL threshold voltage Vth(OLED) at which the TFT element 42 for an EL element operates, the organic EL element 40 receives no current supply and emits no light.

Now, it is still supposed that the display 1 is being used under the external light 4, but that the applied drain voltage Vd of the TFT element 22 for liquid crystal is above the liquid crystal's threshold voltage Vth(LC). Under these conditions, the liquid crystal display element 20 appears black. A detailed description follows.

Referring to FIG. 25, the liquid crystal layer 26 has almost no birefringence, and the external light 4 is preserving, for example, right circular polarization when it reaches the reflective pixel electrode 25, but reversed, that is, for example, left circularly polarized when reflected. The reflection of the external light 4, after passing through the retardation plate 31, is therefore linearly polarized at a right angle to a transmission axis of the polarizer 32 and cannot travel through the polarizer 32. The display 1 hence appears black.

Since the drain voltage Vd of the TFT element 22 for liquid crystal is below the EL threshold voltage Vth(OLED) at which the TFT element 42 for an EL element operates, the organic EL element 40 receives no current supply and still emits no light.

Now, a description will be given supposing that the external light 4 is of a low intensity and that the organic EL element 40 emits light.

In such an event, as shown in FIG. 26, the drain voltage Vd of the TFT element 22 for liquid crystal is set to a value greater than or equal to the EL threshold voltage Vth(OLED) at which the TFT element 42 for an EL element operates, causing the organic EL element 40 to receive current and emit light. Under this circumstance, as shown in FIG. 11, the drain voltage Vd is sufficiently high and the liquid crystal layer 26 appears black, producing no effects on the light emission by the organic EL element 40.

Under this circumstance, in the present embodiment, the anode 43 constituting the organic EL element 40 is made of reflective metal and reflects light invariably irrespective of the display signal. In incorporating an organic EL display in products like mobile telephones which are frequently used outdoors, a circular polarizer needs to be attached on the side of the viewer; however, in the present embodiment, as shown in FIG. 26, the polarizer 32 and the ¼-wavelength phase-shift-producing retardation plate 31, which are both essential for the liquid crystal layer 26 to effect a display, reduce the reflection of the external light 4 down to almost zero. Further, the liquid crystal layer 26 is placed between the organic EL element 40 and the polarizer 32; however, regarding the liquid crystal layer 26 in this part, electrodes like the opposite electrodes 27 are provided only on the insulating substrate 29 side. The liquid crystal layer 26 is therefore invariably in OFF state and does not negatively affect the inhibition of reflection of the external light 4, irrespective of applied voltage.

In the present embodiment, because the transparent insulating layer 24 is formed to cover the entire organic EL element 40, the liquid crystal in the liquid crystal layer 26 never penetrates into the organic EL element 40 and thereby improves the reliability of the organic EL element 40.

In this manner, in the display 1 of the present embodiment, each display pixel 10 is provided with the reflective area 11 made of a non-light-emitting display element in which the liquid crystal display element 20 reflects the external light 4 to effect a display and the transmissive area 12 made of a light-emitting display element in which the organic EL element 40 directly modulates to effect a display.

Therefore, similarly to the display 50 described in embodiments 1-4, efficiency improves in light usage of the organic EL element 40 and cuts the thickness of the display.

Further, no backlight, polarizer, or retardation plate on the back side are required, reducing the number of components. Consequently, various costs, including not only material costs, but also those covering assembling and inspection of components, are reduced, and the overall manufacturing cost of the display is reduced.

Further, in displays 1 of a pixel dividing scheme of the present embodiment, the ratio of the reflective area 11 and the transmissive area 12 can be set to an arbitrary value to some extent. The configuration allows for reduction in power consumption.

Further, in the present embodiment, there are provided the insulating substrate 21 and the insulating substrate 29 opposite to each other, and the organic EL element 40 and the liquid crystal display element 20 are both placed between the insulating substrate 21 and the insulating substrate 29. In the transmissive area 12 are there sequentially stacked the organic EL element 40, the liquid crystal display element 20, and the liquid crystal layer 26 on the insulating substrate 21. Because, the liquid crystal display element 20 and the organic EL element 40 are both accommodated between the insulating substrate 21 and the insulating substrate 29, the thickness of the display 1 is surely reduced. Further, even when the liquid crystal layer 26 is stacked on the surface side of the organic EL element 40, since the organic EL element 40 is placed between the insulating substrate 21 and the insulating substrate 29, the display light of the organic EL element 40 is all emitted onto the transmissive area 12, which significantly increases light using efficiency.

Thus, a display 1 can be offered which allows for reduction in size and cost and delivers excellent visibility from outdoors to indoors.

Incidentally, the organic EL element 40 is not necessarily formed to cover the whole transmissive area 12, but can be formed only where necessary depending on required screen luminance. Regarding this point, in the display 1 of the present embodiment, the organic EL element 40 has an area less than or almost equal to the transmissive area 12. Power consumption of the organic EL element 40 may be further cut.

Further, in the display 1 of the present embodiment, the light-emitting element is constituted by the organic EL element 40. This makes it possible to accommodate the liquid crystal display elements 20 and the organic EL elements 40 between a pair of insulating substrates 21 and 29.

Further, with the current-drive-type organic EL element 40 used as the light-emitting element and due to the proportional relationship between the power consumption of the light-emitting element and the light-emitting area, the power consumption of the display 1 of the present embodiment is ⅕ that when the organic EL element 40 is used as the backlight. Therefore, power consumption can be surely reduced.

Further, in the display 1 of the present embodiment, the light-modulating element is the liquid crystal display element 20. Therefore, light can be easily directed into the hole 25a with higher light projection efficiency when the liquid crystal display element 20 and the organic EL element 40 are formed in one pixel; thus, a display 1 can be offered which allows for reduction in size and cost and delivers excellent visibility from outdoors to indoors.

Further, in the display 1 of the present embodiment, the organic EL element 40 and the liquid crystal display element 20 are driven sharing a common resource bus line 2a and a common gate bus line 3. This delivers a display 1 which allows for prevention of the drive circuit configuration for the organic EL element 40 and the liquid crystal display element 20 from being complex and sure reduction in thickness and component cost of the display 1.

Incidentally, in the present embodiment, when the organic EL element 40 is emitting light, for example, when a white display is being effected, if the liquid crystal display element 20 effects a white display, the contrast of one of the display pixel 10 drops.

Accordingly, in the present embodiment, the liquid crystal layer 26 of the liquid crystal display element 20 is a horizontal alignment mode in the reflective area 11 and a vertical alignment mode in the transmissive area 12. Therefore, the reflective area 11 appears white in a state that no voltage is applied to the liquid crystal display element 20 and black when voltage is applied to the liquid crystal display element 20 and resultant reflectance is zero.

Therefore, in the present embodiment, the periphery of the transmissive area 12 which is a display area of the organic EL element 40 appears black; thereby reduction in contrast due to the driving and resultant light emission of the organic EL element 40 can be prevented.

Further, if the transmissive area 12, in the liquid crystal layer 26 of the liquid crystal display element 20, where the organic EL element 40 effects a display is specified to horizontal alignment, since no pixel electrode 25 is formed for driving the liquid crystal display element 20, initial, parallel alignment is preserved. Therefore, when the display 1 is used under intense external light 4, especially, outdoors, the transmissive area 12 where it preserves horizontal alignment reflects more external light 4. This is because the external light 4 transmits through the liquid crystal display element 20 and reflects off the organic EL element 40.

Regarding this point, in the present embodiment, the liquid crystal layer 26 stacked on the organic EL element 40 is vertically aligned, and the liquid crystal layer 26 in the reflective area 11 is horizontally aligned. Therefore, when the organic EL element 40 emits light, but the liquid crystal display element 20 is not driven, contrast reduction and negative effects on display quality due to the overlapping of reflection of external light 4 in the transmissive area 12 can be prevented.

Further, in the present embodiment, the color filter layer 28 formed on the insulating substrate 29 was formed on the entire part opposite the reflective area 11 and the transmissive area 12; alternatives are possible. For example, no color filter layer 28 may not be formed on the part opposite the transmissive area 12, i.e., the area opposite the organic EL element 40. The configuration prevents the outgoing light from the organic EL layer 41 from being absorbed by the color filter layer 28, thereby achieving a brighter display. Further, normally, the organic EL layer 41 exhibits better color purity than the color filter layer 28, thereby achieving a brighter display. The present embodiment has discussed so far a display in which the liquid crystal display element 20 and the organic EL element 40 are combined; alternatives are available: for example, the organic EL element 40 may be replaced with the foregoing organic EL element 60, 70, or 80.

Embodiment 6

Figure 27:
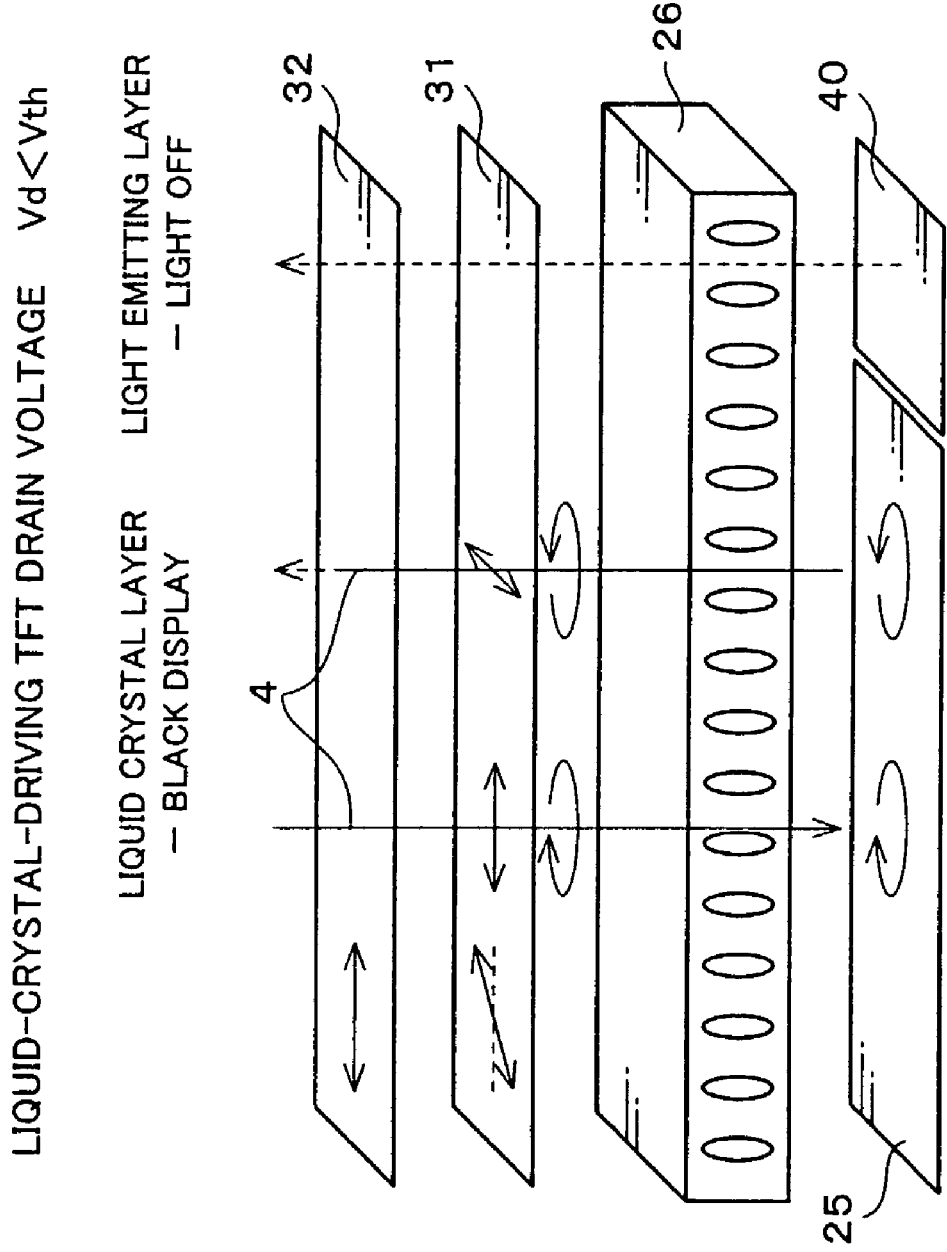
FIG. 27 is an explanatory drawing illustrating screen states of a liquid crystal display element and an organic EL element of the display operating in normally black mode, with the drain voltage Vd less than a common threshold voltage Vth.

Referring to FIGS. 27-29, the following will describe another embodiment in accordance with the present invention. Here, for convenience, members of the present embodiment that have the same arrangement and function as members of embodiment 1, 2, 3, 4, or 5 above, and that are mentioned in that embodiment are indicated by the same reference numerals and description thereof is omitted. The description of various features of embodiments 1-5 applies also to the present embodiment. In the present embodiment, the liquid crystal display element 20 and the organic EL element 40 are driven simultaneously. "Drive" here does not mean simply to apply voltage to the liquid crystal display element 20 or a state in which the organic EL element 40 is simply conducting current, but a state in which control is performed according to the information displayed by the voltage or current so that reflected light intensity and emitted light intensity from the light-emitting element are varied to effect a display.

In the present embodiment, in the manufacture of the display 1, the liquid crystal display element 20 is formed by the following procedures (see FIG. 22): an alignment film (not shown; commercially available as "JALS204" from Japan Synthetic Rubber Co., Ltd.) which has a property to align liquid crystal molecules vertical to the insulating substrate 29 is formed and rubbed to undergo an alignment process. Thereafter, two forming substrates, i.e., the forming substrate on the insulating substrate 29 side and the forming substrate on the insulating substrate 21 side, are combined with sealing resin (not shown) in between, and a liquid crystal material (commercially available as "MLC6608" from Merck & Co., Inc.) with a negative dielectric anisotropy is injected which as the liquid crystal layer 26. On the surface of the insulating substrate 29, the retardation plate 31 and the polarizer 32 are attached sequentially to complete the manufacture of the display 1. In the present embodiment, the retardation plate 31 used is again one which produces a retardation of ¼ wavelength at λ=550 nm.

The drive circuit of the present embodiment is different from that of embodiment 5. Specifically, in the present embodiment, the liquid crystal display element 20 and the organic EL element 40 can be independently driven.

Now, specific display operations of the display 1 configured as above will be discussed in reference to FIGS. 27-29.

First of all, referring to FIG. 27, the liquid crystal layer 26 operates in normally black mode, appearing black in the absence of voltage and, as shown in FIG. 28, and gradually turns white with increasing applied voltage and resultant, increasing reflectance, since as mentioned in the foregoing, the liquid crystal layer 26 is made of a liquid crystal material with negative dielectric anisotropy and the alignment film (not shown) with a vertically aligning effect are used.

In other words, when the display 1 is used under the external light 4, the external light 4 becomes circularly polarized as it passes through the polarizer 32 and the retardation plate 31, then and enters the liquid crystal layer 26 in the absence of voltage or when the drain voltage Vd is less than the common threshold voltage Vth (FIG. 27). When a drain voltage Vd less than the common threshold voltage Vth is applied to the liquid crystal layer 26 by means of the TFT element 22 for liquid crystal, since the liquid crystal layer 26 has a zero birefringence, the light is still maintaining, for example, right circular polarization upon hitting the reflective pixel electrode 25, but reverses in polarization, for example, becomes left circularly polarized, upon reflecting off the pixel electrode 25. The reflected light is therefore linear polarized at a right angle to the transmission axis of the polarizer 32 after passing through the retardation plate 31. Consequently, the reflection of the external light 4 cannot pass through the polarizer 32 and the device appears black. Therefore, as shown in FIG. 29(a), the liquid crystal display element 20 has near zero luminance. Further, under these conditions, as shown in FIG. 29(b), the organic EL element 40 is in OFF state under applied voltage less than the common threshold voltage Vth and emits no light with no current supplied to the organic EL layer 41, Next, referring to FIG. 28, it will be discussed how the liquid crystal layer 26 appears white in the presence of applied voltage. The figure demonstrates conditions of light with the liquid crystal layer 26 having a birefringence of λ/4 at which its reflectance is the greatest.

Still referring to FIG. 28, in the presence of an applied drain voltage Vd greater than or equal to the common threshold voltage Vth, the liquid crystal layer 26 cannot preserve a circularly polarized light state due to birefringence. The reflection of the external light 4 off the reflective pixel electrode 25 therefore passes through the polarizer 32 and as shown in FIG. 29(a), the luminance display of the liquid crystal display element 20 becomes white.

Under this circumstance, as shown in FIG. 28, because the TFT element 42 for an EL element is also in ON state, the organic EL element 40 turns to a light-emitting state as shown in FIG. 29(b) due to the current supply from the current supply lines 2b.

Under this circumstance, as shown in the FIG. 22, the anode 43 constituting the organic EL element 40 is made of a reflective metal and reflects light invariably irrespective of the display signal. In incorporating an organic EL display in products like mobile telephones which are frequently used outdoors, a circular polarizer needs to be attached on the side of the viewer; however, in the present embodiment, the polarizer 32 and the ¼-wavelength phase-shift-producing retardation plate 31, which are both essential for the liquid crystal layer 26 to effect a display, reduce the reflection of the external light 4 down to almost zero.

Further, the liquid crystal layer 26 is placed between the organic EL element 40 and the polarizer 32; however, regarding the liquid crystal layer 26 in the transmissive area 12 in this part, electrodes like the opposite electrodes 27 are provided only on the insulating substrate 29 side. The liquid crystal layer 26 is therefore invariably in OFF state, maintaining vertical aligning property, and does not negatively affect the inhibition of reflection of the external light 4, irrespective of applied voltage, as shown in FIGS. 27 and 28.

In the present embodiment, the liquid crystal layer 26 and the organic EL element 40 were driven simultaneously as an example. Alternatively, the liquid crystal layer 26 is used alone for display by blocking the current supply to the organic EL element 40 when the external light 4 is intense. Power consumption is hence saved.

Further, in the present embodiment, similarly to embodiment 5, because the transparent insulating layer 24 is formed to cover the entire organic EL element 40, the liquid crystal in the liquid crystal layer 26 never penetrates into the organic EL element 40 and thereby improves the reliability of the organic EL element 40.

In this manner, in the display 1 of the present embodiment, the organic EL element 40 and the liquid crystal display element 20 are independently driven, and therefore the organic EL element 40 and the liquid crystal display element 20 can be driven separately. To independently drive the organic EL element 40 and the liquid crystal display element 20, some configurations are possible: The organic EL element 40 and the liquid crystal display element 20 may share a common resource bus line 2a and gate bus line 3. Alternatively, each element has its own resource bus line 2a but they share a common gate bus line 3.

Further, in the display 1 of the present embodiment, the liquid crystal display element 20 is normally black. Therefore, if the organic EL element 40 is driven, but not the liquid crystal display element 20, in independently driving the liquid crystal display element 20 and the organic EL element 40, the area surrounding the transmissive area 12 which is a display area of the organic EL element 40 reflects no light, appearing black.

Therefore, reduction in contrast when only the organic EL element 40 is driven to emit light is prevented.

The present embodiment has the same configuration and operation as embodiment 1, except for the configuration that the liquid crystal display element 20 is normally black.

The present embodiment has discussed so far a display in which the liquid crystal display element 20 and the organic EL element 40 are combined; alternatives are available: for example, the organic EL element 40 may be replaced with the foregoing organic EL element 60, 70, or 80.

Embodiment 7

Figure 30:
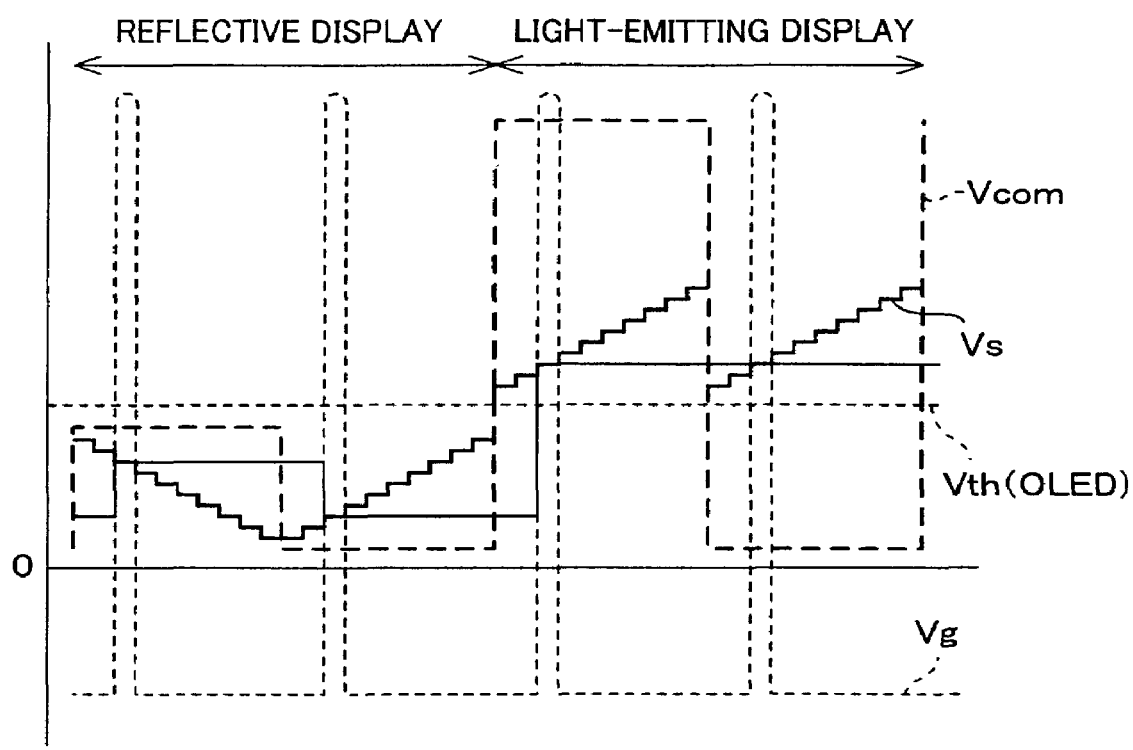
FIG. 30, showing another embodiment of a display in accordance with the present invention, is a waveform chart illustrating a signal during drive.
Figure 31:
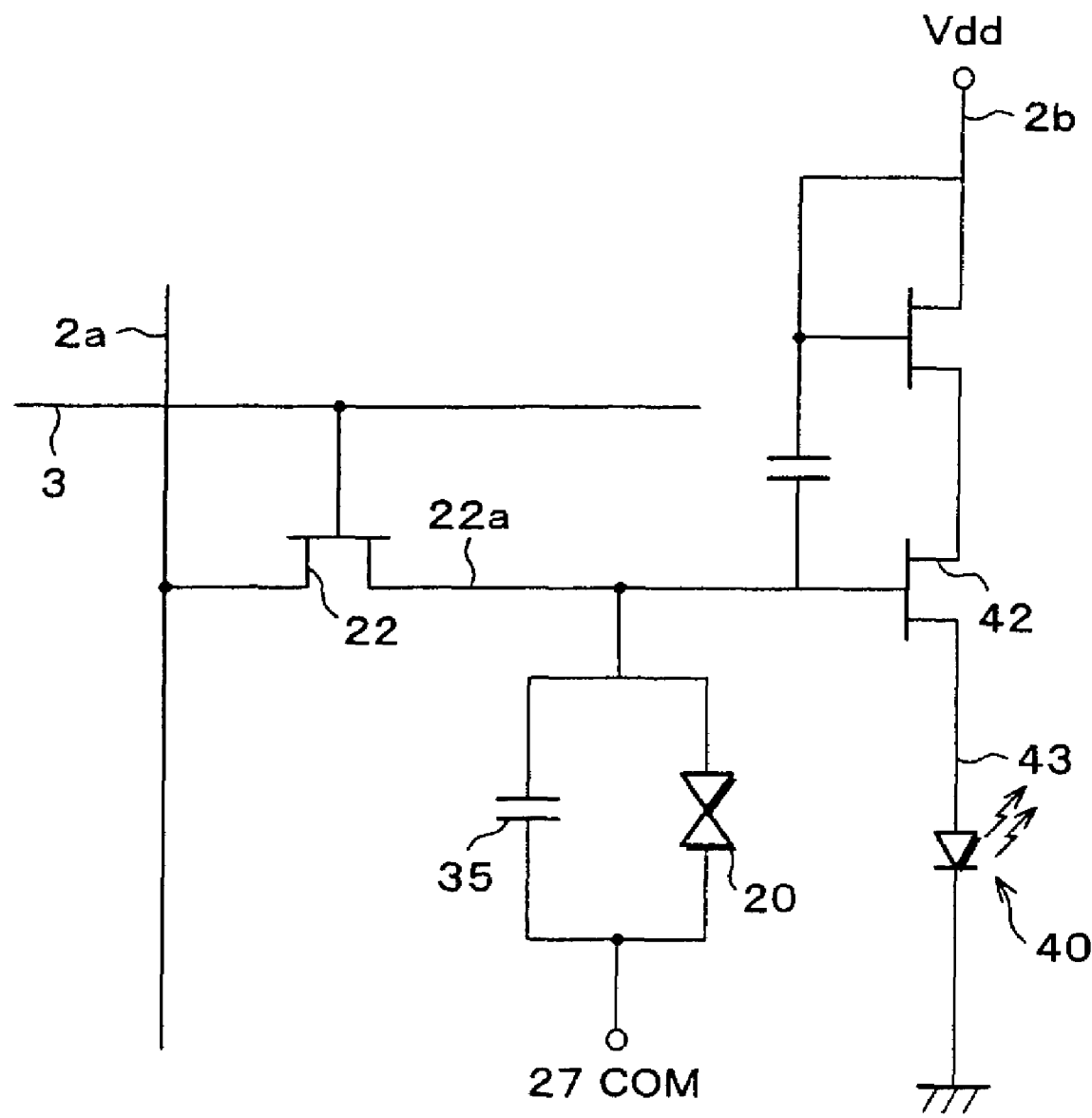
FIG. 31 is an explanatory drawing illustrating another configuration of voltage-current conversion means.

Referring to FIGS. 30, 31, the following will describe another embodiment in accordance with the present invention. Here, for convenience, members of the present embodiment that have the same arrangement and function as members of embodiment 1, 2, 3, 4, 5, or 6 above, and that are mentioned in that embodiment are indicated by the same reference numerals and description thereof is omitted. The description of various features of embodiments 1-6 applies also to the present embodiment.

As mentioned earlier, the liquid crystal display and the organic EL display are both thin and lightweight. Under sufficient lighting, the reflective-type liquid crystal display is advantageous in terms of power consumption; under poor lighting, the organic EL display is advantageous in terms of light using efficiency and shape. Forming a liquid crystal display element and an organic EL display element on a single substrate may offer a viable solution to supplement each element's disadvantages and achieve an optimal display in various environments.

Nevertheless, simply forming a liquid crystal display element and an organic EL display element on a single substrate in the display 1 makes wiring and drive circuits in the substrate too complex, entailing low yields and high costs in manufacture.

Accordingly, the display 1 takes the configuration described in embodiment 5 in reference to FIG. 23 in which a gate bus line 3 which is a signal line and scanning signal line and a resource bus line 2a which is a signal line and data signal line are shared with respect to the driving of the liquid crystal display element 20 and the organic EL element 40, so as to solve the problems.

In the present embodiment, a method of driving using a drive circuit of the display 1 will be explained in detail.

As shown in FIG. 30, a scanning line signal Vg from the gate bus line 3 increases voltage when selected, so as to turn the TFT element 22 for liquid crystal to ON state, and decreases voltage when not selected, so as to turn the TFT element 22 for liquid crystal to OFF state. A data line signal Vs from the resource bus line 2a reverse drives with respect to a COM signal Vcom in a case of reflective-type display, so as to adjust the amount of reflected light according to a signal of a differential from a COM signal Vcom for display.

Under this circumstance, the data line signal Vs from the resource bus line 2a is not above the EL threshold voltage Vth(OLED) for the TFT element 42 for an EL element and the organic EL element 40 therefore conducts no current; no light-emitting display is effected. Meanwhile, when the data line signal Vs from the resource bus line 2a is above the EL threshold voltage Vth(OLED) for the TFT element 42 for an EL element, the organic EL element 40 conducts current, effecting light-emitting display.

In light-emitting-type display, since a light-emission amount is controlled according to a signal value with respect to GND, the data line signal Vs from the resource bus line 2a does not reverse drive.

Further, in the present embodiment, the liquid crystal display element 20 utilizes a normally-white-type liquid crystal. Therefore, a large differential between the COM signal Vcom and the data line signal Vs from the resource bus line 2a results in a dark display. The reflective-type display portion is capable of light-emitting-type display without reflecting the external light 4.

In the present embodiment, to prevent the liquid crystal display element 20 from degradation, even when a light-emitting display is being effected, the COM signal Vcom which serves as the opposite electrode 27 AC-drives the liquid crystal display element 20.

In the present embodiment, a single TFT element 42 for an EL element is configured as voltage current conversion means. Alternatives are possible. In other words, as shown in FIG. 31, to curb surface irregularities of the display 1, two or more elements may do; a configuration will do which controls the threshold value of the operation voltage and the light-emission amount according to the data line signal Vs from the resource bus line 2a.

As detailed in the foregoing, in the present embodiment, the resource bus lines 2a and the gate bus lines 3 for driving the display pixels 10 arranged to form a matrix using the liquid crystal display elements 20 and the organic EL elements 40 are shared.

Further, in the display 1 of the present embodiment, the organic EL elements 40 can be driven by applying a drive signal to the resource bus lines 2a and the gate bus lines 3 of the liquid crystal display elements 20. Therefore, the organic EL elements 40 can be driven using the resource bus lines 2a and the gate bus lines 3 for driving the liquid crystal display elements 20. This amounts to sharing the drivers, such as the source driver 6 and the gate driver 7. Thus, the liquid crystal display elements 20 and the organic EL elements 40 operate for display without additional resource bus lines 2a or gate bus lines 3.

Note that in the present embodiment, the liquid crystal display elements 20 are normally white. This means that when no voltage is applied to the liquid crystal display elements 20, the reflective area 11 appears white and that when voltage is applied to the liquid crystal display elements 20, the reflective area 11 appears black with resultant zero reflectance. The greater the voltage applied from the resource bus lines 2a to the liquid crystal display elements 20, the deeper the black display appears. Therefore, when the organic EL elements 40 are to be driven, as mentioned in the foregoing, the liquid crystal display elements 20 are being driven and effecting a black display.

As a result of this, the areas surrounding the transmissive areas 12 which are display areas of the organic EL elements 40 appear black; thereby, reduction in contrast due to the driving and resultant light emission of the organic EL elements 40 can be prevented.

Further, in the display 1 of the present embodiment, each light-modulating element is made of a liquid crystal display element 20. Consequently, fabricating a liquid crystal display element 20 and an organic EL element 40 in each display pixel 10 makes it possible to offer a display 1 which incorporates the advantages of the two elements: low power consumption of the liquid crystal display element 20 and high light using efficiency of the organic EL element 40.

Under this circumstance, given the properties of the TFT elements 22 for liquid crystal, the liquid crystal display elements 20 need to be reverse driven with respect to the potential of the opposite electrodes 27, i.e., AC-driven. Meanwhile, the organic EL elements 40, as mentioned in the foregoing, are sufficiently non-reverse driven by current, i.e., DC-driven. Regarding this point, the display 1 of the present embodiment includes pixel electrodes 25 with external light reflecting properties and opposite electrodes 27 provided on the opposite substrate to oppose the pixel electrodes 25 so as to occupy the whole surfaces of the display pixels 10. Further, the display 1 is reverse driven with respect to the potential of the opposite electrodes 27 when the liquid crystal display elements 20 are to effect a display, and non-reverse driven with respect to the potential of the cathodes 45, i.e., the GND potential when the organic EL elements 40 are to effect a display.

Therefore, when the liquid crystal display elements 20 are used as the light-modulating elements, the liquid crystal display elements 20 and the organic EL elements 40 are surely and suitably driven.

Further, in the display 1 of the present embodiment, the organic EL elements 40 are placed behind the pixel electrodes 25 having external light reflecting properties. When the organic EL elements 40 emits light toward the front, only the transmissive areas 12 effect a display and the reflective areas 11 in which the pixel electrode 25 are positioned do not transmit light.

Therefore, when the organic EL elements 40 are to be driven, the pixel electrodes 25 of the liquid crystal display elements 20 serve as a black matrix, which allows maintaining the contrast of the organic EL elements 40.

The present embodiment described a drive circuit for the organic EL elements 40 placed behind the pixel electrodes 25; however, alternatives are possible. The drive circuit described in the present embodiment is applicable to the organic EL elements 40 placed in the same layer as the liquid crystal layer 26 described in embodiments 1-4.

The present embodiment has discussed so far a display in which the liquid crystal display element 20 and the organic EL element 40 are combined; alternatives are available: for example, the organic EL element 40 may be replaced with the foregoing organic EL element 60, 70, or 80.

Further, embodiments 1-7 above used reflective-type, liquid crystal display elements 20 as the light-modulating elements; alternatives are possible. For example, display elements may be used which are capable of a display by changing the amount of reflected light using a mirror or the like. Further, light-modulating elements, such as electrophoretic-type displays, twisted-ball-type displays, reflective-type displays using fine prism film, and digital mirror devices, can be used.

Embodiments 1-7 used the organic EL elements 40, 60, 70, 80 as the light-emitting elements; alternatives are possible. For example, inorganic EL elements, LEDs (Light Emitting Diodes), and other elements with a light emission luminance varying capability are applicable. Further, field emission displays (FEDs), plasma displays, and other similar light-emitting elements may be used.

The insulating substrate 29 described in embodiments 1-7 is not necessarily hard, but may be film-like.

Embodiments 1-7 used the TFT elements 22 for liquid crystal as the switching elements to drive the liquid crystal display elements 20; alternatives are possible. For example, liquid crystal MIM (Metal Insulator Metal) elements may be used.

Embodiment 8

Figure 32:
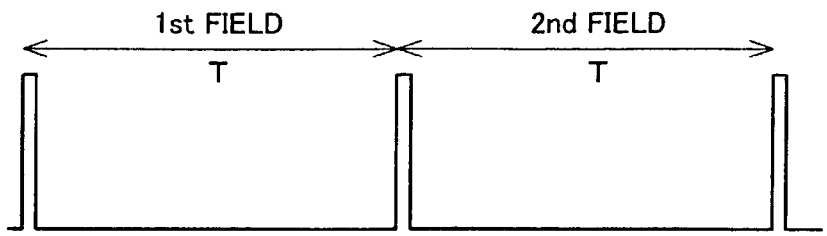
FIGS. 32(a) to 32(c), showing another embodiment of a display in accordance with the present invention, is a waveform chart illustrating the display being driven.
Figure 32:
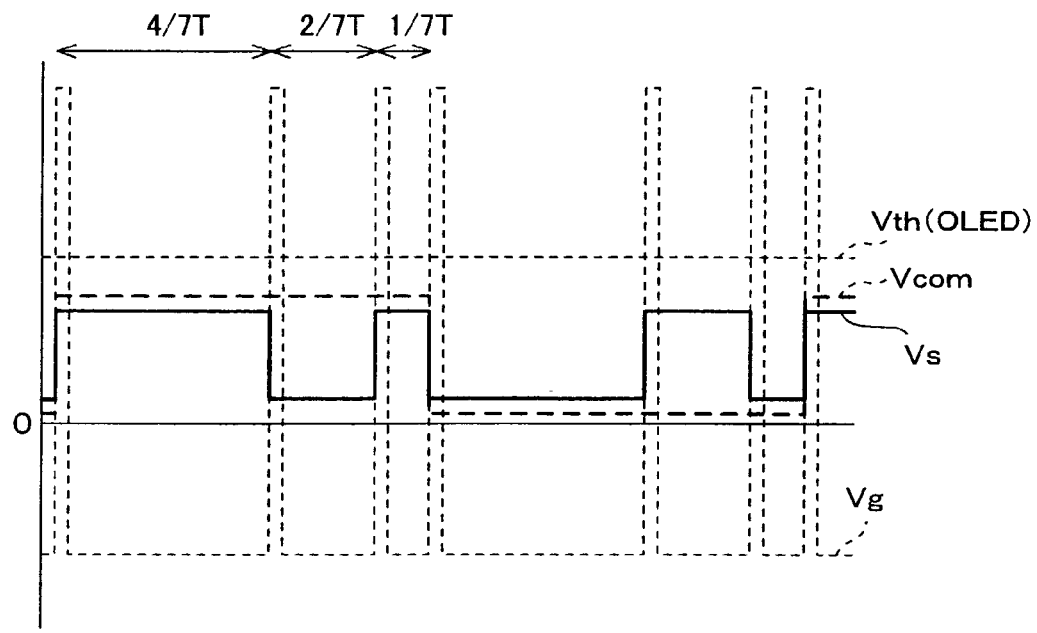
Figure 32:
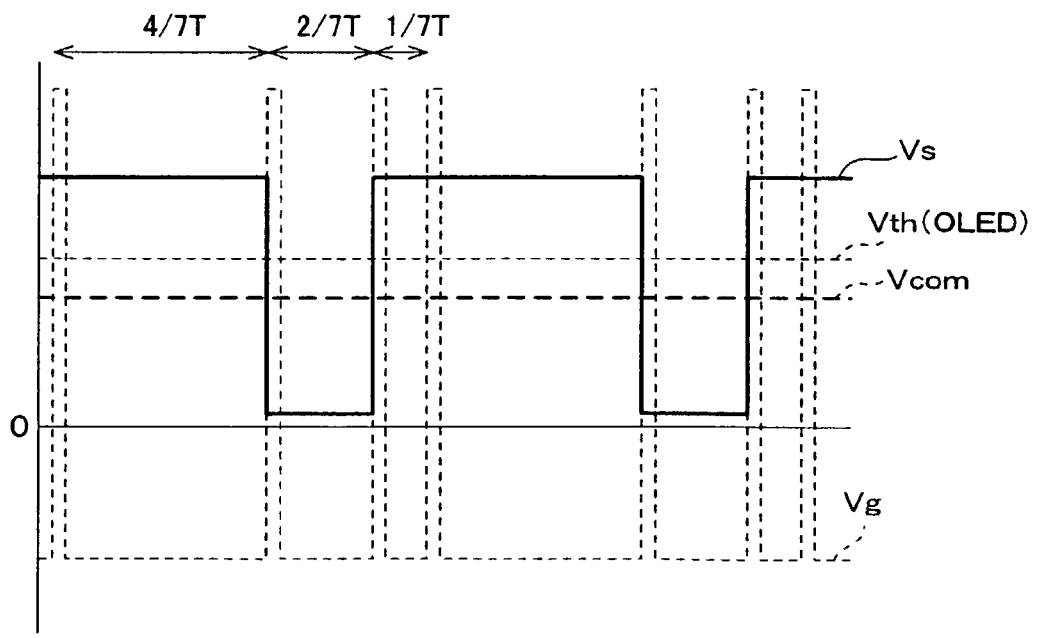

Referring to FIG. 32, the following will describe another embodiment in accordance with the present invention. Here, for convenience, members of the present embodiment that have the same arrangement and function as members of one of embodiments 1-7 above, and that are mentioned in that embodiment are indicated by the same reference numerals and description thereof is omitted. The description of various features of embodiments 1-7 applies also to the present embodiment.

As mentioned earlier, the liquid crystal display and the organic EL display are both thin and lightweight. Under sufficient lighting, the reflective-type liquid crystal display is advantageous in terms of power consumption; under poor lighting, the organic EL display is advantageous in terms of light using efficiency and shape. Forming a liquid crystal display element and an organic EL display element on a single substrate may offer a viable solution to supplement each element's disadvantages and achieve an optimal display in various environments.

Nevertheless, simply forming a liquid crystal display element and an organic EL display element on a single substrate in the display 1 makes wiring and drive circuits in the substrate too complex, entailing low yields and high costs in manufacture.

Accordingly, the display 1 takes the configuration described in embodiment 5 in reference to FIG. 23 in which a gate bus lines 3 which is a signal line and a scanning signal line and a resource bus lines 2a which is a signal line and a data signal line are shared with respect to the driving of the liquid crystal display element 20 and the organic EL element 40, so as to solve the problems.

In the present embodiment, a method of driving using a drive circuit of the display 1 other than embodiment 5 will be explained in detail. The drive circuit here is identical to that in FIG. 23.

First of all, in FIG. 32(a), 1 T indicates a field, which is a unit time for a video signal of a display pixel 10.

In the present embodiment, as shown in FIGS. 32(b), 32(c), a scanning line signal Vg from the gate bus line 3 increases voltage when selected, so as to turn the TFT element 22 for liquid crystal in FIG. 23 to ON state, and decreases voltage when not selected, so as to turn the TFT element 22 for liquid crystal to OFF state.

Further, the scanning line signal Vg is selected twice or more in one field T to turn to ON state. Further, intervals at which the scanning line signal Vg is selected are not equal, but changes by the factor of $2^n$ where n is a positive integer. In other words, in FIG. (b), a field T is divided to $2^0:2^1:2^2$, Consequently, one field T has intervals $(\frac{1}{7})T$, $(\frac{2}{7})T$, and $(\frac{4}{7})T$. The intervals could be equal without any problem in driving: however, varying the intervals by the factor of $2^n$ can reduce the frequency of selecting the scanning line signal Vg and increase tones. In other words, by dividing one field T to, for example, $2^0:2^1:2^2$ and separately turning the divided portions into ON state in this manner, it is now possible to display eight tones with the total lighting time in one field T taken into consideration.

In the present embodiment, in one field T, eight tones are displayed by, turning the scanning line signal Vg into ON state, for example, three times; alternatives are possible. The more frequently the scanning line signal Vg is turned into ON state, the more tones can be displayed. In other words, typically, to divide a field T which is a unit time for a video signal, the dividing should be done so that division widths are $1(=2^0):2^1:2^2:\ldots:2^n$, where n is a positive integer. $2^{n+1}$ tones are thus displayed. Further, the selecting of the scanning line signal Vg is less frequent, and tones are increased.

A specific method of driving a reflective-type display and a light-emitting display will be explained below.

First of all, to effect a reflective-type display, as shown in FIG. 32(b), the data line signal Vs from the resource bus line 2a in FIG. 23 performs reverse drive with respect to the COM signal Vcom, and when combined with the COM signal Vcom, varies the amount of reflected light through a binary signal. Further, ON/OFF actions are performed within three scanning line signals Vg to effect a display while adjusting the amount of reflected light with respect to time. In other words, reflection time is increased/decreased to adjust the amount of reflected light.

Further, in the present embodiment, the liquid crystal display element 20 uses a normally-white-type liquid crystal; therefore, the display appears bright in period $(4/7)$T and period $(1/7)$T and dark in period $(2/7)$T in response to the drive signal in FIG. 32(b). This can be translated as the fifth tone is being displayed in both the first field and the second field. In other words, for example, in period $(2/7)$T, the COM signal Vcom is in ON state, whereas the data line signal Vs is in OFF state. Consequently, a state occurs where voltage is applied to the liquid crystal display element 20, and the display appears dark in period $(2/7)$T.

Here, because the data line signal Vs from the resource bus line 2a is not above the EL threshold voltage Vth (OLED) of the TFT element 42 for an EL element in FIG. 23, the organic EL element 40 conducts current and effects no light-emitting display.

Meanwhile, to effect a light-emitting display, as shown in FIG. 32(c), the data line signal Vs from the resource bus line 2a is above the EL threshold voltage Vth(OLED) of the TFT element 42 for an EL element and the organic EL element 40 conducts current to effect a light-emitting display. Further, when the data line signal Vs is lower than the EL threshold voltage Vth(OLED) of the TFT element 42 for an EL element, the organic EL element 40 does not emit light.

In the present embodiment, the scanning line signal Vg is turned into ON state three times in a field T, and the organic EL element 40 is turned ON/OFF within three scanning line signals Vg to effect a display while adjusting the amount of outgoing light with respect to time similarly to the liquid crystal display element 20, Specifically, as shown in FIG. 23(c), the display is in ON state in periods $(4/7)$T and $(1/7)$T and turns to OFF state in period $(2/7)$T. This can be translated as the fifth tone is being displayed in both the first field and the second field.

Under this circumstance, to effect a light-emitting display, since ON/OFF of light emission is controlled through a signal with respect to GND, the COM signal Vcom is made constant and the data line signal Vs from the resource bus line 2a does not perform reverse drive. Further, in the present embodiment, the liquid crystal display element 20 is, as mentioned above, uses a normally-white-type liquid crystal. Therefore, the differential between the COM signal Vcom and the data line signal Vs from the resource bus line 2a is an invariably large value. For these reasons, the liquid crystal appears invariably dark, and the reflective-type display portion does not reflect the external light 4 and becomes incapable of effecting a light-emitting-type display.

Further, in the present embodiment, when a light-emitting display is being effected, the COM signal Vcom is made constant and the data line signal Vs from the resource bus line 2a is varied. Therefore, by turning ON/OFF the organic EL element 40, the liquid crystal display element 20 is AC driven with respect to the COM signal Vcom to avoid degradation.

In the present embodiment, each TFT element 42 for an EL element constitutes a voltage current conversion means; alternatives are however possible. As shown in FIG. 31, two or more elements 42 may constitute a voltage current conversion means to curb irregularity on the surface of the display 1, provided that the threshold value of the operation voltage is controllable through the data line signal Vs from the resource bus line 2a.

In the present embodiment, as described in the foregoing, the resource bus lines 2a and the gate bus lines 3 are shared to drive the display pixels 10 arranged in a matrix using the liquid crystal display elements 20 and the organic EL elements 40

Further, in the display 1 of the present embodiment, the organic EL elements 40 can be driven by applying a drive signal to the resource bus lines 2a and the gate bus lines 3 of the liquid crystal display elements 20. Therefore, the organic EL elements 40 can be driven using the resource bus lines 2a and the gate bus lines 3 for driving the liquid crystal display elements 20. This amounts to sharing the drivers, such as the source driver 6 and the gate driver 7. Thus, the liquid crystal display elements 20 and the organic EL elements 40 operate for display without additional resource bus lines 2a or gate bus lines 3.

Note that in the present embodiment, the liquid crystal display elements 20 are normally white. This means that when no voltage is applied to the liquid crystal display elements 20, the reflective area 11 appears white and that when voltage is applied to the liquid crystal display elements 20, the reflective area 11 appears black with resultant zero reflectance. The greater the voltage applied from the resource bus lines 2a to the liquid crystal display elements 20, the deeper the black display appears. Therefore, when the organic EL elements 40 are to be driven, as mentioned in the foregoing, the liquid crystal display elements 20 are being driven and effecting a black display.

As a result of this, the areas surrounding the transmissive areas 12 which are display areas of the organic EL elements 40 appear black; thereby, reduction in contrast due to the driving and resultant light emission of the organic EL elements 40 can be prevented.

Further, in the display 1 of the present embodiment, each light-modulating element is made of a liquid crystal display elements 20. Consequently, fabricating a liquid crystal display element 20 and an organic EL element 40 in each display pixel 10 makes it possible to offer a display 1 which incorporates the advantages of the two elements: low power consumption of the liquid crystal display element 20 and high light using efficiency of the organic EL element 40.

Under this circumstance, given the properties of the TFT elements 22 for liquid crystal, the liquid crystal display elements 20 need to be reverse driven with respect to the potential of the opposite electrodes 27, i.e., AC-driven. Meanwhile, the organic EL elements 40, as mentioned in the foregoing, are sufficiently non-reverse driven by current, i.e., DC-driven.

Regarding this point, the display 1 of the present embodiment includes pixel electrodes 25 with external light reflecting properties and opposite electrodes 27 provided on the opposite substrate to oppose the pixel electrodes 25 so as to occupy the whole surfaces of the display pixels 10. Further, the display 1 is reverse driven with respect to the potential of the opposite electrodes 27 when the liquid crystal display elements 20 are to effect a display, and non-reverse driven with respect to the potential of the cathodes 45, i.e., the GND potential when the organic EL elements 40 are to effect a display.

Therefore, when the liquid crystal display elements 20 are used as the light-modulating elements, the liquid crystal display elements 20 and the organic EL elements 40 are surely and suitably driven.

Further, in the display 1 of the present embodiment, the organic EL elements 40 are placed behind the pixel electrodes 25 having external light reflecting properties. When the organic EL elements 40 emits light toward the front, only the transmissive areas 12 effect a display and the reflective areas 11 in which the pixel electrodes 25 are positioned do not transmit light.

Therefore, when the organic EL elements 40 are to be driven, the pixel electrodes 25 of the liquid crystal display elements 20 serve as a black matrix, which allows maintaining the contrast of the organic EL elements 40.

According to the method of driving the display 1 of the present embodiment, a field T which is a unit time for a video signal in each display area 10 is divided, and the liquid crystal display elements 20 or the organic EL elements 40 are turned ON/OFF for each divided period.

Therefore, it is now possible to control the total ON time of the liquid crystal display elements 20 or the organic EL elements 40 in one field T, add to lighting patterns, and drive those increased patterns efficiently.

Further, it becomes possible to display tones of a video signal by controlling the ON times of the liquid crystal display elements 20 or the organic EL elements 40 in terms of time in this manner.

This prevents a circuit configuration from being complex, allows reduction in yields and costs in manufacture, and offers a method of driving the display 1 capable of efficiently tone display, when two display elements, i.e., the liquid crystal display element 20 and the organic EL element 40 are fabricated in a single display area 10.

Further, according to the method of driving the display 1 of the present embodiment, to divide a field which is a unit time for a video signal, the dividing is done so that the division widths are $1(=2^0):2^1:2^2: \ldots :2^n$, where n is a positive integer in each display area 10.

In other words, by dividing a field T with intervals varying by a factor of $2^n$ and turning the liquid crystal display elements 20 or the organic EL elements 40 into ON state for every divided period, i.e., period $(4/7)T$, period $(2/7)T$, and period $(1/7)T$, it is now possible to control the total ON times of the liquid crystal display elements 20 or the organic EL elements 40 in one field T, add to lighting patterns, and drive those increased patterns efficiently.

Consequently, the divide method is capable of displaying $2^{n+1}$ tones, the selecting of the scanning line signal is less frequent, and tones are increased.

The present embodiment described the drive circuit for the organic EL elements 40 placed behind the pixel electrodes 25; however, alternatives are possible. The drive circuit described in the present embodiment is applicable to the organic EL elements 40 placed in the same layer as the liquid crystal layer 26.

Further, the abovementioned embodiments used reflective-type, liquid crystal display elements 20 as light-modulating elements; alternatives are possible. For example, display elements may be used which are capable of a display by switching on/off the amount of reflected light using a mirror or the like. Further, light-modulating elements, such as electrophoretic-type displays, twisted-ball-type displays, reflective-type displays using fine prism film, and digital mirror devices, can be used.

Further, the organic EL elements 40 were used as the light-emitting elements; alternatives are possible. For example, the organic EL elements 60, 70, and 80, inorganic EL elements, LEDs (Light Emitting Diodes), and other elements with a light emission ON/OFF control capability are applicable. Further, field emission displays (FEDs), plasma displays, and other similar light-emitting elements may be used.

The insulation substrate 29 described in the abovementioned embodiment is not necessarily hard, but may be film-like.

The embodiment above used the TFT elements 22 for liquid crystal as the switching element to drive the liquid crystal display elements 20; alternatives are possible. For example, liquid crystal MIM (Metal Insulator Metal) elements may be used.

Embodiment 9

Referring to FIGS. 33-40, the following will describe another embodiment in accordance with the present invention. Here, for convenience, members of the present embodiment that have the same arrangement and function as members of one of embodiments 1-8 above, and that are mentioned in that embodiment are indicated by the same reference numerals and description thereof is omitted. The description of various features of embodiments 1-8 applies also to the present embodiment.

In the present embodiment, the manufacture of an organic EL display which is a self-illuminating element will be described.

Figure 33:
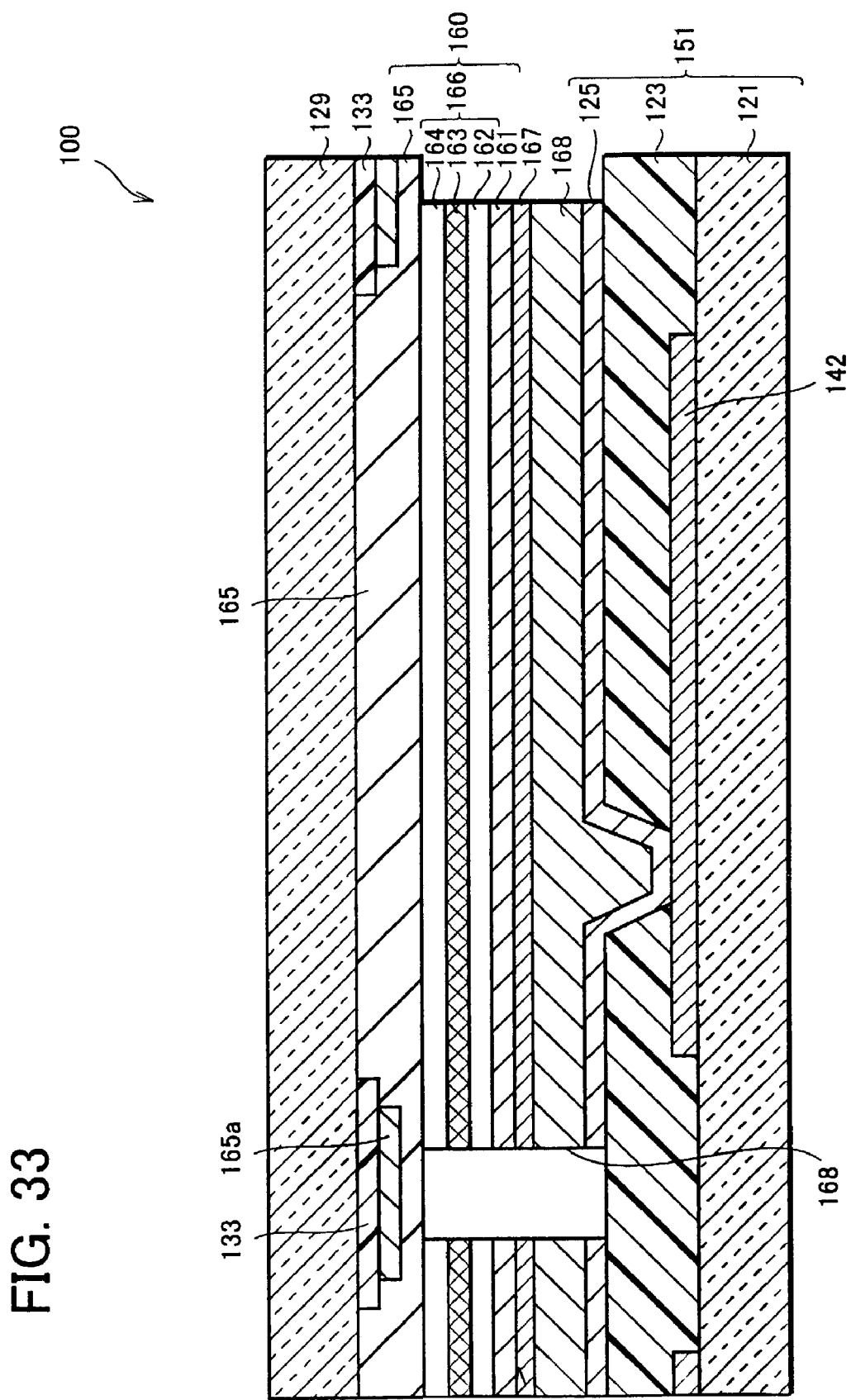
FIG. 33, showing another embodiment of a display in accordance with the present invention, is a cross-sectional view illustrating an organic EL light-emitting element, as an organic EL layer, constituted by a hole transport layer, a light-emitting layer, and an electron transport layer.

First of all, in an organic EL display 100 of the present embodiment, as shown in FIG. 33, a TFT drive circuit section and an EL layer are formed between two insulating substrates 121, 129 as a first substrate and a second substrate.

A TFT circuit 142 is formed on one (121) of the two insulating substrates. On the TFT circuit 142 there is formed an insulating, planarizing film 123 which will become a protective film. On the planarizing film 123 there is formed a pixel electrode 125 which is connected to the TFT circuit 142 in a through hole formed through the planarizing film 123. The planarizing film 123 prevents water and contents from penetrating into the TFT circuit 142, as well as planarizes the top surface of the TFT circuit 142. The insulating substrate 121, the TFT circuit 142, the planarizing film 123, and the pixel electrode 125 form a TFT-circuit-side substrate 151.

Meanwhile, on the other insulating substrate 129 placed opposite to the TFT-circuit-side substrate 151, is there provided a black matrix 133 hiding gaps in the element and blocking light coming in from a horizontal direction with respect to the light-emitting layer. On the black matrix 133, an electrode line 165a supplying power to the EL layer is formed along the black matrix 133. On top of them an anode electrode 165 for the EL layer is formed of a transparent conductive film.

The anode 165 is normally formed of an oxide of ITO. An oxide-made conductor has a higher resistance than metal-made ones. Therefore, the anode 165 made of a transparent conductive film may cause notable power loss, depending on the distance from the substrate end face which serves as a power source. For these reasons, in the present embodiment, the electrode lines 165a for use in power feeding constituted by a metallic electrode are formed along the black matrix 133.

On the anode 165, there is formed an organic EL layer 166 which is here constituted by a hole transport layer 164, a light-emitting layer 163, and an electron transport layer 162. On the electron transport layer 162, a cathode 161 is formed. The structure of an EL is complete with the formation of from the insulating substrate 129 to the cathode 161. The anode 165, the hole transport layer 164, the light-emitting layer 163, the electron transport layer 162, and the cathode 161 constitute the organic EL element 160.

In the present embodiment, a cathode-protecting electrode material 167 which protects the cathode 161 is provided subsequently to the cathode 161. This is because the cathode 161 is readily oxidized by oxygen and water. The provision on the cathode 161 protects the cathode 161 and easily form a connection to the TFT-circuit-side substrate 151. In other words, the cathode-protecting electrode material 167 is preferably provided successively to the cathode 161, in terms of higher reliability.

Further, the TFT-circuit-side substrate 151 and the insulating substrate 129 on which the organic EL element 160 is formed are connected by a connecting electrode 168 which is formed of a conductive paste and a conductive resin. The two substrates may be combined after they are formed. Alternatively, it may be formed only on one of the substrates. The material may be provided in layers to make a connection.

Figure 34:
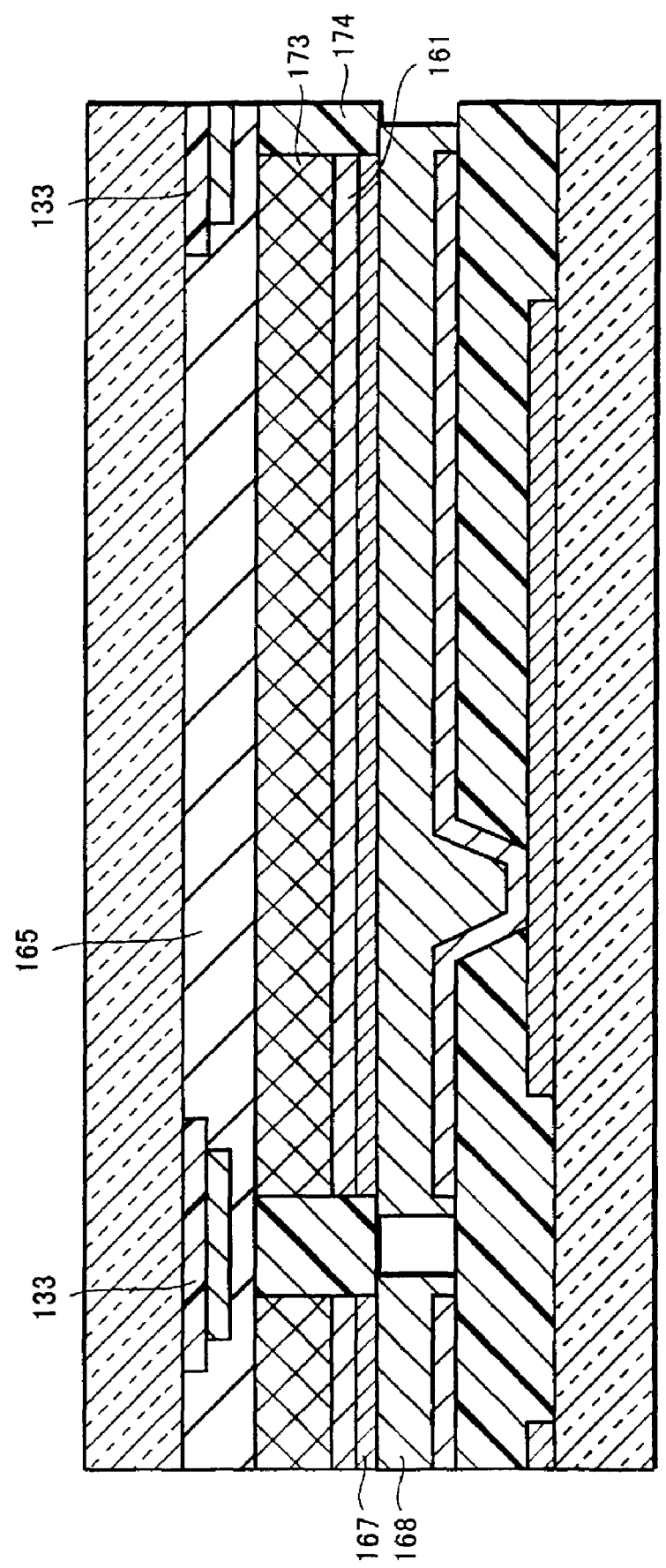
FIG. 34 is a cross-sectional view illustrating an organic EL light-emitting element, as an organic EL layer, which is composed of a polymer EL material.
Figure 35:
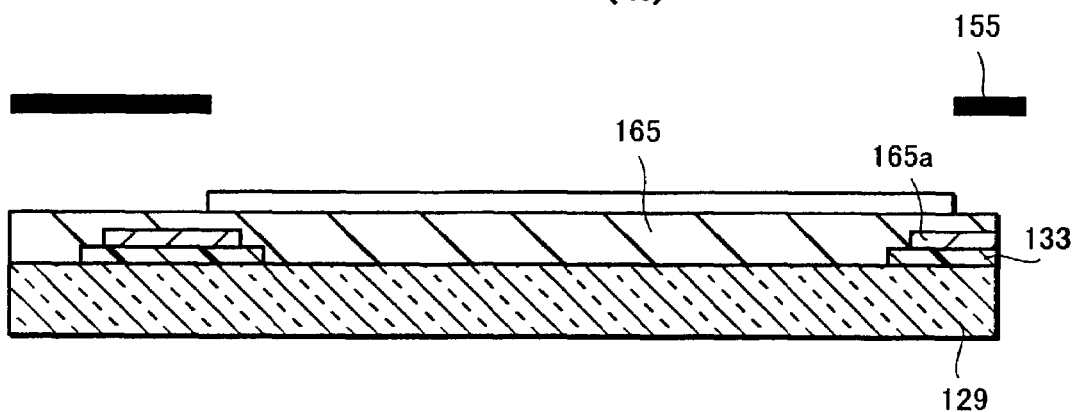
FIG. 35(a) to FIG. 35(c) are cross-sectional views illustrating a method of manufacturing an opposite substrate in the display shown in FIG. 33.
Figure 35:
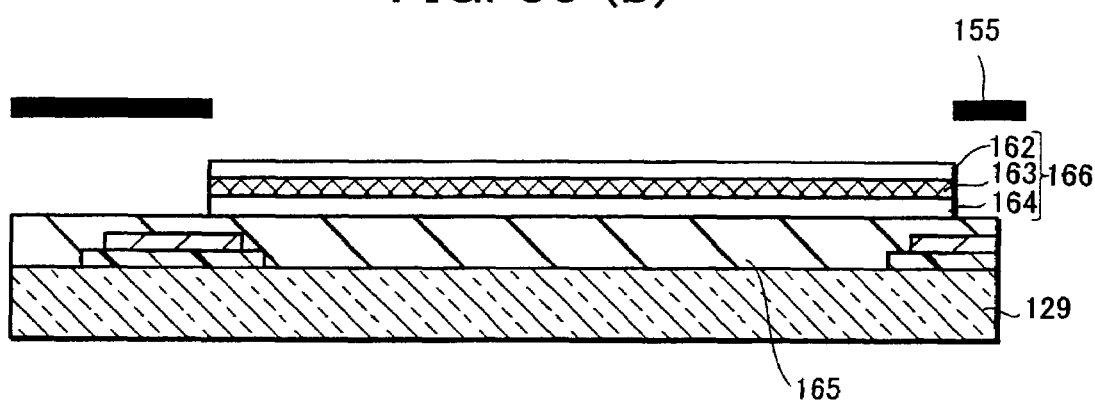
Figure 35:
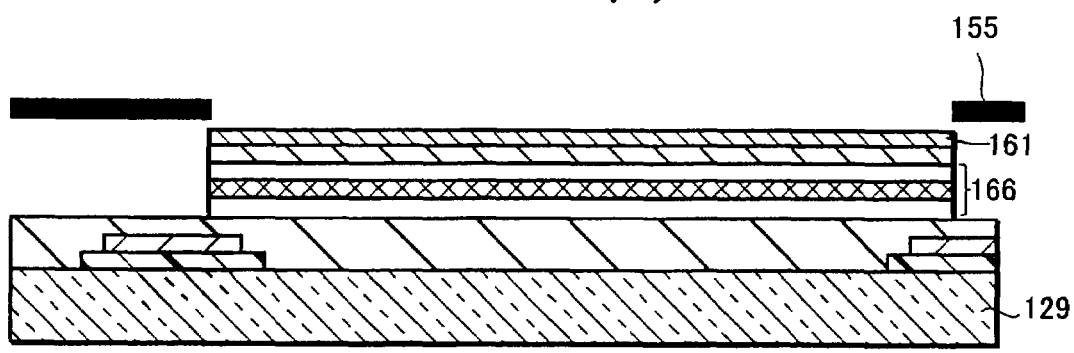
Figure 36:
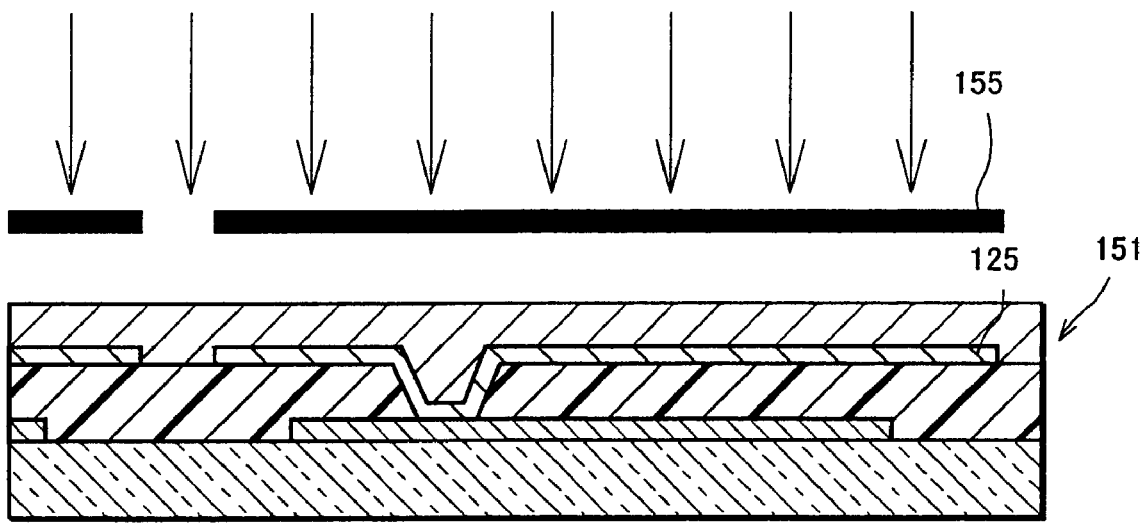
FIG. 36(a) and FIG. 36(b) are cross-sectional views illustrating a method of manufacturing a TFT circuit side substrate in the display shown in FIG. 33.
Figure 36:
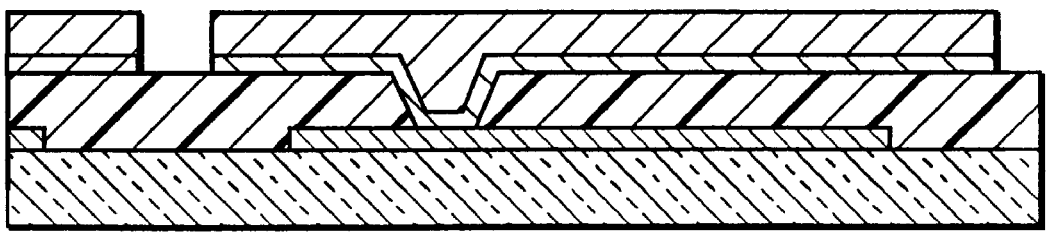
Figure 37:
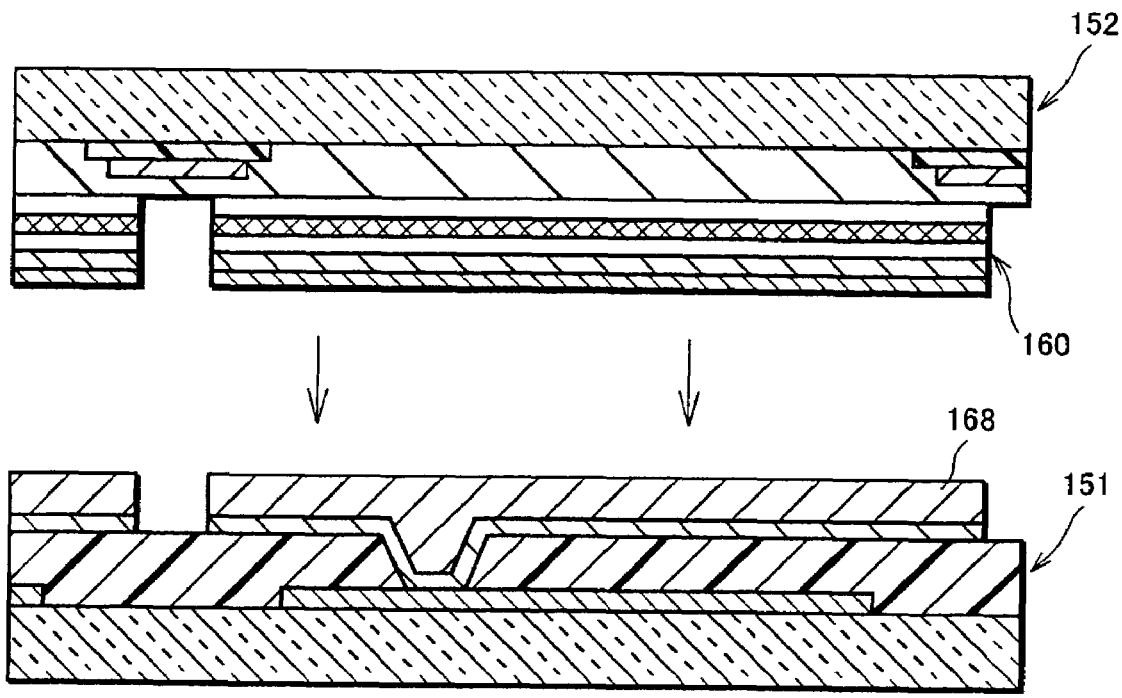
FIG. 37(a) and FIG. 37(b) are cross-sectional views illustrating a step of combining an opposite substrate with a TFT circuit side substrate of the display shown in FIG. 33.
Figure 37:
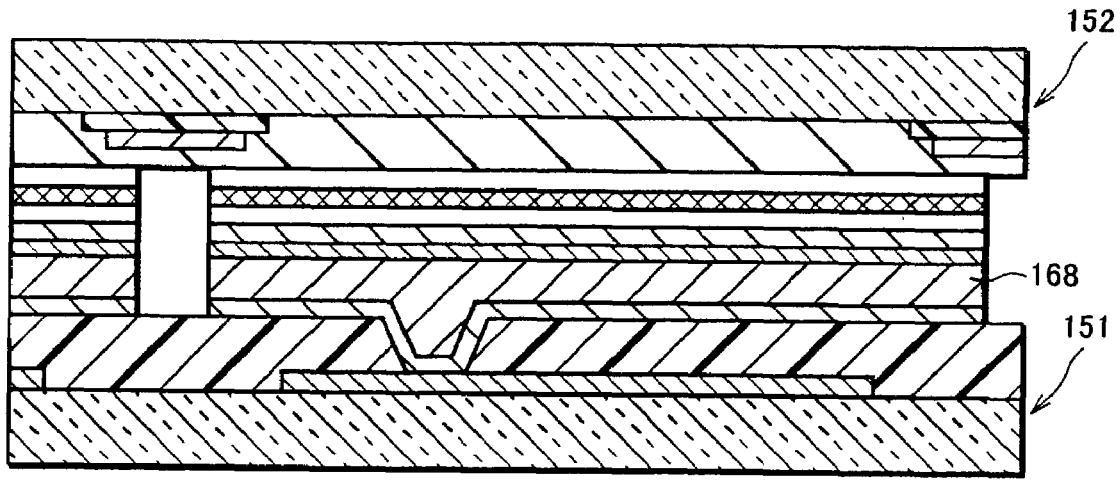

FIG. 20 illustrates that the organic EL layer 166 and the hole transport layer 164 are constituted by the light-emitting layer 163 and the electron transport layer 162. Alternatives are possible: for example, the organic EL layer may be fabricated from a polymer EL material 173 by coating using an ink jet printing device, as shown in FIG. 34. To perform coating using an ink jet printing device in this manner, a guide 174 is provided under the black matrix 133 to prevent the polymer EL material 173 from flowing into surrounding areas. In other words, the guide 174 is formed in square and the interior of the guide 174 is coated with the polymer EL material 173 by ink jet printing. The organic EL layer 166 is drawn as a single layer; alternatively, similarly to the foregoing, the interior may be coated with the polymer EL material 173 repeatedly to form layers.

Now, a method of manufacturing the organic EL display 100 will be described in reference to FIGS. 35-40.

First of all, referring to FIG. 35(a), a black matrix 133 is formed on the insulating substrate 129 from a light-blocking material composed of chromium oxide or TiN/TiO fine particles. The black matrix 133 is suitably about 1000 to 2000 Å thick. The chromium oxide can be formed using vacuum-formed film by sputtering or vapor deposition. TiN/TiO fine particles may be dispersed in a resist and applied, exposed to light using a mask, developed, and baked to form the pattern.

Next, a electrode line 165a for a power supply is formed in the following manner: aluminum (Al) and titanium (Ti) are sputtered across the surface in this order, patterned using a resist, and dry etched to form an electrode pattern. Aluminum (Al) is for example, 3000 Å, and titanium (Ti) 800 Å. On top of that, a film of ITO is fabricated by 1000 Å sputtering to form anode electrodes (anodes) 165. FIGS. 22(a) to 22(c) demonstrates a method of forming an organic EL layer 166 by masked vapor deposition on the insulating substrate 129 thus fabricated.

First of all, as shown in FIG. 35(a), the shadow mask 155 is placed on the top surface of the substrate, and materials which will constitute the organic EL layer 166 are sequentially formed through the openings in the shadow mask 155. Specifically, as shown in FIGS. 35(a), 35(b), the hole transport layer 164, the light-emitting layer 163, and the electron transport layer 162 are stacked in this order.

Examples of material for the hole transport layer 164 include, but are not limited to, phthalocyanine compounds, naphthalocyanine compounds, porphyrins, oxadiazole, triazole, imidazole, tetrahydroimidazole, oxazole, and stilbene.

Next, examples of material for the light-emitting layer 163 which is made of colored-light-emitting, low-molecular-type light-emitting material include, but are not limited to, naphthalene, anthracene, phenanthrene, pyrene, tetracene, fluorescein, perylene, phthaloperylene, naphthaloperylene, perynone, phthaloperynone, naphthaloperynone, diphenylbutadiene, tetraphenylbutadiene, coumarin, quinoline metal complexes, imine, diphenylanthracene, diaminocarbazole, quinacridone, and rubrane.

Examples of material for the electron transport layer 162 include, but are not limited to, fluorenone, anthraquinodimethane, diphenyquinone, thiopyrandioxide, oxadiazole, thiadiazole, tetrazole, and perylene tetracarboxylic acids.

Next, as shown in FIG. 35(c), on the organic EL layer 166, an electrode material with a low work function value is formed as the cathode 161. The work function is the minimum energy required to bring an electron in solids like conductors and semiconductors out into space.

Examples of material for the cathode 161 include, but are not limited to, magnesium (Mg), calcium (Ca), lithium (Li), Mg—Ag alloys, and Li—Al alloys.

Examples of material for the cathode-protecting electrode material 167 include, but are not limited to, aluminum (Al), nickel (Ni), titanium (Ti), tantalum (Ta), gold (Au), and like metals. Here, a Li—Al alloy of 500 to 800 Å and gold (Au) of 1000 Å are formed successively as the cathode 161 and the cathode-protecting electrode material 167.

The substrate bearing the organic EL layer 166 is thus formed. Thereafter, the shadow mask 155 is moved to a next pixel and the same structure is formed. As a result of this, as shown in FIG. 33, the organic EL layer 166 has a void between a pixel and an adjacent one.

Referring to FIGS. 36(a), 36(b), the following will describe a process of forming the connecting electrode 168 which is a contact layer for making a connection by attaching to the substrate on the organic EL element 160 side of the TFT-circuit-side substrate 151.

As shown in FIG. 36(a), on the TFT-circuit-side substrate 151, the connecting electrode 168 is formed on the pixel electrode 125.

The connecting electrode 168 is made of a material such as a conductive paste or resin. Fine particle metal with a nano-scale diameter as a conductive paste will highly likely contact an electrode, between particles, etc. due to its small size and ensures electrical coupling.

Examples of a conductive resin include a photosensitive resin in which conductive particles are dispersed as disclosed by Fuji Film Co., Ltd. in Tokukaihei 11-249299 (Japanese Laid-open Patent Application 11-249299/1999) and a polypyrrole-based photosensitive conductive polymer described in, for example, Chemistry Letters, pp. 469-472, 1986, the Chemical Society of Japan. Specifically, Tokukaihei 11-249299 relates to a photosensitive dispersion product and a photosensitive sheet in which conductive particles such as carbon black are dispersed and discloses formation of a pattern by exposure and development. Chemistry Letters, pp. 469-472, 1986 discloses formation of polypyrrole by photochemically polymerizing a pyrrole monomer to impart conductance to the material and discloses patterning as the electrode material and its use.

Here, as shown in FIG. 36(a), for example, a photosensitive conductive material containing a resist and carbon black dispersed therein is applied to the TFT-circuit-side substrate 151, exposed using a shadow mask 155, developed, and fabricated so as to leave the connecting electrode 168 only to the pixel sections as shown in FIG. 36(b).

Next, as shown in FIG. 37(a), 37(b), the TFT-circuit-side substrate 151 and the opposite substrate 152 on the organic EL element 160 side are aligned to each other and combined before being fixed. Under this circumstance, the organic EL element 160 is electrically connected to the TFT-circuit-side substrate 151 by the connecting electrode 168. Desirably, the TFT-circuit-side substrate 151 and the opposite substrate 152 are both provided with conductive resin in advance to make an electrical contact between the conductive resin. This is because the structure is capable of preventing a defective contact from developing because of an oxide film or the like on the metal surface and facilitates firm contact making use of the resin's elasticity.

Now, the following will describe formation on the organic EL layer 166 using the polymer EL material 173.

Figure 38:
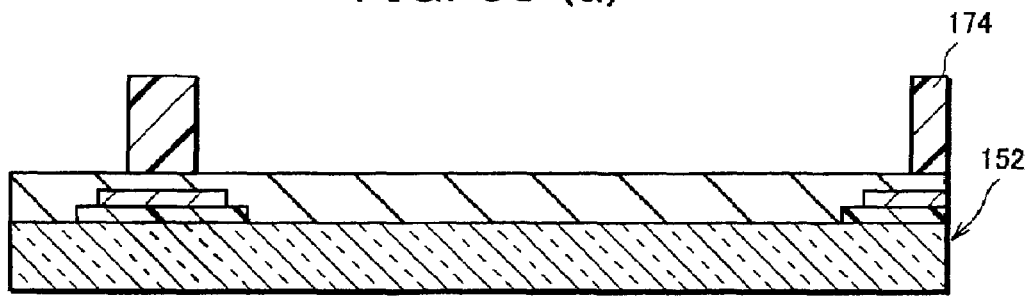
FIG. 38(a) to FIG. 38(c) are cross-sectional views illustrating a method of manufacturing an opposite substrate in the display shown in FIG. 34.
Figure 38:
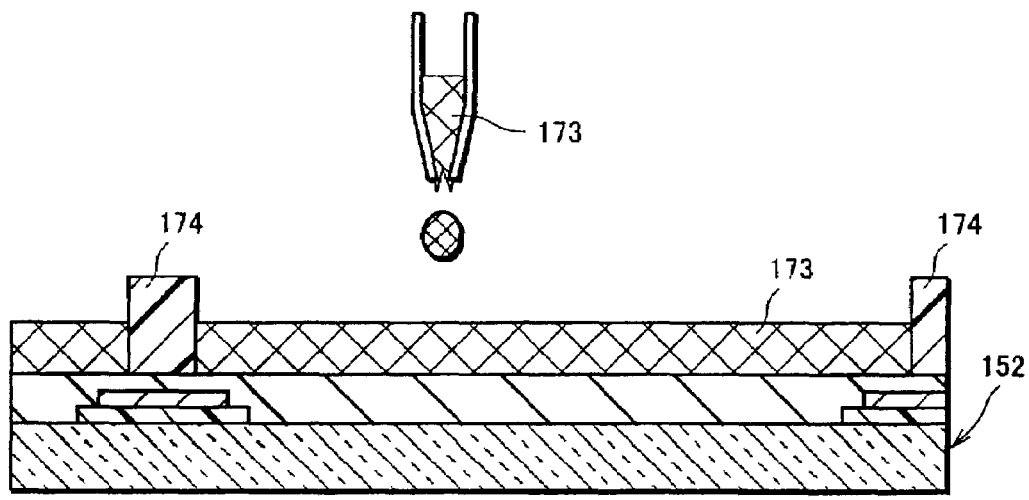
Figure 38:
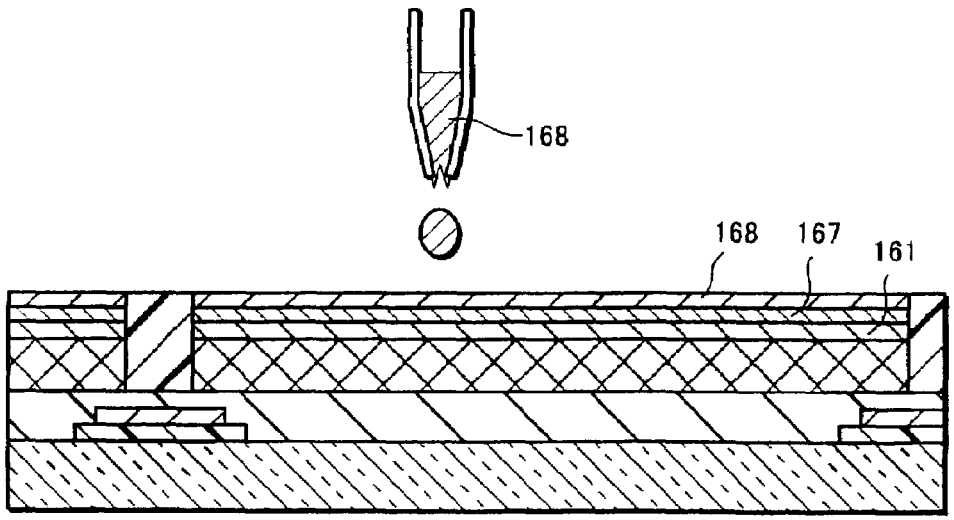

As shown in FIG. 38(*a*), the guide 174 is formed on the anode 165 of the opposite substrate 152. The guide 174 is formed by photolithography or ink jet printing using a resist or polyimide. FIG. 38(*b*) shows that an organic EL layer made of a polymer EL material 173 is formed in the guide 174 by ink jet printing. Examples of the polymer EL material 173 include polyphenylene vinylene, polyfluorene, polythiophene, and polyvinylcarbazole.

Figure 39:
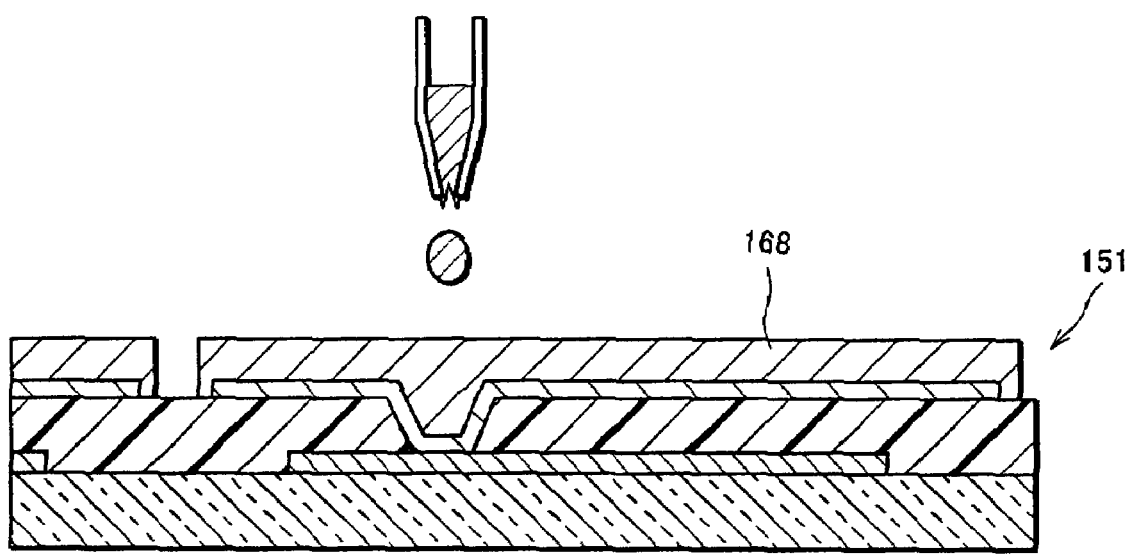
FIG. 39 is a cross-sectional view illustrating a method of manufacturing a TFT circuit side substrate in the display shown in FIG. 34.

As shown in FIG. 38(*c*), after the formation of the cathode 161 and the cathode-protecting electrode material 167, a conductive polymer material is applied as the connecting electrode 168 which is a contact layer. The cathode 161 may be made, as mentioned earlier, of aluminum (Al), magnesium (Mg), Al—Mg, and Al—Li material. Here, an Al—Li metal material is formed by vapor deposition at about 1000 Å. On top of that, a conductive polymer material is formed as the connecting electrode 168. Meanwhile, as shown in FIG. 39, the TFT-circuit-side substrate 151 is formed, for example, by applying a connecting electrode 168 of a photosensitive conductive resin using an ink jet device.

Figure 40:
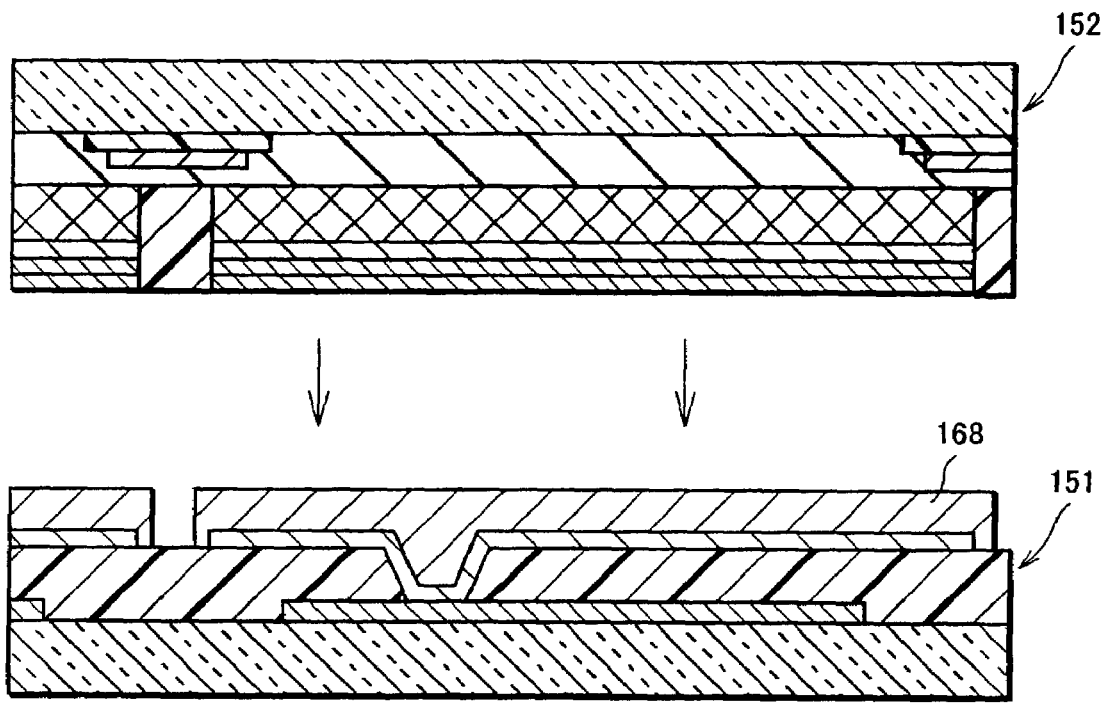
FIG. 40(a) and FIG. 40(b) are cross-sectional views illustrating a step of combining an opposite substrate with a TFT circuit side substrate of the display shown in FIG. 34.
Figure 40:
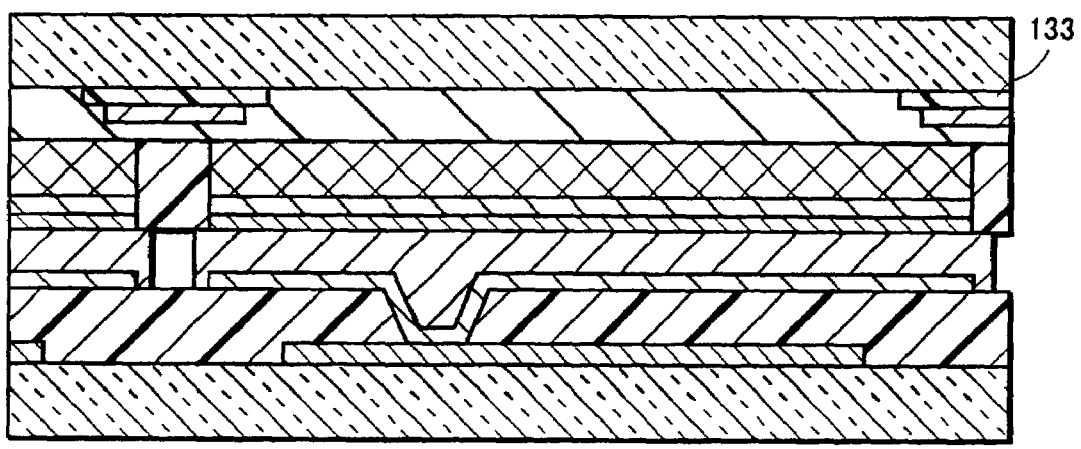
Figure 41:
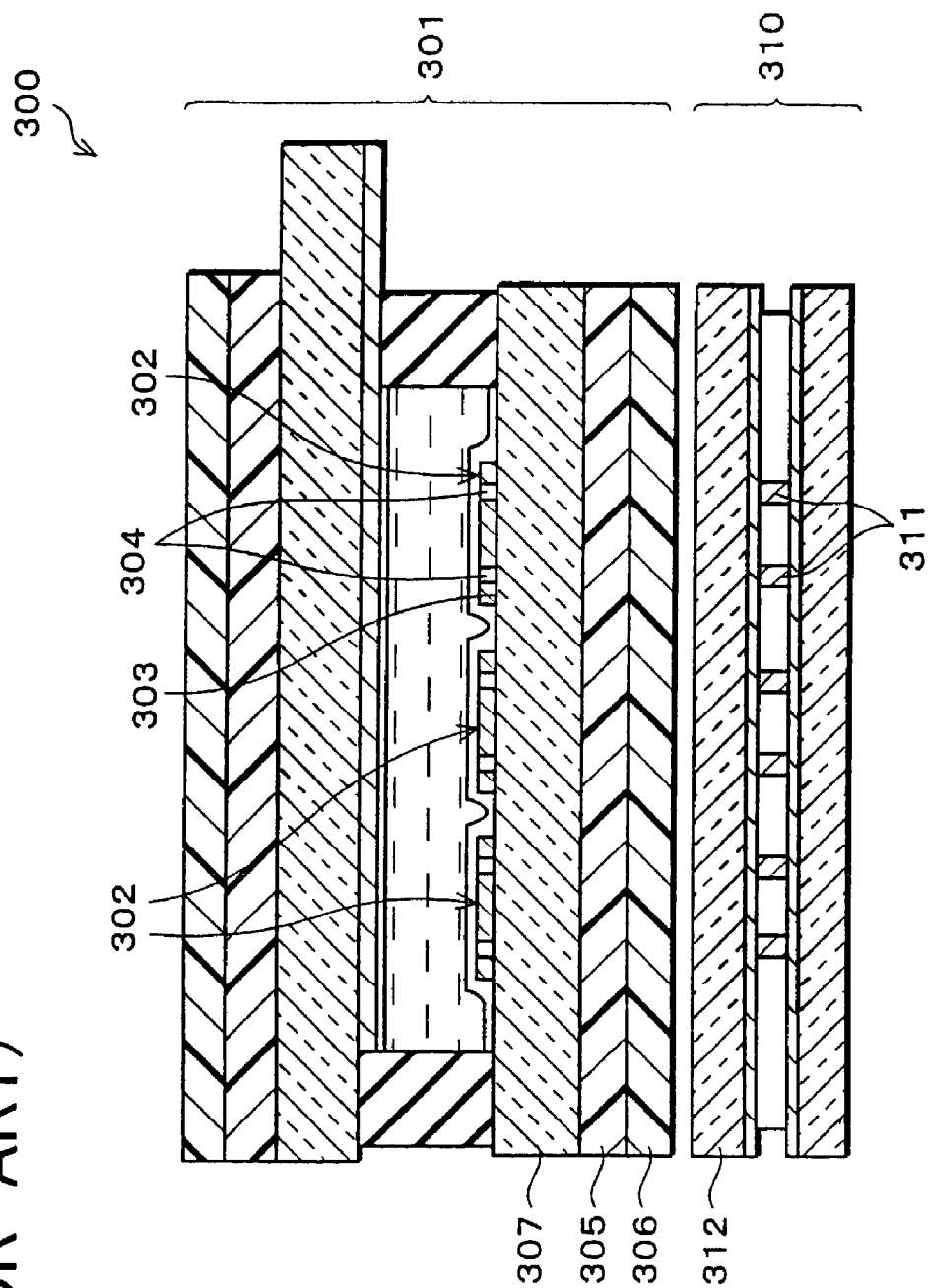
FIG. 41 is a cross-sectional view illustrating a conventional display.

Next, as shown in FIG. 40(*a*), 40(*b*), the TFT-circuit-side substrate 151 is combined with the opposite substrate 152. In other words, the TFT-circuit-side substrate 151 and the opposite substrate 152 on the organic EL element 160 side are aligned to each other and combined before being fixed. Under this circumstance, the organic EL element 160 is electrically connected to the TFT-circuit-side substrate 151 by the connecting electrode 168. Desirably, the TFT-circuit-side substrate 151 and the opposite substrate 152 are both provided with conductive resin in advance to make an electrical contact between the conductive resin. This is because the structure is capable of preventing a defective contact from developing because of an oxide film or the like on the metal surface and facilitates firm contact making use of the resin's elasticity.

An epoxy-resin-based adhesive agent may be applied to the circumferences of the combined surfaces of the TFT-circuit-side substrate 151 and the opposite substrate 152 to be combined, and the connecting electrode 168 which is a adhesive layer may be cured for adhesion upon combining. An adhesive agent may be applied to those parts hidden by the black matrix 133 between pixels.

In this manner, according to the organic EL display 100 and the method of manufacturing thereof of the present embodiment, in what is constituted by a light-emitting display element alone, the opposite substrate 152 constituting the organic EL element 160 which is a light-emitting element is combined with the TFT-circuit-side substrate 151 after the fabrication has progressed up to the cathode 161 which is a light-emitting element electrode in the organic EL element 160.

Hence, the outgoing light from the organic EL element 160 can be emitted not through the TFT-circuit-side substrate 151 carrying a drive circuit for driving the organic EL element 160, but through the opposite substrate 152 which is specified to oppose the substrate 151. Thus, with the same light emission direction as in the prior art, the present embodiment enjoys the following basic advantages when compared to the structure by which light is emitted on the TFT-circuit-side substrate 151 side.

First of all, the TFT-circuit-side substrate 151 bearing a drive circuit can be separately formed from the organic EL element 160. Independent manufacturing processes can therefore be arranged, eliminating negative effects of temperature, gases, chemical agents, etc. and improving reliability.

Further, the configuration enables light emission onto the opposite substrate 152 bearing the organic EL element 160. Thus, the light-emitting area can be expanded without negatively affected by drive circuit side aperture ratio, contributing higher luminance. The greater light-emitting area requires smaller current per unit area to deliver the same luminance, adding to life and improving light-emitting efficiency for power consumption reduction.

No light is emitted onto the TFT-circuit-side substrate 151 bearing the drive circuit; the entire surface of the TFT-circuit-side substrate 151 can be used to accommodate the drive circuit. The structure therefore allows for more freedom in determining the size of TFTs (Thin Film Transistors) in the driver circuit and more margin in the TFT formation area, making it possible to form a circuit for more detailed control. Margins are allowed for in wire width, which improves reliability and yields of the drive circuit.

Incidentally, in the organic EL display 100, the cathode 161 of the organic EL element 160 needs to be made of a material with a small work function value. Examples of such metal materials include magnesium (Mg), calcium (Ca), and lithium (Li). These are however unstable and likely to deteriorate due to ambient water and oxygen. The metals may chemically react with some materials they come into contact with by extracting oxygen from those materials. It is preferred if the electrode 161 is covered immediately after its formation with protective, stable metal. In none of the two prior art documents, an arrangement is impossible which provides protection to the cathode 161.

In contrast, in the present embodiment, the opposite substrate 152, in the organic EL element 160, on which up to the cathode 161 is formed is combined with the TFT-circuit-side substrate 151 after the cathode-protecting electrode material 167 as a protective electrode protecting the cathode 161 is formed on the cathode 161.

In other words, when combining the TFT-circuit-side substrate 151 with the opposite substrate 152 on which up to the cathode 161 is formed, the provision of the cathode-protecting electrode material 167 protecting the cathode 161 prevents deterioration of the cathode 161 due to the exposure to ambient water and oxygen in combining.

Further, it is preferred if the cathode 161 and the cathode-protecting electrode material 167 protecting the electrode 161 are fabricated successively in the same step. The cathode 161 is better protected from degradation. Here, since the formation thickness of the cathode-protecting electrode material 167 can be specified to any arbitrary value, the cathode 161 can be configured with such a large thickness that no degradation-causing components like oxygen can enter.

Further, according to the organic EL display 100 and the method of manufacturing thereof of the present embodiment, the opposite substrate 152 on which up to the cathode 161 in the organic EL element 160 is formed is combined with the pixel electrode 125 on the TFT-circuit-side substrate 151 after a contact layer of a conductive paste, conductive resin, or the like is formed at an interface between the TFT-circuit-side substrate 151 and the pixel electrode 125 which is a drive circuit electrode.

This better ensures electrical contact in the combining, eliminates wire cut-offs and point contact at the interface, and allows for image quality improvement, free from irregular luminance spots.

Incidentally, with the organic EL display 100 and the method of manufacturing thereof of the present embodiment, when combining the TFT-circuit-side substrate 151 with the opposite substrate 152 on which up to the cathode 161 is formed, the cathode 161, placed opposite to the light-emitting side, opposes the TFT-circuit-side substrate 151.

Incidentally, most transparent electrodes are oxide-based conductors and have higher resistance than metals. Therefore, as to a display panel with numerous pixels, when all the pixels are caused to simultaneously emit light, voltage might fall first with respect to transparent electrodes. In conventional cases where the TFT-circuit-side substrate 151 serves as anodes, supplying power to the TFTs in the drive circuit has no problem because of metal wiring. With a transparent conductor having greater resistivity than metals by about two orders of magnitude, irregular luminance spots due to voltage drop are not negligible.

Accordingly, in the present embodiment, the opposite substrate 152 is provided on the light-emitting side with the anode electrodes (anodes) 165 made of transparent electrodes in the organic EL element 160, and an electrode line 165a for use as power supply electrode is formed along each anode 165.

Therefore, for example, by providing electrode lines 165a constituted by metal wiring along the emission-side black matrix 133, voltage drop can be restrained, and no irregular luminance spots develop.

In the present embodiment, the features of the organic EL display 100 constituted by a light-emitting display element alone were discussed. These features are applicable to those devices in embodiments 1-8 incorporating both a non-light-emitting display element and a light-emitting display element, and achieve the same functions and effects.

What is claimed is:

1. A display, comprising in each display area:
a first display area containing a non-light-emitting display element for effecting a display by means of a light-modulating element reflecting external light; and
a second display area containing a light-emitting display element for effecting a display by means of a light-emitting element directly modulating light, the first display area and the second display area being ordered,
said display further comprising a first substrate and a second substrate positioned opposite to each other,
wherein the light-modulating element and the light-emitting element are both placed between the first substrate and the second substrate,
wherein in the second display area, the light-emitting element and a light-modulating layer of the light-modulating element are stacked in this order on the first substrate,
wherein the light-emitting element is an electroluminescence element, and
wherein the light output of the electroluminescence element is modulated in accordance with an image signal.

2. The display as set forth in claim 1, wherein the light-emitting element has an area less than or almost equal to the second display area.

3. The display as set forth in claim 1, wherein the light-emitting element is constituted by an organic electroluminescence element.

4. The display as set forth in claim 1, wherein the light-modulating element is a liquid crystal display element.

5. The display as set forth in claim 1, wherein the light-emitting element and the light-modulating element are driven independently from each other.

6. The display as set forth in claim 1, wherein the light-emitting element and the light-modulating element are driven using a shared signal line.

7. The display as set forth in claim 6, wherein:
the light-modulating layer is a liquid crystal layer of the liquid crystal display element; and
the liquid crystal layer is in horizontal alignment mode in the first display area and in vertical alignment mode in the second display area.

8. The display as set forth in claim 1, wherein the EL elements are used for image display and the reflective LCD has no display when the ambient light is dark and the EL elements are OFF and the reflective LCD are used for image display when the ambient light is bright.

9. A display, comprising in each of display areas arranged in a matrix form:
a first display area containing a non-light-emitting display element for effecting a display by means of a light-modulating element reflecting external light; and
a second display area containing a light-emitting display element for effecting a display by means of a light-emitting element directly modulating light, the first display area and the second display area being ordered,
said display further comprising a first substrate and a second substrate positioned opposite to each other,
wherein:
the light-modulating element and the light-emitting element are both placed between the first substrate and the second substrate; and
the light-modulating element and the light-emitting element share a common data signal line and a common scanning signal line, both lines being used in driving.

10. The display as set forth in claim 9, further comprising voltage current conversion means for converting a voltage to a current to drive the light-emitting element,
wherein
the voltage current conversion means is connected to a drain electrode of a light-modulating-element transistor as a switching element for driving the light-modulating element.

11. The display as set forth in claim 10, wherein:
the voltage current conversion means is constituted by a light-emitting-element transistor; and
the light-emitting-element transistor has a greater threshold voltage in driving the light-emitting element than a drive voltage of the light-modulating element.

12. The display as set forth in claim 10, wherein:
the voltage current conversion means is constituted by a light-emitting-element transistor; and
an ON operation area of a light-emitting-element transistor and an ON operation area of the light-modulating-element transistor for driving the light-modulating element are assigned by means of a threshold voltage.

13. The display as set forth in claim 10, wherein the light-modulating element is normally white.

14. The display as set forth in claim 10, wherein the light-modulating element is constituted by a liquid crystal display element.

15. The display as set forth in claim 14, further comprising: a pixel electrode having an external light reflecting property; and an opposite electrode placed opposite to the pixel electrode so as to cover all the display areas on the second substrate, wherein:

the light-modulating element is driven with respect to a potential of the opposite electrode when the light-modulating element is used to effect a display; and the light-emitting element is driven with respect to a potential of a reference electrode when the light-emitting element is used to effect a display.

16. The display as set forth in claim 9, wherein:

the light-emitting element is placed behind a pixel electrode having an external light reflecting property; and when the light-emitting element emits light to a display-surface side which is a front, only the second display area effects a display, and the first display area in which the pixel electrode exists does not transmit light.

17. The display as set forth in claim 9, wherein the light-emitting element is an electroluminescence (EL) element and the light output of the EL element is modulated in accordance with an image signal.

18. A display, comprising in each of display areas arranged in a matrix form:

a first display area containing a non-light-emitting display element for effecting a display by means of a light-modulating element reflecting external light; and a second display area containing a light-emitting display element for effecting a display by means of a light-emitting element directly modulating light, the first display area and the second display area being ordered, said display further comprising a first substrate and a second substrate positioned opposite to each other, wherein:

the light-modulating element and the light-emitting element are both placed between the first substrate and the second substrate; and the light-emitting element can be driven by applying a drive signal to a data signal line and a scanning signal line through which the light-modulating element is driven.

19. The display as set forth in claim 18, wherein the light-emitting element is an electroluminescence (EL) element and the light output of the EL element is modulated in accordance with the drive signal applied to the data signal line.

20. A method of driving a display, said display including in each of display areas arranged in a matrix form:

a first display area containing a non-light-emitting display element for effecting a display by means of a light-modulating element reflecting external light; and a second display area containing a light-emitting display element for effecting a display by means of a light-emitting element directly modulating light, the first display area and the second display area being ordered, said display further comprising a first substrate and a second substrate positioned opposite to each other, wherein:

the light-modulating element and the light-emitting element are both placed between the first substrate and the second substrate; and the light-modulating element and the light-emitting element share a common data signal line and a common scanning signal line, both lines being used in driving, said method comprising the steps of:

(a) dividing a field which is a unit time for a video signal in each of the display areas; and (b) turning on/off the light-modulating element or the light-emitting element every divide period.

21. The method as set forth in claim 20, wherein in step (a), the field is divided into n+1 intervals at a ratio of $1:2^1:2^2:\ldots:2^n$, where n is a positive integer.

22. A display comprising in each display area:

a first display area containing a non-light-emitting display element for effecting a display by means of a light-modulating element reflecting external light; and a second display area containing a light-emitting display element for effecting a display by means of a light-emitting element directly modulating light, wherein the light-emitting element comprises an electroluminescence element;

the light output of the electroluminescence element is modulated in accordance with an image signal; and the first display area and the second display area are ordered.

23. The display as set forth in claim 22, further comprising a first substrate and a second substrate positioned opposite to each other, wherein the light-modulating element and the light-emitting element are both placed between the first substrate and the second substrate.

24. The display as set forth in claim 23, further comprising:

a drive element, provided on the first substrate, for driving the light-emitting element; and a drive element, provided on the first substrate, for driving the light-modulating element, wherein the light-emitting element is provided on the second substrate.

25. The display as set forth in claim 23, further comprising a protrusion on either the first substrate or the second substrate, so as to adjust height, wherein the light-emitting element is placed on the protrusion.

26. The display as set forth in claim 25, wherein the protrusion is made of a conductive resin.

27. The display as set forth in claim 25, wherein the protrusion is made of an insulating layer.

28. The display as set forth in claim 25, further comprising a conductive material at an interface between a light-emitting element electrode of the light-emitting element and either the first substrate or the second substrate.

29. The display as set forth in claim 22, further comprising a drive element for driving the light-emitting element and the light-modulating element, the drive element being provided on either the first substrate or the second substrate.

30. The display as set forth in claim 22, wherein the second display area does not contain a light-modulating layer of the light-modulating element.

31. The display as set forth in claim 22, wherein the light-modulating element comprises a light-modulating layer, and the light-emitting element comprises a light-emitting layer, one of the layers being provided within or adjacent to the other.

32. The display as set forth in claim 22, wherein the light-emitting element comprises a light-emitting layer, and the light-modulating element comprises a light-modulating layer, the layers being adjacent to each other separated by a protective material.

33. The display as set forth in claim 32, wherein the protective layer blocks light.

34. The display as set forth in claim 22, wherein the light-emitting element and the light-modulating element are driven independently from each other.

35. The display as set forth in claim 22, wherein the light-emitting element and the light-modulating element are driven using a shared signal line.

36. The display as set forth in claim 22, further comprising:
   external light detecting means for detecting external light; and
   display control means for selecting either one or both of the light-emitting element and the light-modulating element for display based on detection of external light by the external light detecting means.

37. The display as set forth in claim 22, wherein:
   the light-modulating element is a reflective-type, liquid crystal display element; and
   the light-emitting element is an organic electroluminescence element.

38. The display as set forth in claim 22,
   the light-modulating element comprises a display-surface-side electrode, and the light-emitting element comprises a display-surface-side electrode, both electrodes being fabricated of the same material in the same layer.

39. The display as set forth in claim 22, wherein when the light-modulating element is in a bright screen state, the light-emitting element is switchable to a non-light-emitting state.

40. The display as set forth in claim 22, wherein:
   the light-modulating element and the light-emitting element are adjacent to each other; and
   when one of the light-modulating element and the light-emitting element is in a bright screen state, the other of the light-modulating element and the light-emitting element is in a dark screen state.

41. The display as set forth in claim 22, wherein the EL elements are used for image display and the reflective LCD has no display when the ambient light is dark and the EL elements are OFF and the reflective LCD is used for image display when the ambient light is bright.

42. A display comprising:
   first and second spaced apart substrates; and
   non-light-emitting display elements and light-emitting display elements, the non-light-emitting display elements comprising light modulating elements that modulate external light and the light-emitting display elements comprising electroluminescent (EL) elements that self-generate light,
   wherein the non-light-emitting display elements and light-emitting display elements are arranged in display areas each of which comprises one of the non-light-emitting display elements and a corresponding one of the light-emitting display elements, and
   wherein the light modulating elements and the EL elements are disposed in the space between the first and second substrates.

43. The display as set forth in claim 42, further comprising:
   protective layers surrounding the light-emitting display elements.

44. The display as set forth in claim 43, wherein the protective layers are formed from light-blocking material.

45. The display as set forth in claim 42, further comprising:
   optically transparent insulating layers through which self-generated light from the EL elements passes.

46. The display as set forth in claim 45, wherein each optically transparent insulating layer comprises first and second components of different refractive indices.

47. The display as set forth in claim 46, wherein an interface between the first and second components is saw-tooth shaped.

48. The display as set forth in claim 42, further comprising:
   a light sensor that senses ambient light; and
   a control circuit for controlling the driving of the non-light-emitting display elements and the light-emitting display elements based on an ambient light level sensed by the light sensor.

49. The display as set forth in claim 42, wherein the non-light-emitting display element and the corresponding one of the light-emitting display elements for a given display area are arranged adjacent to each other.

50. A display comprising:
   a gate line and a signal line;
   a non-light-emitting display element and a light-emitting display element, the non-light-emitting display element comprising a first switch and a light modulating element that modulates external light and the light-emitting display element comprising a second switch and an electroluminescent (EL) element that self-generates light,
   wherein the gate line is connected to a gate of the first switch, the signal line is connected to a source/drain of the first switch, a drain/source of the first switch is connected to the light modulating element and to a gate of the second switch, and a source/drain of the second switch is connected to the EL element.

51. The display as set forth in claim 50, wherein a drain/source of the second switch is connected to a voltage terminal.

52. A display comprising:
   non-light-emitting display elements, the non-light-emitting display elements comprising light modulating elements that modulate external light;
   light-emitting display elements, the light-emitting display elements comprising electroluminescent (EL) elements that self-generate light;
   a light sensor that senses ambient light; and
   a control circuit for controlling the driving of the non-light-emitting display element and the light-emitting display element based on an ambient light level sensed by the light sensor,
   wherein, under a bright ambient light condition, the non-light-emitting display elements, but not the light-emitting display elements, display images, and
   wherein, under a low ambient light condition, the light-emitting display elements, but not the non-light-emitting display elements, display images.

53. The display as set forth in claim 52, wherein the non-light-emitting display elements effect a black display under the low ambient light condition.

* * * * *